United States Patent
Yamamoto

(10) Patent No.: US 9,830,997 B2
(45) Date of Patent: Nov. 28, 2017

(54) SHIFT REGISTER, SEMICONDUCTOR DEVICE, AND ELECTRONIC DEVICE

(71) Applicant: Semiconductor Energy Laboratory Co., Ltd., Atsugi-shi, Kanagawa-ken (JP)

(72) Inventor: Roh Yamamoto, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/976,204

(22) Filed: Dec. 21, 2015

(65) Prior Publication Data
US 2016/0189797 A1    Jun. 30, 2016

(30) Foreign Application Priority Data
Dec. 25, 2014    (JP) .................................. 2014-262854

(51) Int. Cl.
G11C 19/00    (2006.01)
G11C 19/28    (2006.01)

(52) U.S. Cl.
CPC ..... G11C 19/28 (2013.01); *G09G 2310/0286* (2013.01)

(58) Field of Classification Search
None
See application file for complete search history.

(56) References Cited

U.S. PATENT DOCUMENTS

| | | | |
|---|---|---|---|
| 5,128,974 A | 7/1992 | Maekawa et al. | |
| 6,879,313 B1* | 4/2005 | Kubota | G09G 3/3688 345/100 |
| 2001/0011987 A1* | 8/2001 | Kubota | G09G 3/3677 345/98 |
| 2003/0174115 A1* | 9/2003 | Washio | G09G 3/3688 345/98 |
| 2004/0150610 A1* | 8/2004 | Zebedee | G11C 19/28 345/100 |
| 2004/0234020 A1* | 11/2004 | Yu | G11C 19/28 377/64 |
| 2007/0127620 A1* | 6/2007 | Moon | G11C 19/28 377/64 |
| 2007/0171179 A1* | 7/2007 | Morosawa | G09G 3/3674 345/100 |

(Continued)

FOREIGN PATENT DOCUMENTS

JP    03-147598 A    6/1991

*Primary Examiner* — Tuan T Lam
(74) *Attorney, Agent, or Firm* — Fish & Richardson P.C.

(57) ABSTRACT

A semiconductor device and the like with low power consumption can be provided. A shift register in which a plurality of register circuits are connected to each other in series. The plurality of register circuits each include a flip-flop circuit. An operation of the flip-flop circuit of the register circuit in one stage is determined by a clock signal, an output signal of the register circuit in the previous stage, an output signal of the register circuit in the one stage, and an output signal of the register circuit in the next stage. Data stored in the flip-flop circuits in the register circuits in stages that are two or more stages before the one stage and in the register circuits in stages that are two or more stages after the one stage are not rewritten.

15 Claims, 25 Drawing Sheets

(56) References Cited

U.S. PATENT DOCUMENTS

| | | | | |
|---|---|---|---|---|
| 2007/0177712 A1* | 8/2007 | Yu | ............................ | G11C 19/28 377/64 |
| 2008/0101529 A1* | 5/2008 | Tobita | .................... | G09G 3/3677 377/64 |
| 2008/0219401 A1* | 9/2008 | Tobita | .................... | G09G 3/3677 377/79 |
| 2010/0090742 A1* | 4/2010 | Zebedee | .............. | G09G 3/3674 327/296 |
| 2010/0134476 A1* | 6/2010 | Zebedee | .............. | G09G 3/3677 345/214 |
| 2011/0033022 A1* | 2/2011 | Zebedee | .................. | G09G 3/20 377/81 |
| 2013/0027378 A1* | 1/2013 | Lee | ........................ | G09G 3/3677 345/212 |
| 2014/0055436 A1* | 2/2014 | Han | ...................... | G09G 3/3696 345/211 |
| 2014/0140468 A1* | 5/2014 | Cheng | .................... | G11C 19/28 377/68 |
| 2016/0019828 A1* | 1/2016 | Lin | ........................... | G09G 3/20 345/214 |
| 2016/0210928 A1* | 7/2016 | Cho | ...................... | G11C 19/184 |

* cited by examiner

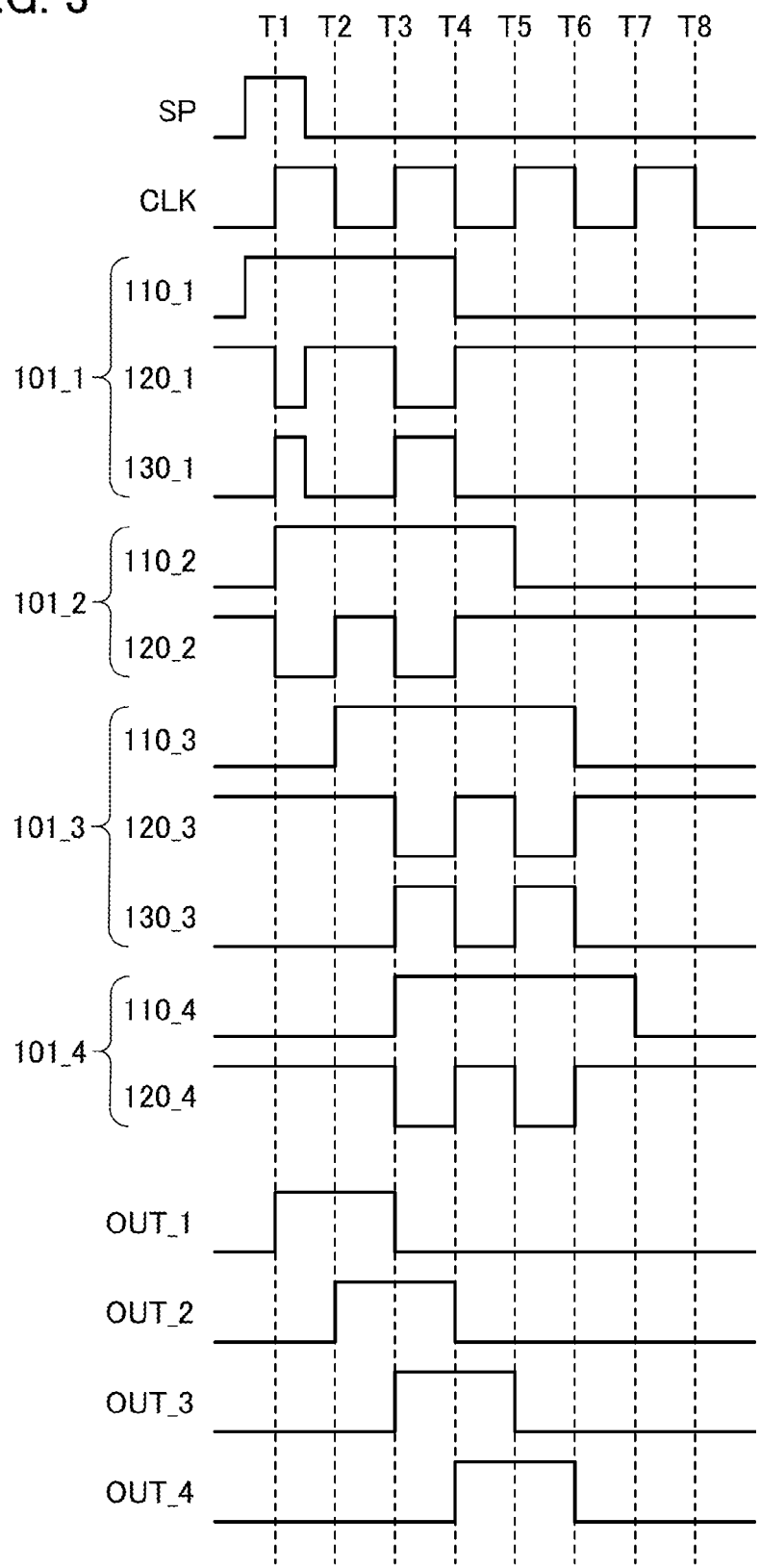

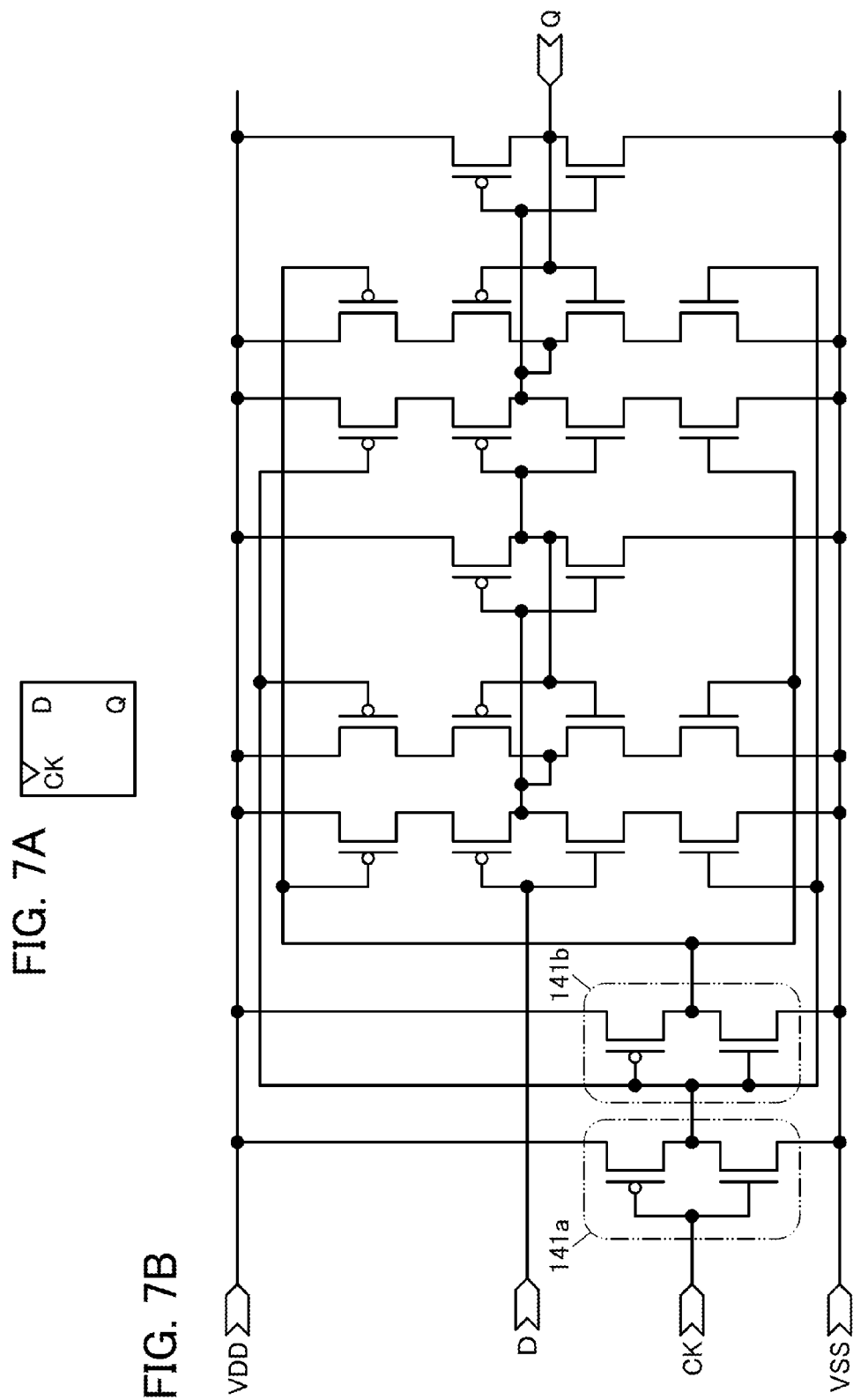

FIG. 16A1
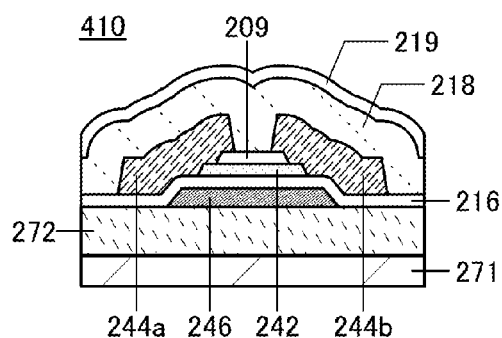
FIG. 16A2
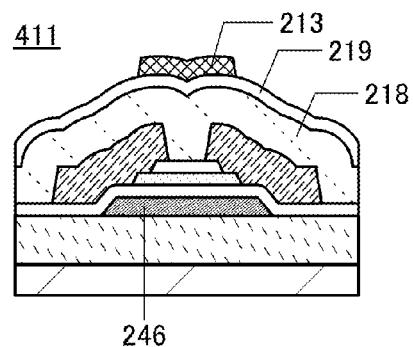
FIG. 16B1
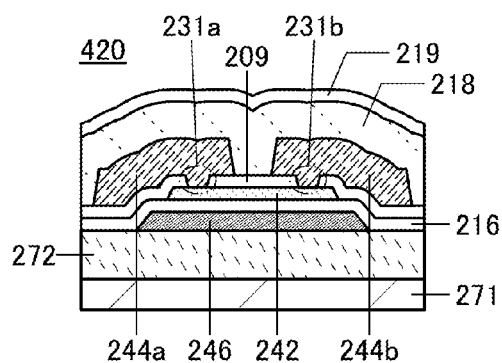
FIG. 16B2
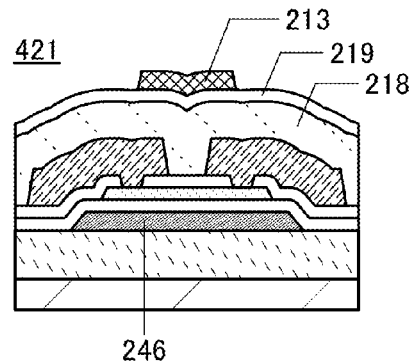
FIG. 16C1
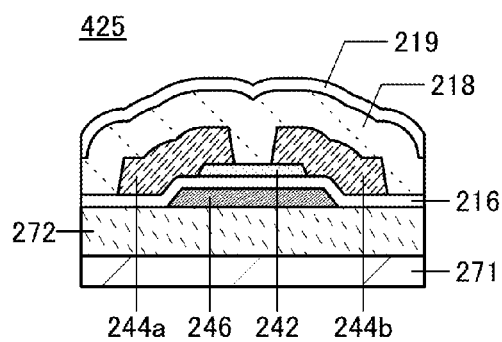
FIG. 16C2
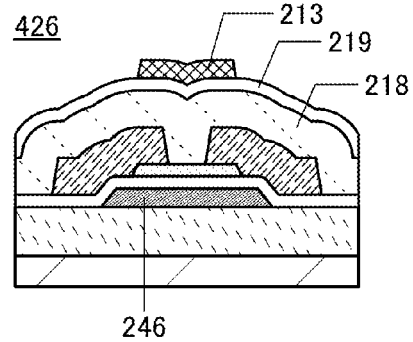

FIG. 17A1
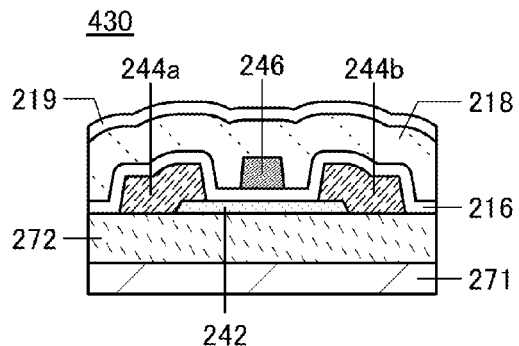
FIG. 17A2
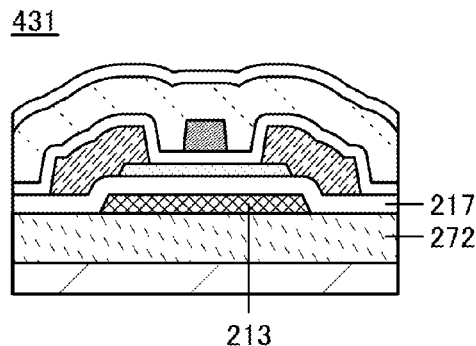
FIG. 17A3
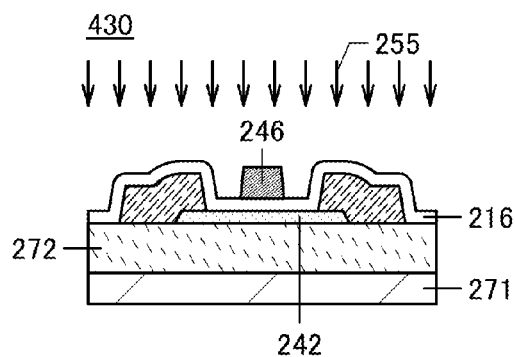
FIG. 17B1
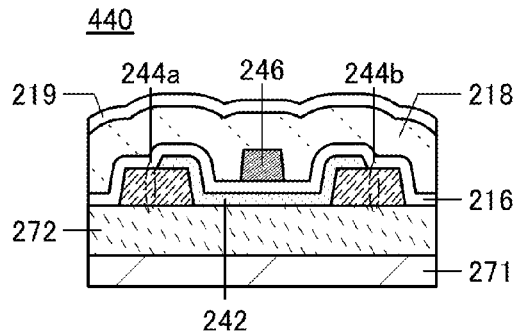
FIG. 17B2
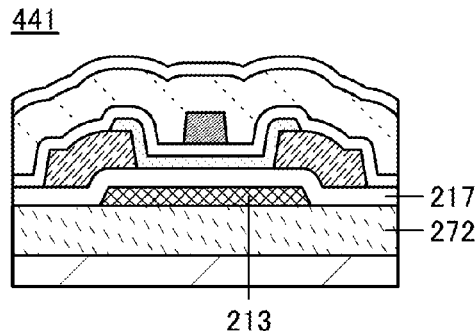

422

422

422

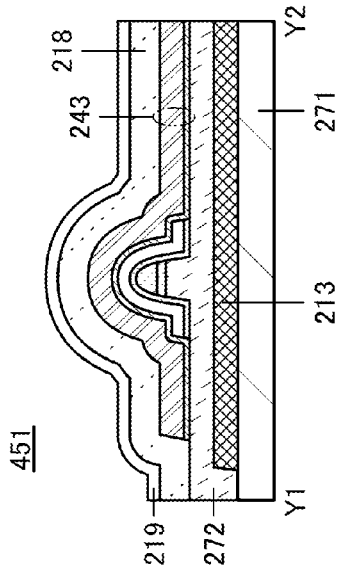
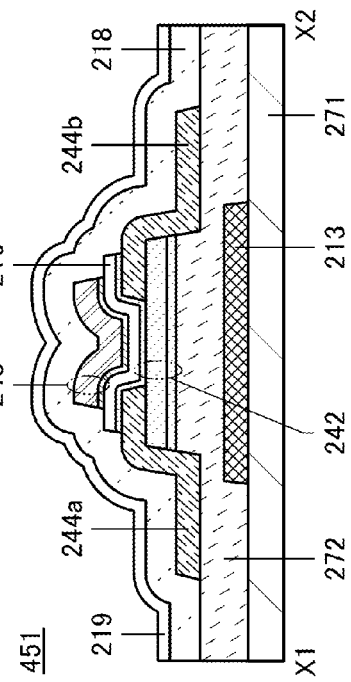
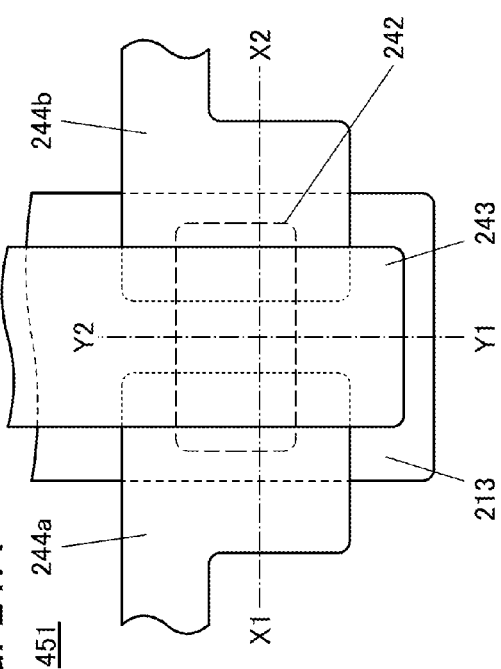

SHIFT REGISTER, SEMICONDUCTOR DEVICE, AND ELECTRONIC DEVICE

BACKGROUND OF THE INVENTION

1. Field of the Invention

One embodiment of the present invention relates to a semiconductor device. One embodiment of the present invention also relates to a method for manufacturing the semiconductor device.

Note that one embodiment of the present invention is not limited to the above technical field. For example, one embodiment of the present invention relates to an object, a method, or a manufacturing method. One embodiment of the present invention relates to a process, a machine, manufacture, or a composition of matter. One embodiment of the present invention relates to a micromachine, a display element, a display device, or an electronic device.

Note that in this specification and the like, a semiconductor device typically means a device that can function by utilizing semiconductor characteristics. Thus, a semiconductor element such as a transistor or a diode and a semiconductor circuit are semiconductor devices. A display device, a light-emitting device, a lighting device, an electro-optical device, a memory device, an electronic device, and the like may include a semiconductor element or a semiconductor circuit. Thus, a display device, a light-emitting device, a lighting device, an electro-optical device, an imaging device, a memory device, an electronic device, and the like include a semiconductor device in some cases.

2. Description of the Related Art

A shift register which includes a plurality of register circuits and in which data stored in the register circuits is sequentially transferred in synchronization with a clock signal is used for various devices. For example, a shift register is used for a display device including a plurality of pixels provided in a matrix, an imaging device including a plurality of imaging elements, or a memory device including a plurality of memory elements.

In recent years, display devices and imaging devices have been required to increase their resolution, and memory devices have been required to increase their capacity. Accordingly, the number of register circuits is increased in a shift register, and the frequency of a clock signal is increased. Thus, the power consumption of the shift register is increased; as a result, the power consumption of a semiconductor device is increased.

Patent Document 1 describes a technical idea that the power consumption of a semiconductor device is reduced by stop of supply of a clock signal to a register circuit that does not need to be operated.

REFERENCE

Patent Document

[Patent Document 1] Japanese Published Patent Application No. H3-147598

SUMMARY OF THE INVENTION

A shift register disclosed in Patent Document 1 is provided with a wiring that supplies a clock signal to each register circuit (hereinafter also referred to as "clock signal line") and a wiring that supplies a complementary (inverted) clock signal (hereinafter also referred to as "complementary clock signal line").

An increase in the number of wirings easily causes signal delay or an increase in power consumption because of an increase in parasitic capacitance, an increase in occupied area, or the like. In other words, the increase in the number of wirings prevents an increase in operation speed, a reduction in power consumption and size, or the like of a semiconductor device. In particular, a clock signal line and a complementary clock signal line, which are long leading lines, easily cause an increase in occupied area and the like.

As another example of a shift register, a shift register 900 in FIG. 9 can be given. In the shift register 900, a complementary clock signal line is not provided and a clock signal supplied from a clock signal line 902 is converted into a complementary clock signal by an inverter circuit 930. Note that in an inverter circuit, transient current is easily caused when an output signal is changed. Thus, an increase in the number of the inverter circuits leads to an increase in power consumption.

Another object of one embodiment of the present invention is to provide a semiconductor device with reduced power consumption. Another object of one embodiment of the present invention is to provide a semiconductor device with improved operation speed. Another object of one embodiment of the present invention is to provide a semiconductor device that can be easily downsized. Another object of one embodiment of the present invention is to provide a semiconductor device with high design flexibility. Another object of one embodiment of the present invention is to provide a novel semiconductor device.

One embodiment of the present invention is a shift register in which a plurality of register circuits are connected to each other in series. An output signal of the register circuit in one stage (an i-th stage) is determined by a clock signal, an output signal of the register circuit in the previous stage (an (i−1)-th stage), the output signal of the register circuit in the one stage (the i-th stage), and an output signal of the register circuit in the next stage (an (i+1)-th stage).

Another embodiment of the present invention is a shift register in which a plurality of register circuits are connected to each other in series. The plurality of register circuits each include a flip-flop circuit. An operation of the flip-flop circuit in the register circuit in one stage (an i-th stage) is determined by a clock signal, an output signal of the register circuit in the previous stage (an (i−1)-th stage), an output signal of the register circuit in the one stage (the i-th stage), and an output signal of the register circuit in the next stage (an (i+1)-th stage). Data stored in the flip-flop circuits are not rewritten in the register circuits in stages that are two or more stages before the one stage (in stages before the (i−1)-th stage; i.e., an (i−2)-th stage, an (i−3)-th stage, and the like) and in the register circuits in stages that are two or more stages after the one stage (in stages after the (i+1)-th stage; i.e., an (i+2)-th stage, an (i+3)-th stage, and the like).

Another embodiment of the present invention is a shift register in which a plurality of register circuits are connected to each other in series. An output signal of the register circuit in one stage (an i-th stage) is determined by a clock signal, an output signal of the register circuit in the previous stage (the (i−1)-th stage), and an output signal of the register circuit in the one stage (the i-th stage).

Another embodiment of the present invention is a shift register in which a plurality of register circuits are connected to each other in series. The plurality of register circuits each include a flip-flop circuit. An operation of the flip-flop circuit in the register circuit in one stage (an i-th stage) is determined by a clock signal, an output signal of the register circuit in the previous stage (an (i−1)-th stage), and an output signal of the register circuit in the one stage (the i-th stage). Data stored in the flip-flop circuits are not rewritten in the register circuits in stages that are two or more stages before the one stage (in stages before the (i−1)-th stage; i.e., an (i−2)-th stage, an (i−3)-th stage, and the like) and in the register circuits in stages that are two or more stages after the one stage (in stages after the (i+1)-th stage; i.e., an (i+2)-th stage, an (i+3)-th stage, and the like).

Another embodiment of the present invention is a semiconductor device including any of the above-described shift registers, and a display element, an imaging element, or a memory element.

Another embodiment of the present invention is an electronic device including any of the above-described shift registers or the above-described semiconductor device and including a microphone, a speaker, or a sensor.

With an embodiment of the present invention, a semiconductor device with reduced power consumption, a semiconductor device with improved operation speed, a semiconductor device that can be easily downsized, a semiconductor device with high design flexibility, or a novel semiconductor device can be provided.

BRIEF DESCRIPTION OF THE DRAWINGS

FIG. 3 is a timing chart showing one embodiment of the present invention.

FIGS. 7A and 7B illustrate a configuration example of a flip-flop circuit.

FIGS. 16A1, 16A2, 16B1, 16B2, 16C1, and 16C2 illustrate examples of a semiconductor device.

FIGS. 17A1, 17A2, 17A3, 17B1, and 17B2 illustrate examples of a semiconductor device.

FIGS. 21A to 21C each illustrate an example of a semiconductor device.

DETAILED DESCRIPTION OF THE INVENTION

Figure 1:
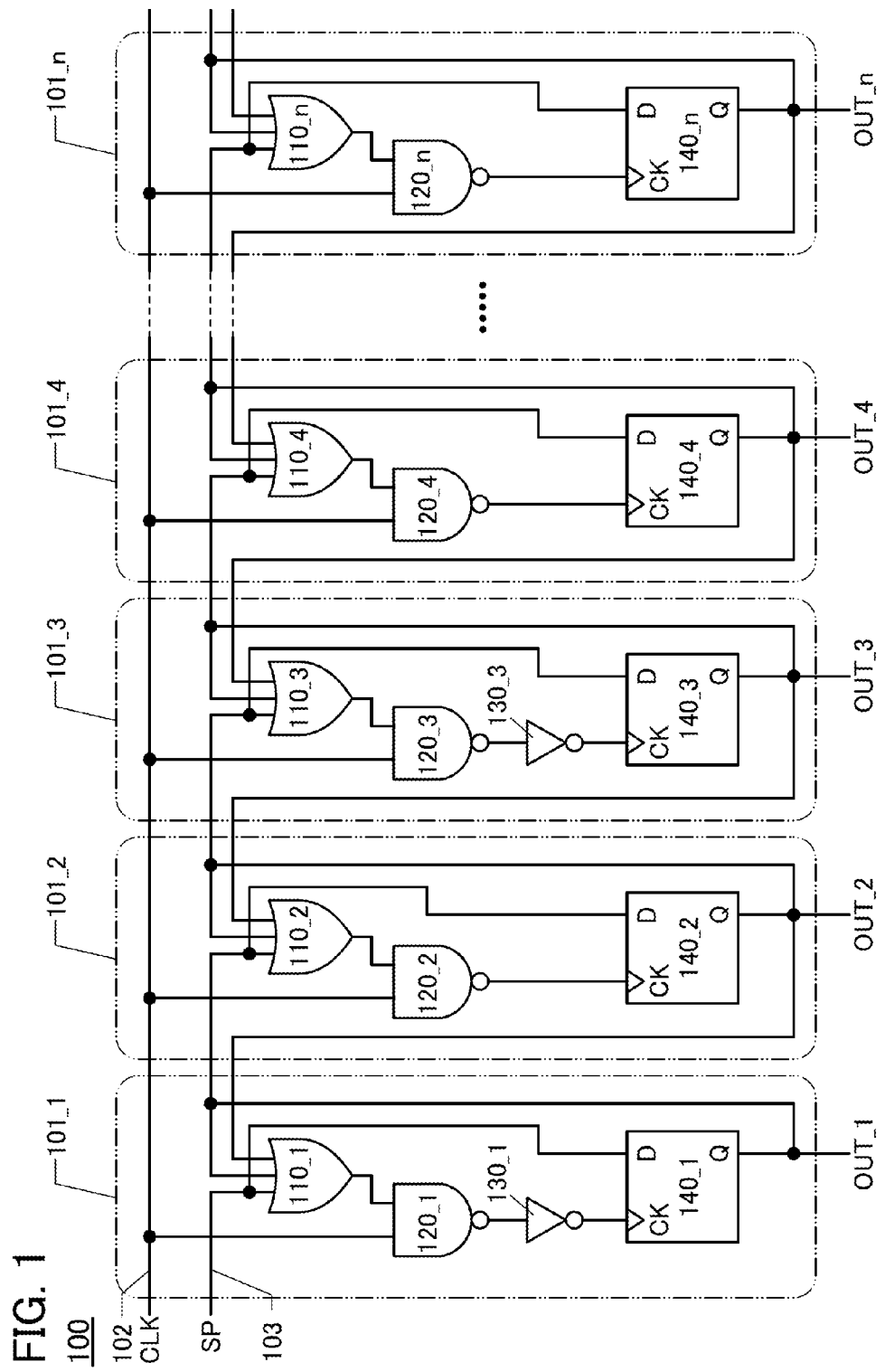
FIG. 1 is a block diagram illustrating a configuration example of a shift register.

Embodiments are described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

The position, size, range, and the like of each component illustrated in the drawings and the like are not accurately represented in some cases to facilitate understanding of the invention. Thus, the disclosed invention is not necessarily limited to the position, the size, the range, or the like disclosed in the drawings and the like. For example, in the actual manufacturing process, a resist mask or the like might be unintentionally reduced in size by treatment such as etching, which is not illustrated in some cases for easy understanding. Some components are not illustrated in drawings and the like in some cases for easy understanding.

In addition, in this specification and the like, the term such as an "electrode" or a "wiring" does not limit a function of a component. For example, an "electrode" is used as part of a "wiring" in some cases, and vice versa. Furthermore, the term "electrode" or "wiring" can also mean a combination of a plurality of "electrodes" and "wirings" formed in an integrated manner.

Note that the term "over" or "under" in this specification and the like does not necessarily mean that a component is placed "directly on" or "directly below" and "directly in contact with" another component. For example, the expression "electrode B over insulating layer A" does not necessarily mean that the electrode B is on and in direct contact with the insulating layer A and can mean the case where another component is provided between the insulating layer A and the electrode B.

Functions of a source and a drain might be switched depending on operation conditions, for example, when a transistor having opposite polarity is employed or the direction of current flow is changed in circuit operation. Thus, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Accordingly, even when the expression "to be electrically connected" is used in this specification, there is a case in which no physical connection is made and a wiring is just extended in an actual circuit.

In the specification and the like, the term "parallel" indicates that, for example, the angle formed between two straight lines is greater than or equal to −10° and less than or equal to 10°, and accordingly also includes the case where the angle is greater than or equal to −5° and less than or equal to 5°. A term "perpendicular" or "orthogonal" indicates that the angle formed between two straight lines is greater than or equal to 80° and less than or equal to 100°, and accordingly also includes the case where the angle is greater than or equal to 85° and less than or equal to 95°.

In the specification and the like, the terms "identical", "the same", "equal", "uniform", and the like used in describing calculation values and actual measurement values allow for a margin of error of ±20% unless otherwise specified.

In this specification and the like, when etching treatment is performed after a resist mask is formed, the resist mask is removed after completion of the etching treatment, unless otherwise specified.

A voltage usually refers to a potential difference between a given potential and a reference potential (e.g., a ground potential or a source potential). A voltage can be referred to as a potential and vice versa.

Note that an impurity in a semiconductor refers to, for example, elements other than the main components of the semiconductor. For example, an element with a concentration lower than 0.1 atomic % can be regarded as an impurity. When an impurity is contained, the density of states (DOS) in a semiconductor may be increased, the carrier mobility may be decreased, or the crystallinity may be decreased. In the case where the semiconductor is an oxide semiconductor, examples of an impurity that changes the characteristics of the semiconductor include Group 1 elements, Group 2 elements, Group 13 elements, Group 14 elements, Group 15 elements, and transition metals other than the main components of the oxide semiconductor; specific examples are hydrogen (included in water), lithium, sodium, silicon, boron, phosphorus, carbon, and nitrogen. In the case of an oxide semiconductor, oxygen vacancies may be formed by entry of impurities such as hydrogen. Furthermore, in the case where the semiconductor is silicon, examples of an impurity that changes characteristics of the semiconductor include oxygen, Group 1 elements except hydrogen, Group 2 elements, Group 13 elements, and Group 15 elements.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components. In addition, a term with an ordinal number in this specification and the like might be provided with a different ordinal number in a claim. Moreover, a term with an ordinal number in this specification and the like might not be provided with any ordinal number in a claim.

The channel length refers to, for example, a distance between a source (a source region or a source electrode) and a drain (a drain region or a drain electrode) in a region where a semiconductor (or a portion where a current flows in a semiconductor when a transistor is on) and a gate electrode overlap with each other or a region where a channel is formed in a top view of the transistor. In one transistor, channel lengths in all regions are not necessarily the same. In other words, the channel length of one transistor is not limited to one value in some cases. Thus, in this specification, the channel length is any one of values, the maximum value, the minimum value, or the average value in a region where a channel is formed.

Note that in this specification and the like, an "on state" of a transistor refers to a state in which a source and a drain of the transistor are electrically short-circuited (also referred to as being "brought into conduction"). Furthermore, an "off state" of the transistor refers to a state in which the source and the drain of the transistor are electrically disconnected (also referred to as being "brought out of conduction").

In this specification and the like, in some cases, "on-state current" means a current that flows between a source and a drain when a transistor is on, and "off-state current" means a current that flows between a source and a drain when a transistor is off.

In some cases, the off-state current of a transistor depends on a potential difference between a gate and a source (hereinafter also referred to as "gate voltage", "Vg", or "Vgs") when the potential of the source is used as a reference potential. Thus, "the off-state current of a transistor is lower than or equal to I" means "there is Vgs with which the off-state current of the transistor becomes lower than or equal to I" in some cases. The off-state current of a transistor may mean a current at a certain Vgs or at Vgs in a certain voltage range.

As an example, the assumption is made of an n-channel transistor where the threshold voltage Vth is 0.5 V and the current flowing between a source and a drain (hereinafter also referred to as "drain current", "Id", or "Ids") is $1\times10^{-9}$ A at Vgs of 0.5 V, $1\times10^{-13}$ A at Vgs of 0.1 V, $1\times10^{-19}$ A at Vgs of −0.5 V, and $1\times10^{-22}$ A at Vgs of −0.8 V. The Ids of the transistor is $1\times10^{-19}$ A or lower at Vgs of −0.5 V or at Vgs in the range of −0.5 V to −0.8 V; thus, it can be said that the off-state current of the transistor is $1\times10^{-19}$ A or lower. Since there is Vgs at which the drain current of the transistor is $1\times10^{-22}$ A or lower, it may be said that the off-state current of the transistor is $1\times10^{-22}$ A or lower.

The off-state current of a transistor depends on temperature in some cases. Unless otherwise specified, the off-state current in this specification and the like may be an off-state current at room temperature, 60° C., 85° C., 95° C., or 125° C. Alternatively, the off-state current may be an off-state current at a temperature at which the reliability of a semiconductor device or the like including the transistor is ensured or a temperature at which the semiconductor device or the like including the transistor is used (e.g., temperature in the range of 5° C. to 35° C.). The description "an off-state current of a transistor is lower than or equal to I" may mean that there is Vgs at which the off-state current of a transistor is lower than or equal to I at room temperature, 60° C., 85° C., 95° C., 125° C., a temperature at which the reliability of a semiconductor device or the like including the transistor is ensured, or a temperature at which the semiconductor device or the like including the transistor is used (e.g., temperature in the range of 5° C. to 35° C.).

In some cases, the off-state current of a transistor depends on a potential difference between a drain and a source (hereinafter also referred to as "drain voltage", "Vd", or "Vds") when the potential of the source is used as a reference potential. Unless otherwise specified, the off-state current in this specification and the like may be an off-state current at Vds of 0.1 V, 0.8 V, 1 V, 1.2 V, 1.8 V, 2.5 V, 3 V, 3.3 V, 10 V, 12 V, 16 V, or 20 V. Alternatively, the off-state current may be an off-state current at Vds at which the reliability of a semiconductor device or the like including the transistor is ensured. Further alternatively, the off-state current may be an off-state current at Vds used in the semiconductor device or the like including the transistor. The description "an off-state current of a transistor is lower than or equal to I" may mean that there is Vgs at which the off-state current of a transistor is lower than or equal to I at Vds of 0.1 V, 0.8 V, 1 V, 1.2 V, 1.8 V, 2.5 V, 3 V, 3.3 V, 10 V, 12 V, 16 V, or 20 V, at Vds at which the reliability of a semiconductor device or the like including the transistor is ensured, or at Vds at which in the semiconductor device or the like including the transistor is used.

In this specification and the like, the high power supply potential VDD (hereinafter also simply referred to as VDD or H potential) is a power supply potential higher than the low power supply potential VSS. The low power supply potential VSS (hereinafter also simply referred to as VSS or L potential) is a power supply potential lower than the high power supply potential VDD. In addition, a ground potential can be used as VDD or VSS. For example, in the case where a ground potential is used as VDD, VSS is lower than the ground potential, and in the case where a ground potential is used as VSS, VDD is higher than the ground potential.

The channel width refers to, for example, the length of a portion where a source and a drain face each other in a region where a semiconductor and a gate electrode overlap with each other, a portion where a current flows in a semiconductor when a transistor is on, or a region where a channel is formed. In one transistor, channel widths in all regions do not necessarily have the same value. In other words, the channel width of one transistor is not limited to one value in some cases. Thus, in this specification and the like, a channel width is any one of values, the maximum value, the minimum value, or the average value in a region where a channel is formed.

Note that depending on transistor structures, a channel width in a region where a channel is actually formed (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that the shape of a semiconductor is known. Thus, in the case where the shape of a semiconductor is not known accurately, it is difficult to measure an effective channel width accurately.

Thus, in this specification and the like, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification and the like, in the case where the term "channel width" is simply used, it may denote a surrounded channel width and an apparent channel width. Alternatively, in this specification and the like, in the case where the term "channel width" is simply used, it may denote an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where field-effect mobility, a current value per channel width, and the like of a transistor are obtained by calculation, a surrounded channel width may be used for the calculation. In that case, a value different from one in the case where an effective channel width is used for the calculation is obtained in some cases.

(Embodiment 1)

Circuit configuration examples and operation examples of a shift register 100 of one embodiment of the present invention are described with reference to FIG. 1 to FIG. 7B.

<<Circuit Configuration Example of the Shift Register 100>>

FIG. 1 is a block diagram illustrating a configuration example of the shift register 100 including n stages of output portions (n is a natural number of 2 or more). In the shift register 100, each stage includes a register circuit 101. In this specification and the like, the register circuit 101 in a first stage is referred to as a register circuit 101_1, the register circuit 101 in an n-th stage is referred to as a register circuit 101_n, and the register circuit 101 in an i-th stage (i is a natural number of greater than or equal to 2 and smaller than n) is referred to as a register circuit 101_1. The register circuits 101_1 to 101_n are sequentially connected to each other in series.

The register circuit 101 includes at least an OR circuit 110, a NAND circuit 120, and an FF circuit 140. In this specification and the like, the OR circuit 110 in the register circuit 101_1 in the i-th stage is referred to as an OR circuit 110_1, the NAND circuit 120 in the register circuit 101_1 is referred to as a NAND circuit 120_i, and the FF circuit 140 in the register circuit 101_i is referred to as an FF circuit 140_i. FIG. 1 illustrates an example in which inverter circuits 130 are provided in the register circuits 101 in odd-numbered stages. The inverter circuits 130 may be provided in, instead of the register circuits 101 in odd-numbered stages, the register circuits 101 in even-numbered stages.

Figure 4A:
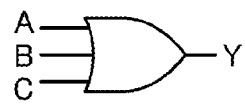
FIGS. 4A to 4E illustrate configuration examples of a logic circuit.
Figure 4B:
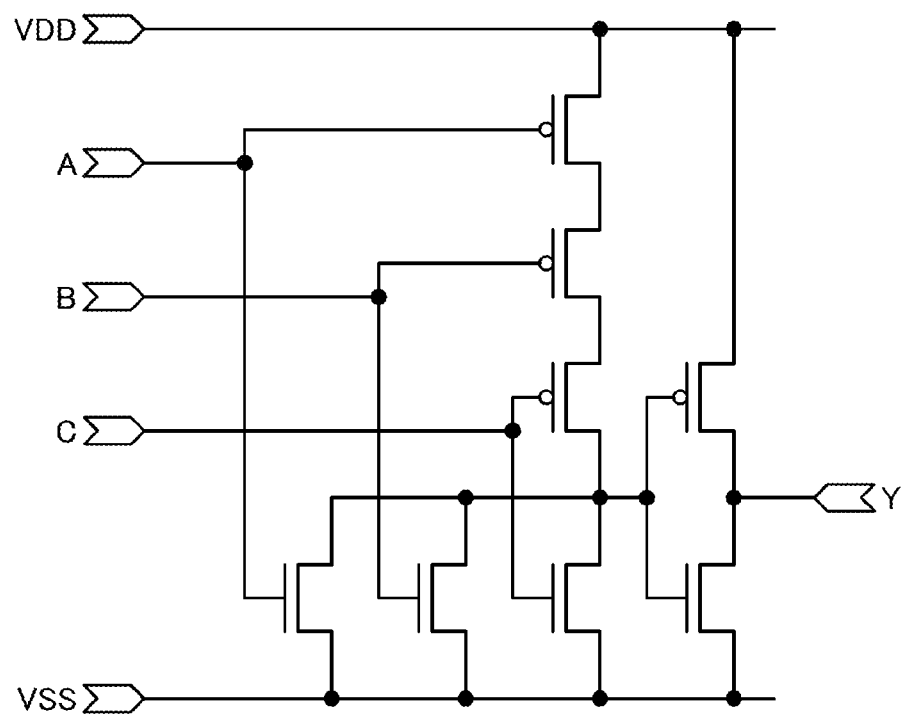
Figure 4C:
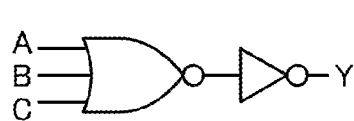
Figure 4D:
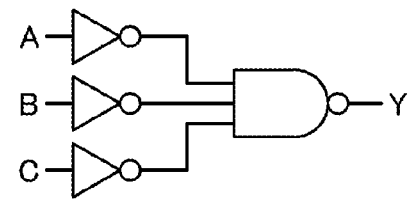
Figure 4E:
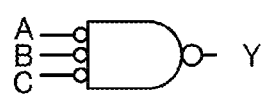

The OR circuit 110 has three input portions and one output portion. FIG. 4A illustrates an example of a circuit symbol of the OR circuit 110. FIG. 4B illustrates an example of a circuit diagram of the OR circuit 110. The OR circuit 110 has a function of outputting an H potential from an output portion Y when an H potential is input to at least one of a first input portion A, a second input portion B, and a third input portion C. The OR circuit 110 has a function of outputting an L potential from the output portion Y when an L potential is input to the first input portion A, the second input portion B, and the third input portion C. Note that the OR circuit 110 can also be shown by a circuit symbol of FIG. 4C, FIG. 4D, or FIG. 4E.

Figure 5A:
FIGS. 5A to 5D illustrate configuration examples of a logic circuit.
Figure 5B:
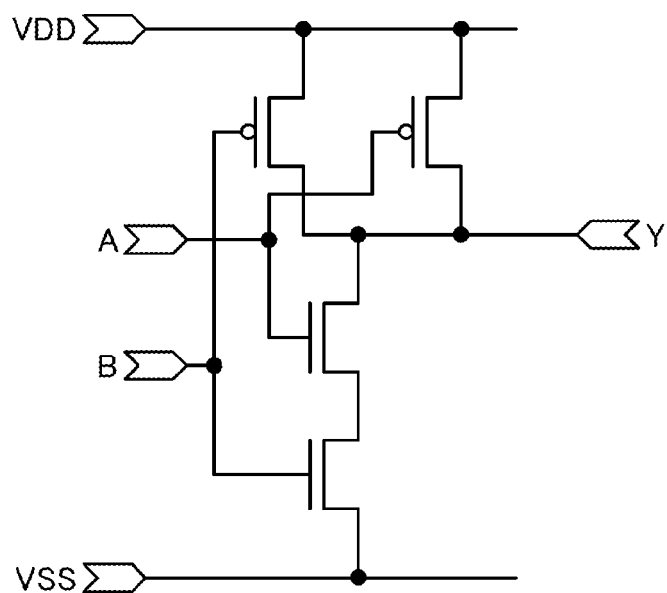
Figure 5C:
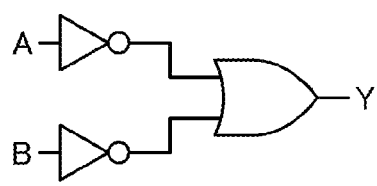
Figure 5D:

The NAND circuit 120 has two input portions and one output portion. FIG. 5A illustrates an example of a circuit symbol of the NAND circuit 120. FIG. 5B illustrates an example of a circuit diagram of the NAND circuit 120. The NAND circuit 120 has a function of outputting an L potential from an output portion Y when an H potential is input to a first input portion A and a second input portion B. The NAND circuit 120 has a function of outputting an H potential from the output portion Y when an L potential is input to the first input portion A and/or the second input portion B. Note that the NAND circuit 120 can also be shown by a circuit symbol of FIG. 5C or FIG. 5D.

Figure 6A:
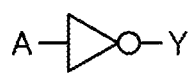
FIGS. 6A to 6C illustrate configuration examples of a logic circuit.
Figure 6B:
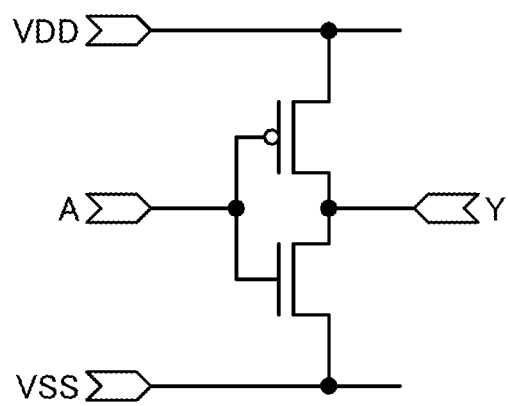

The inverter circuit 130 has one input portion and one output portion. FIG. 6A illustrates an example of a circuit symbol of the inverter circuit 130. FIG. 6B illustrates an example of a circuit diagram of the inverter circuit 130. The inverter circuit 130 has a function of outputting an L potential from an output portion Y when an H potential is input to an input portion A. The inverter circuit 130 has a function of outputting an H potential from the output portion Y when an L potential is input to the input portion A.

Figure 6C:
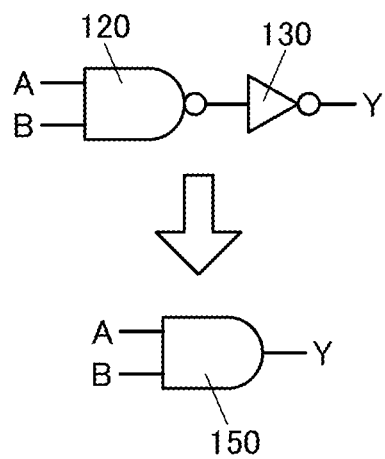

Note that an AND circuit 150 can be formed by connecting an input portion of the inverter circuit 130 to an output portion of the NAND circuit 120. FIG. 6C illustrates an example of a circuit symbol of the AND circuit 150. The AND circuit 150 has a function of outputting an H potential from an output portion Y when an H potential is input to a first input portion A and a second input portion B. The AND circuit 150 has a function of outputting an L potential from an output portion Y when an L potential is input to the first input portion A and/or the second input portion B.

The FF circuit 140 in this embodiment is a delay flip-flop (DFF) circuit. The FF circuit 140 includes a clock signal input portion CK, an input portion D, and an output portion Q. FIG. 7A illustrates an example of a circuit symbol of the FF circuit 140. FIG. 7B illustrates an example of a circuit diagram of the FF circuit 140. In the FF circuit 140, data (potential) of the input portion D is written while an H potential is input to the clock signal input portion CK. When a signal that is input to the clock signal input portion CK is changed from the H potential to an L potential, the FF circuit 140 can store the data until the H potential is input to the clock signal input portion CK next time. A signal (H potential or L potential) based on the data stored in the FF circuit 140 is continually output from the output portion Q. The FF circuit 140 includes an inverter circuit 141a and an inverter circuit 141b. An input portion of the inverter circuit 141a is electrically connected to the clock signal input portion CK. An output portion of the inverter circuit 141a is electrically connected to an input portion of the inverter circuit 141b.

Note that the register circuit 101 can be configured with an RS flip-flop circuit, a JK flip-flop circuit, a T flip-flop circuit, a latch circuit, or the like.

Circuits such as the OR circuit 110, the NAND circuit 120, the inverter circuit 130, the FF circuit 140, and the like can be configured with a combination of n-channel and/or p-channel transistors as appropriate.

The block diagram of FIG. 1 is further described. In the register circuit 101_1 in the first stage, a first input portion of a NAND circuit 120_1 is electrically connected to a wiring 102. A second input portion of the NAND circuit 120_1 is electrically connected to an output portion of an OR circuit 110_1. An output portion of the NAND circuit 120_1 is electrically connected to an input portion of the inverter circuit 130_1. An output portion of the inverter circuit 130_1 is electrically connected to a clock signal input portion CK of an FF circuit 140_1. An input portion D of the FF circuit 140_1 is electrically connected to a wiring 103 and a first input portion of the OR circuit 110_1. An output portion Q of the FF circuit 140_1 is electrically connected to a second input portion of the OR circuit 110_1. An output signal OUT_1 is output from the output portion Q of the FF circuit 140_1. A third input portion of the OR circuit 110_1 is electrically connected to an output portion Q of an FF circuit 140_2 included in a register circuit 101_2 in the second stage.

The wiring 102 is electrically connected to a clock signal CLK supply unit (not shown) to supply a clock signal CLK. The wiring 103 is electrically connected to a start pulse signal SP supply unit (not shown) to supply a start pulse signal SP.

When i is an even number, in the register circuit 101_i in the i-th stage, a first input portion of the NAND circuit 120_i is electrically connected to the wiring 102, and a second input portion of the NAND circuit 120_i is electrically connected to an output portion of the OR circuit 110_i. An output portion of the NAND circuit 120_i is electrically connected to a clock signal input portion CK of the FF circuit 140_i. An input portion D of the FF circuit 140_i is electrically connected to a first input portion of the OR circuit 110_i and a second input portion of an OR circuit 110_i−1 that is included in a register circuit 101_i−1 in the previous stage. An output portion Q of the FF circuit 140_i is electrically connected to a second input portion of the OR circuit 110_i and a third input portion of the OR circuit 110_i−1 included in the register circuit 101_i−1 in the previous stage. An output signal OUT_i is output from the output portion Q of the FF circuit 140_i. A third input portion of the OR circuit 110_i is electrically connected to an output portion Q of the FF circuit 140_i+1 included in the register circuit 101_1+1 in the next stage.

When i is an odd number of 3 or more, in the register circuit 101_i in the i-th stage, the first input portion of the NAND circuit 120_i is electrically connected to the wiring 102, the second input portion of the NAND circuit 120_i is electrically connected to the output portion of the OR circuit 110_i. The output portion of the NAND circuit 120_i is electrically connected to an input portion of an inverter circuit 130_i. An output portion of the inverter circuit 130_i is electrically connected to the clock signal input portion CK of the FF circuit 140_i. The input portion D of the FF circuit 140_i is electrically connected to the first input portion of the OR circuit 110_i and the second input portion of the OR circuit 110_i−1 included in the register circuit 101_i−1 in the previous stage. An output portion Q of the FF circuit 140_i is electrically connected to the second input portion of the OR circuit 110_i and the third input portion of the OR circuit 110_i−1 included in the register circuit 101_i−1 in the previous stage. The output signal OUT_i is output from the output portion Q of the FF circuit 140_i. The third input portion of the OR circuit 110_i is electrically connected to the output portion Q of the FF circuit 140_i+1 included in the register circuit 101_i+1 in the next stage.

Figures 2A, 2B:
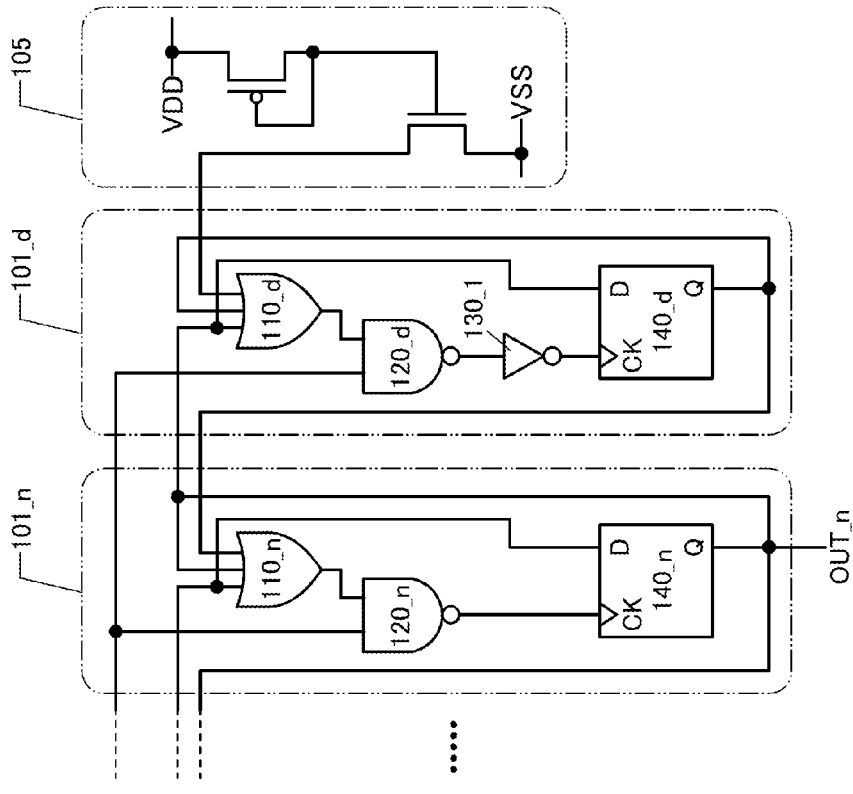
FIGS. 2A and 2B are each a block diagram illustrating a configuration example of a shift register.

To input an output signal of the next stage to the register circuit 101_n in the n-th stage, a register circuit 101_d is provided as a dummy circuit in the (n+1)-th stage as illustrated in FIGS. 2A and 2B. When n is an even number, the register circuit 101_d, like the register circuit 101 in an odd-numbered stage, includes an OR circuit 110_d, a NAND circuit 120_d, an inverter circuit 130_d, and an FF circuit 140_d. When n is an odd number, the register circuit 101_d, like the register circuit 101 in an even-numbered stage, includes the OR circuit 110_d, the NAND circuit 120_d, and the FF circuit 140_d. FIGS. 2A and 2B show configuration examples of the register circuit 101_d in which n is an even number.

An output signal of the FF circuit 140_d is input to a third input portion of an OR circuit 110_n and a second input portion of the OR circuit 110_d. An output signal OUT_n is input to a first input portion of the OR circuit 110_d.

The potential VSS is input to a third input portion of the OR circuit 110_d. As illustrated in FIG. 2A, VSS may be supplied directly to the third input portion of the OR circuit 110_d. Alternatively, as illustrated in FIG. 2B, VSS may be supplied via a VSS supply circuit 105. Using the VSS supply circuit 105 can prevent the register circuit 101_d from being damaged by electrostatic discharge (ESD) and the like, and can increase the reliability of the shift register 100.

<<Operation Example of the Shift Register 100>>

An operation example of the shift register 100 is described with reference to the block diagram of FIG. 1 and a timing chart of FIG. 3. In this embodiment, in an initial state, all the FF circuits 140 included in the shift register 100 store data corresponding to an L potential, and the output signals OUT_1 to OUT_n are each an L potential. Furthermore, this embodiment describes the operation of the register circuit 101_1, the register circuit 101_2, a register circuit 101_3, and a register circuit 101_4 from Time T1 to T6.

[Time T1]

<The Register Circuit 101_1>

At Time T1, the start pulse signal SP (H potential) is input to the first input portion of the OR circuit 110_1 via the wiring 103, and the OR circuit 110_1 outputs an H potential. The clock signal CLK is changed from an L potential to an H potential, and the H potential is input to the first input portion of the NAND circuit 120_1. The output signal of the OR circuit 110_1 (H potential) is input to the second input portion of the NAND circuit 120_1. Accordingly, an L potential is output from the NAND circuit 120_1. The output signal of the NAND circuit 120_1 (L potential) is input to the inverter circuit 130_1, and the inverter circuit 130_1 outputs an H potential. The output signal of the inverter circuit 130_1 is input to the clock signal input portion CK of the FF circuit 140_1.

Since the H potential is input to the clock signal input portion CK of the FF circuit 140_1, data corresponding to a signal that is input to the input portion D of the FF circuit 140_1 is stored in the FF circuit 140_1. The start pulse signal SP (H potential) is input to the input portion D of the FF circuit 140_1, and data corresponding to the H potential is stored in the FF circuit 140_1. A signal corresponding to the data stored in the FF circuit 140_1 is output from the output portion Q of the FF circuit 140_1. Accordingly, the output signal OUT_1 is at an H potential. An output signal of the FF circuit 140_1 (output signal OUT_1) is input to the second input portion of the OR circuit 110_1; thus, the H potential is output from the OR circuit 110_1 even when the potential of the wiring 103 becomes an L potential by Time T2.

<The Register Circuit 101_2>

At Time T1, the output signal OUT_1 in the previous stage (H potential) is input to a first input portion of an OR circuit 110_2. Thus, an H potential is output from the OR circuit 110_2 regardless of the state of a second input portion and a third input portion of the OR circuit 110_2. The clock signal CLK (H potential) is input to a first input portion of a NAND circuit 120_2, and the output signal of the OR circuit 110_2 (H potential) is input to a second input portion of the NAND circuit 120_2. Thus, an L potential is output from the NAND circuit 120_2. The output signal of the NAND circuit 120_2 (L potential) is input to a clock signal input portion CK of the FF circuit 140_2. Although the output signal OUT_1 (H potential) is input to an input portion D of the FF circuit 140_2, since the signal that is input to the clock signal input portion CK (output signal of the NAND circuit 120_2) is the L potential, data stored in the FF circuit 140_2 is not changed and accordingly the output signal of an output portion Q of the FF circuit 140_2 is not changed. That is, an output signal OUT_2 remains at the L potential.

<The Register Circuit 101_3>

At Time T1, the L potential is input to first to third input portions of an OR circuit 110_3, and an L potential is output from the OR circuit 110_3. The clock signal CLK (H potential) is input to a first input portion of a NAND circuit 120_3, and the output signal of the OR circuit 110_3 (L potential) is input to a second input portion of the NAND circuit 120_3. Thus, an H potential is output from the NAND circuit 120_3. The output signal of the NAND circuit 120_3 is inverted by the inverter circuit 130_3, and the inverted signal (L potential) is input to a clock signal input portion CK of an FF circuit 140_3. Thus, data stored in the FF circuit 140_3 is not changed, and the output signal of an output portion Q of the FF circuit 140_3 is not changed. That is, an output signal OUT_3 remains at the L potential.

<The Register Circuit 101_4>

At Time T1, the L potential is input to first to third input portions of an OR circuit 110_4, and an L potential is output from the OR circuit 110_4. The clock signal CLK (H potential) is input to a first input portion of a NAND circuit 120_4, and the output signal of the OR circuit 110_4 (L potential) is input to a second input portion of the NAND circuit 120_4. Thus, an H potential is output from the NAND circuit 120_4. Since the signal that is input to a clock signal input portion CK of an FF circuit 140_4 (output signal of the NAND circuit 120_4) is at the H potential, data corresponding to a signal that is input to an input portion D of the FF circuit 140_4 is stored in the FF circuit 140_4. The output signal OUT_3 in the previous stage (L potential) is input to the input portion D of the FF circuit 140_4; thus, the data stored in the FF circuit 140_4 is not changed and accordingly the output signal of an output portion Q of the FF circuit 140_4 is not changed. That is, an output signal OUT_4 remains at the L potential.

[Time T2]

<The Register Circuit 101_1>

At Time T2, the output signal OUT_1 (H potential) is input to the second input portion of the OR circuit 110_1. Thus, the H potential is output from the OR circuit 110_1 regardless of the state of the first and third input portions of the OR circuit 110_1. The clock signal CLK is changed from the H potential to the L potential, and the L potential is input to the first input portion of the NAND circuit 120_1. The output signal of the OR circuit 110_1 (H potential) is input to the second input portion of the NAND circuit 120_1. Accordingly, an H potential is output from the NAND circuit 120_1. The output signal of the NAND circuit 120_1 (H potential) is input to the inverter circuit 130_1, and the inverter circuit 130_1 outputs an L potential. The output signal of the inverter circuit 130_1 (L potential) is input to the clock signal input portion CK of the FF circuit 140_1. Thus, the data stored in the FF circuit 140_1 is not changed, and the output signal of the output portion Q of the FF circuit 140_1 is not changed. That is, the output signal OUT_1 remains at the H potential.

<The Register Circuit 101_2>

At Time T2, the output signal OUT_1 in the previous stage (H potential) is input to the first input portion of the OR circuit 110_2. Thus, the H potential is output from the OR circuit 110_2 regardless of the state of the second and third input portions of the OR circuit 110_2. The clock signal CLK (L potential) is input to the first input portion of the NAND circuit 120_2, and the output signal of the OR circuit 110_2 (H potential) is input to the second input portion of the NAND circuit 120_2. Thus, an H potential is output from the NAND circuit 120_2. The output signal of the NAND circuit 120_2 is input to the clock signal input portion CK of the FF circuit 140_2. The output signal OUT_1 (H potential)

is input to the input portion D of the FF circuit 140_2. The signal that is input to the clock signal input portion CK (output signal of the NAND circuit 120_2) is changed to the H potential; thus, data corresponding to the signal that is input to the input portion D of the FF circuit 140_2 is stored in the FF circuit 140_2. A signal corresponding to the data stored in the FF circuit 140_2 (H potential) is output from the output portion Q of the FF circuit 140_2. Accordingly, the output signal OUT_2 is at the H potential. The output signal of the FF circuit 140_2 (output signal OUT_2) is input to the second input portion of the OR circuit 110_2.

<The Register Circuit 101_3>

At Time T2, the output signal OUT_2 in the previous stage (H potential) is input to the first input portion of the OR circuit 110_3. Thus, an H potential is output from the OR circuit 110_3 regardless of the state of the second and third input portions of the OR circuit 110_3. The clock signal CLK (L potential) is input to the first input portion of the NAND circuit 120_3, and the output signal of the OR circuit 110_3 (H potential) is input to the second input portion of the NAND circuit 120_3. Thus, the H potential is output from the NAND circuit 120_3. The output signal of the NAND circuit 120_3 (H potential) is inverted by the inverter circuit 130_3, and the inverted signal (L potential) is input to the clock signal input portion CK of the FF circuit 140_3. Although the output signal OUT_2 (H potential) is input to the input portion D of the FF circuit 140_3, since the signal that is input to the clock signal input portion CK is at the L potential, the data stored in the FF circuit 140_3 is not changed and accordingly the output signal of the output portion Q of the FF circuit 140_3 is not changed. That is, the output signal OUT_3 remains at the L potential.

<The Register Circuit 101_4>

At Time T2, the L potential is input to the first to third input portions of the OR circuit 110_4, and the L potential is output from the OR circuit 110_4. The clock signal CLK (L potential) is input to the first input portion of the NAND circuit 120_4, and the output signal of the OR circuit 110_4 (L potential) is input to the second input portion of the NAND circuit 120_4. Thus, the H potential is output from the NAND circuit 120_4. Since the signal that is input to the clock signal input portion CK of the FF circuit 140_4 (output signal of the NAND circuit 120_4) is the H potential, data corresponding to a signal that is input to the input portion D of the FF circuit 140_4 is stored in the FF circuit 140_4. The output signal OUT_3 in the previous stage (L potential) is input to the input portion D of the FF circuit 140_4; thus, the data stored in the FF circuit 140_4 is not changed and accordingly the output signal of the output portion Q of the FF circuit 140_4 is not changed. That is, the output signal OUT_4 remains at the L potential.

[Time T3]

<The Register Circuit 101_1>

At Time T3, the output signal OUT_2 in the next stage (H potential) is input to the third input portion of the OR circuit 110_1. Thus, the H potential is output from the OR circuit 110_1 regardless of the state of the first and second input portions of the OR circuit 110_1. The clock signal CLK is changed from the L potential to the H potential, and the H potential is input to the first input portion of the NAND circuit 120_1. The output signal of the OR circuit 110_1 (H potential) is input to the second input portion of the NAND circuit 120_1. Accordingly, the L potential is output from the NAND circuit 120_1. The output signal of the NAND circuit 120_1 is input to the inverter circuit 130_1, and the inverter circuit 130_1 outputs the H potential. The output signal of the inverter circuit 130_1 (H potential) is input to the clock signal input portion CK of the FF circuit 140_1.

Since the H potential is input to the clock signal input portion CK of the FF circuit 140_1, data corresponding to a signal that is input to the input portion D of the FF circuit 140_1 is stored in the FF circuit 140_1. The L potential is input to the input portion D of the FF circuit 140_1, and data corresponding to the L potential is stored in the FF circuit 140_1. A signal corresponding to the data stored in the FF circuit 140_1 (L potential) is output from the output portion Q of the FF circuit 140_1. Accordingly, the output signal OUT_1 is at the L potential. The output signal of the FF circuit 140_1 (output signal OUT_1) is input to the second input portion of the OR circuit 110_1.

<The Register Circuit 101_2>

At Time T3, the output signal OUT_2 (H potential) is input to the second input portion of the OR circuit 110_2; thus, the H potential is output from the OR circuit 110_2 regardless of the state of the first and third input portions of the OR circuit 110_2. The clock signal CLK is changed from the L potential to the H potential, and the H potential is input to the first input portion of the NAND circuit 120_2. The output signal of the OR circuit 110_2 (H potential) is input to the second input portion of the NAND circuit 120_2. Accordingly, the L potential is output from the NAND circuit 120_2. The output signal of the NAND circuit 120_2 (L potential) is input to the clock signal input portion CK of the FF circuit 140_2. Thus, the data stored in the FF circuit 140_2 is not changed, and the output signal of the output portion Q of the FF circuit 140_2 is not changed. That is, the output signal OUT_2 remains at the H potential.

<The Register Circuit 101_3>

At Time T3, the output signal OUT_2 (H potential) is input to the first input portion of the OR circuit 110_3; thus, the H potential is output from the OR circuit 110_3 regardless of the state of the second and third input portions of the OR circuit 110_3. The clock signal CLK (H potential) is input to the first input portion of the NAND circuit 120_3, and the output signal of the OR circuit 110_3 (H potential) is input to the second input portion of the NAND circuit 120_3. Thus, an L potential is output from the NAND circuit 120_3. The output signal of the NAND circuit 120_3 (L potential) is inverted by the inverter circuit 130_3, and the inverted signal (H potential) is input to the clock signal input portion CK of the FF circuit 140_3. Since the H potential is input to the clock signal input portion CK, data corresponding to the signal that is input to the input portion D (output signal OUT_2 in the previous stage) is stored in the FF circuit 140_3. A signal corresponding to the data stored in the FF circuit 140_3 (H potential) is output from the output portion Q of the FF circuit 140_3. Accordingly, the output signal OUT_3 is at an H potential. The output signal of the FF circuit 140_3 (output signal OUT_3) is input to the second input portion of the OR circuit 110_3.

<The Register Circuit 101_4>

At Time T3, the output signal OUT_3 in the previous stage (H potential) is input to the first input portion of the OR circuit 110_4; thus, an H potential is output from the OR circuit 110_4 regardless of the state of the second and third input portions of the OR circuit 110_4. The clock signal CLK (H potential) is input to the first input portion of the NAND circuit 120_4, and the output signal of the OR circuit 110_4 (H potential) is input to the second input portion of the NAND circuit 120_4. Thus, an L potential is output from the NAND circuit 120_4. The output signal of the NAND circuit 120_4 is input to the clock signal input portion CK of the FF circuit 140_4. Although the output signal OUT_3 in the previous stage (H potential) is input to the input portion D of the FF circuit 140_4, since the signal that is input to the clock signal input portion CK (output signal of the NAND circuit 120_4) is at the L potential, the data stored in the FF circuit 140_4 is not changed and accordingly the output signal of the output portion Q of the FF circuit 140_4 is not changed. That is, the output signal OUT_4 remains at the L potential.

[Time T4]

<The Register Circuit 101_1>

At Time T4, the L potential is input to the first to third input portions of the OR circuit 110_1, and an L potential is output from the OR circuit 110_1. The clock signal CLK (L potential) is input to the first input portion of the NAND circuit 120_1, and the output signal of the OR circuit 110_1 (L potential) is input to the second input portion of the NAND circuit 120_1. Thus, the H potential is output from the NAND circuit 120_1. The output signal of the NAND circuit 120_1 (H potential) is inverted by the inverter circuit 130_1. The inverted signal (L potential) is input to the clock signal input portion CK of the FF circuit 140_1. Since the signal that is input to the clock signal input portion CK is the L potential, the data stored in the FF circuit 140_1 is not changed and accordingly the output signal of the output portion Q of the FF circuit 140_1 is not changed. That is, the output signal OUT_1 remains at the L potential.

<The Register Circuit 101_2>

At Time T4, the output signal OUT_3 in the next stage (H potential) is input to the third input portion of the OR circuit 110_2; thus, the H potential is output from the OR circuit 110_2 regardless of the state of the first and second input portions of the OR circuit 110_2. The clock signal CLK is changed from the H potential to the L potential, and the L potential is input to the first input portion of the NAND circuit 120_2. The output signal of the OR circuit 110_2 (H potential) is input to the second input portion of the NAND circuit 120_2. Accordingly, the H potential is output from the NAND circuit 120_2. The output signal of the NAND circuit 120_2 is input to the clock signal input portion CK of the FF circuit 140_2.

Since the H potential is input to the clock signal input portion CK of the FF circuit 140_2, data corresponding to a signal that is input to the input portion D of the FF circuit 140_2 is stored in the FF circuit 140_2. The output signal OUT_1 in the previous stage (L potential) is input to the input portion D of the FF circuit 140_2, and data corresponding to the L potential is stored in the FF circuit 140_2. A signal corresponding to the data stored in the FF circuit 140_2 (L potential) is output from the output portion Q of the FF circuit 140_2. Accordingly, the output signal OUT_2 is at the L potential. The output signal of the FF circuit 140_2 (output signal OUT_2) is input to the second input portion of the OR circuit 110_2.

<The Register Circuit 101_3>

At Time T4, the output signal OUT_3 (H potential) is input to the second input portion of the OR circuit 110_3; thus, the H potential is output from the OR circuit 110_3 regardless of the state of the first and third input portions of the OR circuit 110_3. The clock signal CLK is changed from the H potential to the L potential, and the L potential is input to the first input portion of the NAND circuit 120_3. The output signal of the OR circuit 110_3 (H potential) is input to the second input portion of the NAND circuit 120_3. Accordingly, the H potential is output from the NAND circuit 120_3. The output signal of the NAND circuit 120_3 (H potential) is inverted by the inverter circuit 130_3, and the inverted signal (L potential) is input to the clock signal input portion CK of the FF circuit 140_3. Thus, the data stored in the FF circuit 140_3 is not changed, and the output signal of the output portion Q of the FF circuit 140_3 is not changed. That is, the output signal OUT_3 remains at the H potential.

<The Register Circuit 101_4>

At Time T4, the output signal OUT_3 in the previous stage (H potential) is input to the first input portion of the OR circuit 110_4; thus, the H potential is output from the OR circuit 110_4 regardless of the state of the second and third input portions of the OR circuit 110_4. The clock signal CLK (L potential) is input to the first input portion of the NAND circuit 120_4, and the output signal of the OR circuit 110_4 (H potential) is input to the second input portion of the NAND circuit 120_4. Thus, the H potential is output from the NAND circuit 120_4. The output signal of the NAND circuit 120_4 is input to the clock signal input portion CK of the FF circuit 140_4. The output signal OUT_3 in the previous stage (H potential) is input to the input portion D of the FF circuit 140_4. Since the H potential is input to the clock signal input portion CK of the FF circuit 140_4, data corresponding to a signal that is input to the input portion D of the FF circuit 140_4 is stored in the FF circuit 140_4. A signal corresponding to the data stored in the FF circuit 140_4 is output from the output portion Q of the FF circuit 140_4. Accordingly, an H potential is output from the output portion Q of the FF circuit 140_4, and the output signal OUT_4 is at the H potential. The output signal of the FF circuit 140_4 (output signal OUT_4) is input to the second input portion of the OR circuit 110_4.

[Time T5]

<The Register Circuit 101_1>

At Time T5, the L potential is input to the first to third input portions of the OR circuit 110_1, and an L potential is output from the OR circuit 110_1. The clock signal CLK (H potential) is input to the first input portion of the NAND circuit 120_1, and the output signal of the OR circuit 110_1 (L potential) is input to the second input portion of the NAND circuit 120_1. Thus, the H potential is output from the NAND circuit 120_1. The output signal of the NAND circuit 120_1 (H potential) is inverted by the inverter circuit 130_i. The inverted signal (L potential) is input to the clock signal input portion CK of the FF circuit 140_1. Since the signal that is input to the clock signal input portion CK is the L potential, data stored in the FF circuit 140_1 is not changed and accordingly the output signal of the output portion Q of the FF circuit 140_1 is not changed. That is, the output signal OUT_1 remains at the L potential.

<The Register Circuit 101_2>

At Time T5, the L potential is input to the first to third input portions of the OR circuit 110_2, and an L potential is output from the OR circuit 110_2. The clock signal CLK (H potential) is input to the first input portion of the NAND circuit 120_2, and the output signal of the OR circuit 110_2 (L potential) is input to the second input portion of the NAND circuit 120_2. Thus, the H potential is output from the NAND circuit 120_2. The output signal of the NAND circuit 120_2 (H potential) is input to the clock signal input portion CK of the FF circuit 140_2. The H potential has been input to the clock signal input portion CK of the FF circuit 140_2 since Time T4. The L potential has been input to the input portion D of the FF circuit 140_2 since Time T4. Thus, the data stored in the FF circuit 140_2 is not changed and accordingly the output signal of the output portion Q of the FF circuit 140_2 is not changed. That is, the output signal OUT_2 remains at the L potential.

<The Register Circuit 101_3>

At Time T5, the output signal OUT_4 (H potential) in the next stage is input to the third input portion of the OR circuit 110_3. Thus, the H potential is output from the OR circuit 110_3 regardless of the state of the first and second input portions of the OR circuit 110_3. The clock signal CLK is changed from the L potential to the H potential, and the H potential is input to the first input portion of the NAND circuit 120_3. The output signal of the OR circuit 110_3 (H potential) is input to the second input portion of the NAND circuit 120_3. Accordingly, the L potential is output from the NAND circuit 120_3. The output signal of the NAND circuit 120_3 (L potential) is input to the inverter circuit 130_3, and the inverter circuit 130_3 outputs the H potential. The output signal of the inverter circuit 130_3 (H potential) is input to the clock signal input portion CK of the FF circuit 140_3.

Since the H potential is input to the clock signal input portion CK of the FF circuit 140_3, data corresponding to a signal that is input to the input portion D of the FF circuit 140_3 is stored in the FF circuit 140_3. The output signal OUT_2 in the previous stage (L potential) is input to the input portion D of the FF circuit 140_3. Thus, data corresponding to the L potential is stored in the FF circuit 140_3. A signal corresponding to the data stored in the FF circuit 140_3 (L potential) is output from the output portion Q of the FF circuit 140_3. Accordingly, the output signal OUT_3 is at the L potential. The output signal of the FF circuit 140_3 (output signal OUT_3) is input to the second input portion of the OR circuit 110_3.

<The Register Circuit 101_4>

At Time T5, the output signal OUT_4 (H potential) is input to the second input portion of the OR circuit 110_4; thus, the H potential is output from the OR circuit 110_4 regardless of the state of the first and third input portions of the OR circuit 110_4. The clock signal CLK is changed from the L potential to the H potential, and the H potential is input to the first input portion of the NAND circuit 120_4. The output signal of the OR circuit 110_4 (H potential) is input to the second input portion of the NAND circuit 120_4. Accordingly, the L potential is output from the NAND circuit 120_4. The output signal of the NAND circuit 120_4 (L potential) is input to the clock signal input portion CK of the FF circuit 140_4. Thus, the data stored in the FF circuit 140_4 is not changed, and the output signal of an output portion Q of the FF circuit 140_4 is not changed. That is, the output signal OUT_4 remains at the H potential.

[Time T6]

<The Register Circuit 101_1>

At Time T6, the L potential is input to the first to third input portions of the OR circuit 110_1, and an L potential is output from the OR circuit 110_1. The clock signal CLK (L potential) is input to the first input portion of the NAND circuit 120_1, and the output signal of the OR circuit 110_1 (L potential) is input to the second input portion of the NAND circuit 120_1. Thus, the H potential is output from the NAND circuit 120_1. The output signal of the NAND circuit 120_1 (H potential) is inverted by the inverter circuit 130_i. The inverted signal (L potential) is input to the clock signal input portion CK of the FF circuit 140_1. Since the signal that is input to the clock signal input portion CK is the L potential, data stored in the FF circuit 140_1 is not changed and accordingly the output signal of the output portion Q of the FF circuit 140_1 is not changed. That is, the output signal OUT_1 remains at the L potential.

<The Register Circuit 101_2>

At Time T6, the L potential is input to the first to third input portions of the OR circuit 110_2, and an L potential is output from the OR circuit 110_2. The clock signal CLK (L potential) is input to the first input portion of the NAND circuit 120_2, and the output signal of the OR circuit 110_2 (L potential) is input to the second input portion of the NAND circuit 120_2. Thus, the H potential is output from the NAND circuit 120_2. The output signal of the NAND circuit 120_2 (H potential) is input to the clock signal input portion CK of the FF circuit 140_2. Since the signal that is input to the clock signal input portion CK of the FF circuit 140_2 has been the H potential since Time T4, the data stored in the FF circuit 140_2 is not changed and accordingly the output signal of the output portion Q of the FF circuit 140_2 is not changed. That is, the output signal OUT_2 remains at the L potential.

<The Register Circuit 101_3>

At Time T6, the L potential is input to the first to third input portions of the OR circuit 110_3, and the L potential is output from the OR circuit 110_3. The clock signal CLK (L potential) is input to the first input portion of the NAND circuit 120_3, and the output signal of the OR circuit 110_3 (L potential) is input to the second input portion of the NAND circuit 120_3. Thus, the H potential is output from the NAND circuit 120_3. The output signal of the NAND circuit 120_3 (H potential) is inverted by the inverter circuit 130_3. The inverted signal (L potential) is input to the clock signal input portion CK of the FF circuit 140_3. Since the signal that is input to the clock signal input portion CK is the L potential, the data stored in the FF circuit 140_3 is not changed and accordingly the output signal of the output portion Q of the FF circuit 140_3 is not changed. That is, the output signal OUT_3 remains at the L potential.

<The Register Circuit 101_4>

At Time T6, an output signal OUT_5 (H potential) in the next stage that is not illustrated is input to the third input portion of the OR circuit 110_4; thus, the H potential is output from the OR circuit 110_4 regardless of the state of the first and second input portions of the OR circuit 110_4. The clock signal CLK is changed from the H potential to the L potential, and the L potential is input to the first input portion of the NAND circuit 120_4. The output signal of the OR circuit 110_4 (H potential) is input to the second input portion of the NAND circuit 120_4. Accordingly, the H potential is output from the NAND circuit 120_4. The output signal of the NAND circuit 120_4 (H potential) is input to the clock signal input portion CK of the FF circuit 140_4.

Since the H potential is input to the clock signal input portion CK of the FF circuit 140_4, data corresponding to a signal that is input to the input portion D of the FF circuit 140_4 is stored in the FF circuit 140_4. The output signal OUT_3 in the previous stage (L potential) is input to the input portion D of the FF circuit 140_4, and data corresponding to the L potential is stored in the FF circuit 140_4. A signal corresponding to the data stored in the FF circuit 140_4 (L potential) is output from the output portion Q of the FF circuit 140_4. Accordingly, the output signal OUT_4 is at the L potential. The output signal of the FF circuit 140_4 (output signal OUT_4) is input to the second input portion of the OR circuit 110_4.

The above-described operation is repeated up to the register circuit 101 in the n-th stage, so that the shift register 100 can be operated.

As described above, the operation of the FF circuit 140_1 of the register circuit 101_1 in the first stage is determined by the start pulse signal SP; the output signal OUT_1 which is an output signal of the first stage; the output signal OUT_2, which is an output signal of the second stage; and the clock signal CLK.

In the register circuit 101_i in the i-th stage, the operation of the FF circuit 140_i is determined by an output signal OUT_i−1, which is an output signal of the previous stage (the (i−1)-th stage); an output signal OUT_i, which is an output signal of the i-th stage; an output signal OUT_i+1, which is an output signal of the next stage (the (i+1)-th stage); and the clock signal CLK.

In the register circuit 101_n in the n-th stage, the operation of the FF circuit 140_n is determined by an output signal OUT_n−1, which is an output signal of the previous stage (the (n−1)-th stage); an output signal OUT_n, which is an output signal of the n-th stage; an output signal OUT_d, which is an output signal of the dummy circuit 101_d in the next stage (the (n+1)-th stage); and the clock signal CLK.

Rewriting is performed on the FF circuit 140 in each stage only while an H potential is output as each of the output signals OUT in the previous stage, the one stage, and the next stage. Rewriting is not performed in the other period.

Specifically, in the other period, an L potential is always output from the inverter circuit 130 included in the register circuit 101 in an odd-numbered stage, so that the output signal is not inverted. Thus, transient current is not produced in the inverter circuit 130, leading to a reduction in power consumption of the shift register 100.

Furthermore, in the other period, an L potential is always input to the clock signal input portion CK of the FF circuit 140 in an odd-numbered stage, so that data stored in the FF circuit 140 in the odd-numbered stage is not rewritten. Thus, power consumption of the shift register 100 can be reduced.

Still furthermore, in the other period, although an H potential is always input to the clock signal input portion CK of the FF circuit 140 in an even-numbered stage, data stored in the FF circuit 140 in the even-numbered stage is not rewritten because an L potential is input to the input portion D of the FF circuit 140. Thus, power consumption of the shift register 100 can be reduced.

<<Transient Current in Operation of the Shift Register 100>>

As described above, in each of the inverter circuits included in the register circuits 101 of the shift register 100, an output signal of the inverter circuit in one stage is changed in synchronization with the clock signal CLK when any of the output signals in the previous stage, the one stage, and the next stage is at an H potential. Specifically, when i is an odd number of 3 or more, in the register circuit 101_i in the i-th stage included in the shift register 100, output signals of the following seven inverter circuits are changed in synchronization with the clock signal CLK: the inverter circuits 141a and 141b included in the FF circuit 140_i−1 in the previous stage (the (i−1)-th stage), the inverter circuit 130_i, the inverter circuits 141a and 141b included in the FF circuit 140_i in the i-th stage, and the inverter circuits 141a and 141b included in the FF circuit 140_i+1 in the next stage (the (i+1)-th stage). When the i is an even number of 2 or more, in the register circuit 101_i in the i-th stage, output signals of the following eight inverter circuits are changed in synchronization with the clock signal CLK: the inverter circuit 130_i−1, the inverter circuits 141a and 141b included in the FF circuit 140_i−1 in the previous stage (the (i−1)-th stage), the inverter circuits 141a and 141b included in the FF circuit 140_i in the i-th stage, and the inverter circuit 130_i+1, the inverter circuits 141a and 141b included in the FF circuit 140_i+1 in the next stage (the (i+1)-th stage).

A transient current produced in each inverter circuit is referred to as Iinv. When all the Iinv in the shift register 100 are assumed to have the same value, the sum Isr1 of the line flowing when the output signal OUT_i in the i-th stage is at an H potential can be expressed by Formula 1.

[Formula 1]

$$Isr1 = \frac{7 \times Iinv + 8 \times Iinv}{2} = 7.5 \times Iinv \quad (1)$$

Figure 9:
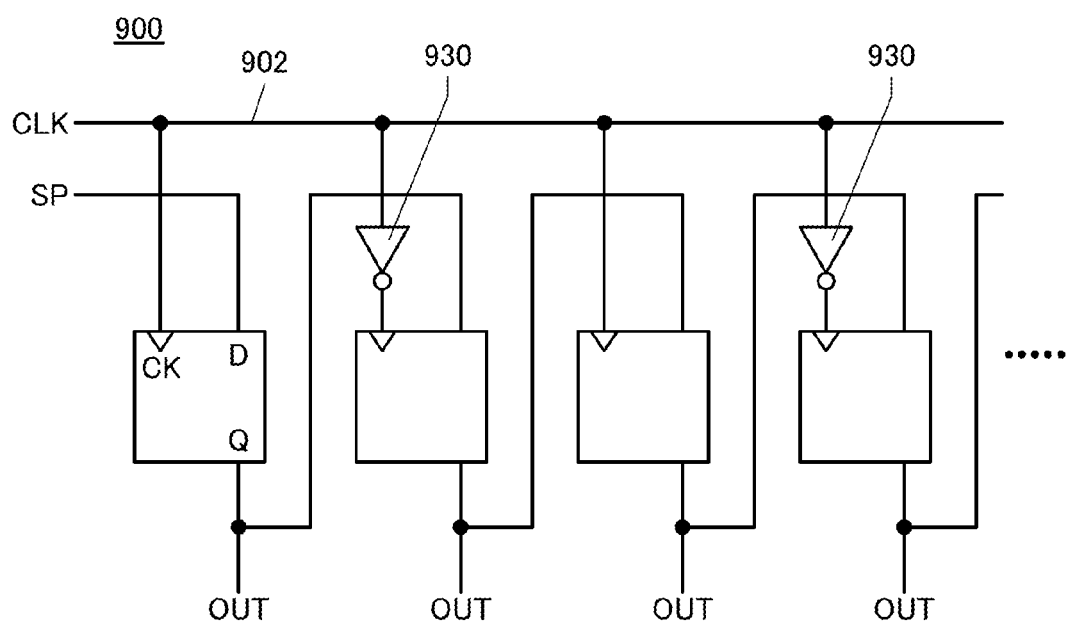
FIG. 9 is a block diagram illustrating a conventional example of a shift register.

In the shift register 900 that is a conventional example (see FIG. 9), output signals of all the inverter circuits are always changed in synchronization with the clock signal. In the shift register 900, two inverter circuits are included in an odd-numbered stage and three inverter circuits are included in an even-numbered stage. Thus, the sum Isr2 of line flowing when an output signal OUT_i in an i-th stage in the shift register 900 including N stages of output portions is at an H potential can be expressed by Formula 2.

[Formula 2]

$$Isr2 = 2 \times Iinv \times \frac{N}{2} + 3 \times Iinv \times \frac{N}{2} = 2.5 \times Iinv \times N \quad (2)$$

According to Formula 2, in the shift register 900, the transient currents increase as the number of output stages of the shift register increases. According to Formula 1, in the shift register 100 of one embodiment of the present invention, the transient currents do not increase even when the number of the output stages of the shift register increases. Thus, one embodiment of the present invention can prevent an increase in power consumption caused by an increase in the number of the output stages of the shift register. Furthermore, one embodiment of the present invention can obtain a shift register with low power consumption. Still furthermore, a semiconductor device with low power consumption can be obtained using the shift register of one embodiment of the present invention.

Moreover, the shift register 100 of one embodiment of the present invention does not require a complementary clock signal line and thus can reduce the number of wirings used to configure a circuit. The shift register 100 does not require an inverter circuit that produces a complementary clock signal from a clock signal. Thus, an area occupied by the shift register 100 can be prevented from increasing, and the shift register 100 and a semiconductor device using the shift register 100 can be reduced in size. The reduction in the number of wirings reduces parasitic capacitance, and thus the shift register 100 and a semiconductor device using the shift register 100 can have higher operation speed and lower power consumption. Since one factor of determining the operation of the register circuit 101 in one stage is the output signal OUT in the next stage, the operation of the shift register 100 is more stable than that of a shift register 200 described later.

Figure 8:
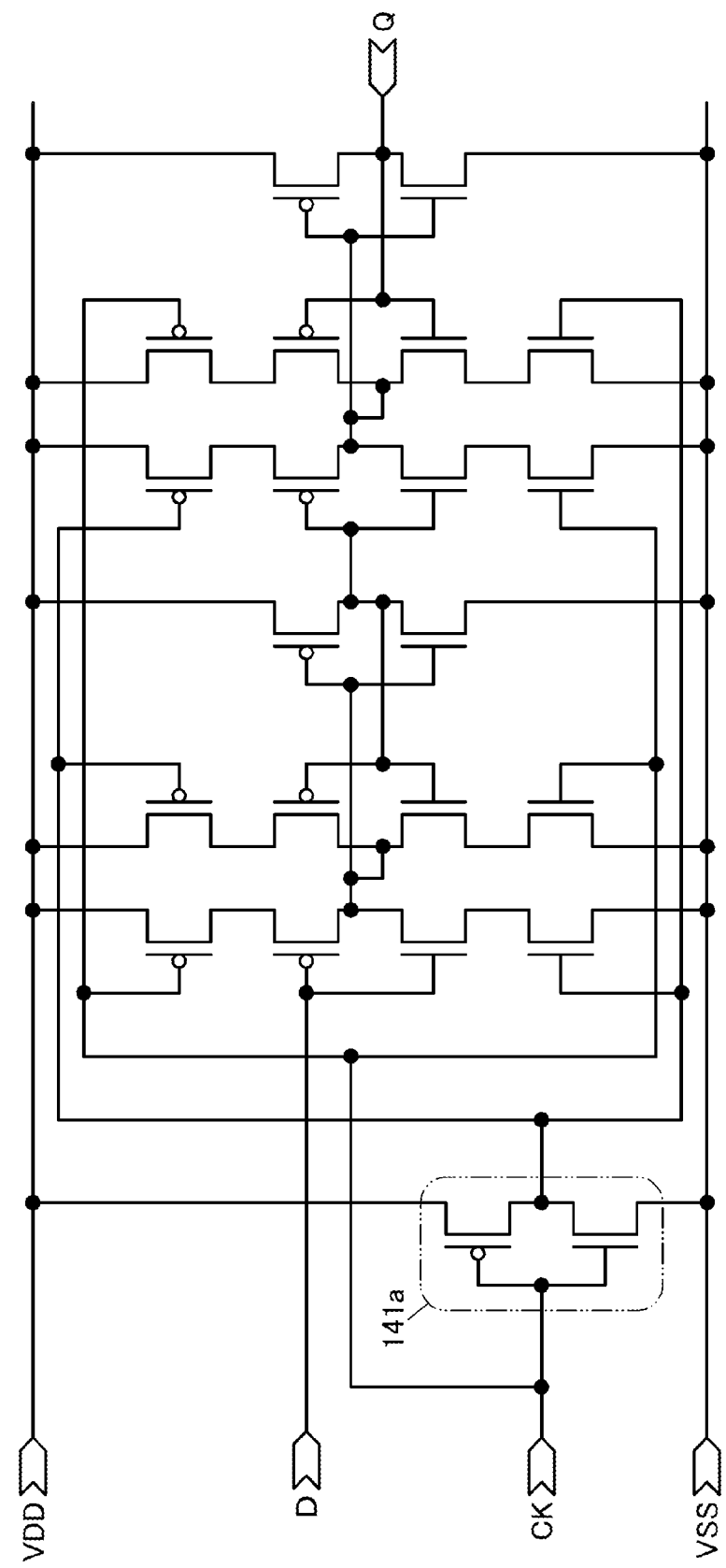
FIG. 8 illustrates a configuration example of a flip-flop circuit.

Note that one of the inverter circuits 141a and 141b in the FF circuit 140 is not necessarily provided. FIG. 8 illustrates a circuit diagram of the FF circuit 140 that does not include the inverter circuit 141b. A reduction in the number of the inverter circuits can reduce the area occupied by the shift register 100 and the power consumption of the shift register 100 and a semiconductor device using the shift register 100.

This embodiment can be implemented in an appropriate combination with any of the structures described in the other embodiments.

(Embodiment 2)

Figure 10:
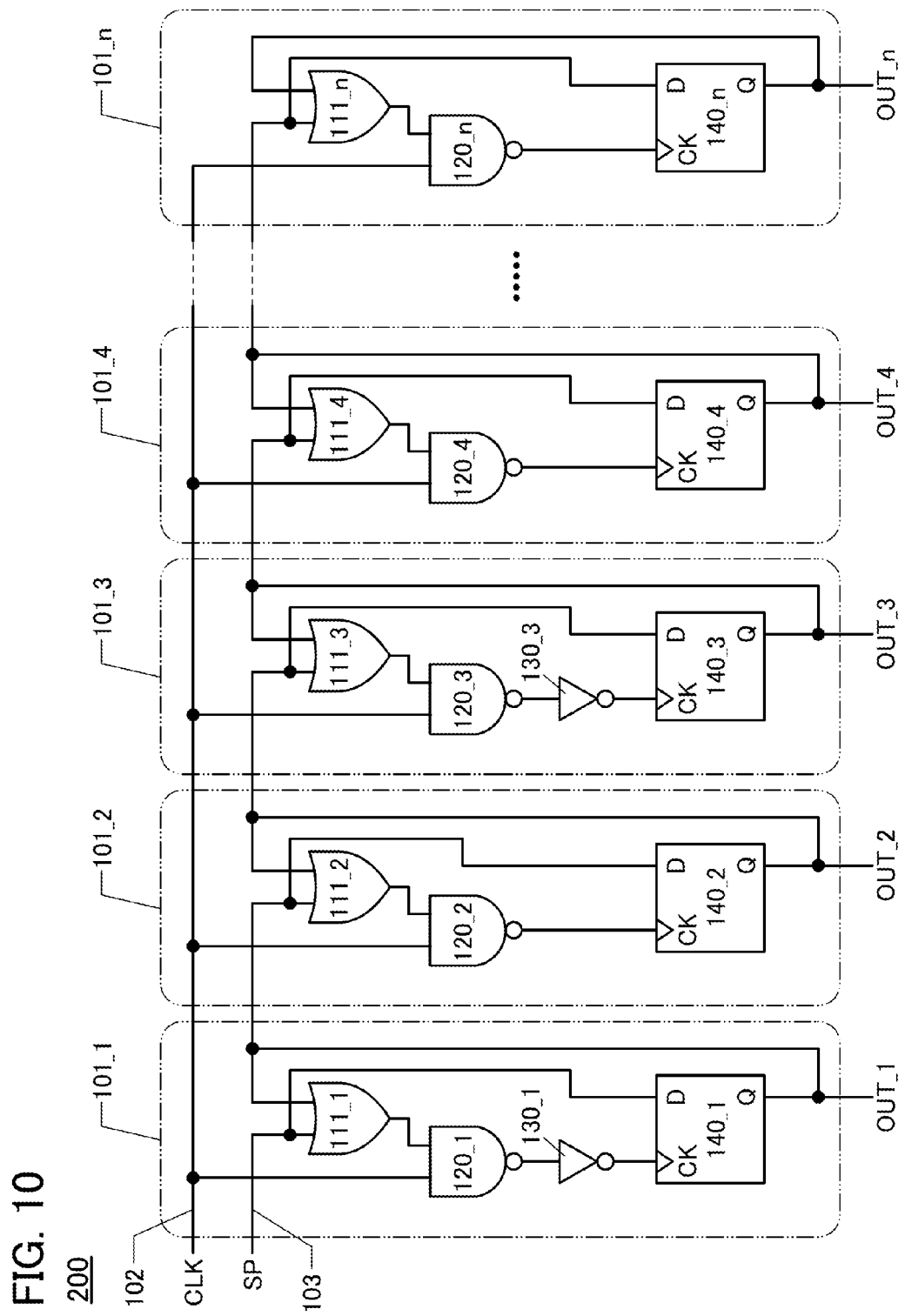
FIG. 10 is a block diagram illustrating a configuration example of a shift register.

FIG. 10 illustrates the shift register 200 as a modification example of the shift register 100. This embodiment describes the shift register 200 mainly as to different points from the shift register 100 to avoid repeated description.

<<Circuit Configuration Example of the Shift Register 200>>

In the shift register 200, an OR circuit 111 including two input portions and one output portion is used instead of the OR circuit 110. The OR circuit 111 has the same structure as that of the OR circuit 110, except that a third input portion is not provided in the OR circuit 111. Thus, in the shift register 200, an output signal OUT of the FF circuit 140 in one stage is not input to the OR circuit 111 in the previous stage. Consequently, the shift register 200 does not include the register circuit 101_d in the (n+1)-th stage, which is included in the shift register 100.

<<Operation Example of the Shift Register 200>>

For the operation of the shift register 200, refer to the operation example of the shift register 100 described in the above-described embodiment. The following mainly describes operations different from the operation example that is described in the above-described embodiment.

[Time T3]
<Register Circuit 101_1>

At Time T3, an output signal OUT_1 in the first stage (H potential) is input to a second input portion of an OR circuit 111_1. Thus, an H potential is output from the OR circuit 111_1 regardless of the state of a first input portion of the OR circuit 111_1. A clock signal CLK is changed from an L potential to an H potential, and the H potential is input to a first input portion of a NAND circuit 120_1. The output signal of the OR circuit 111_1 (H potential) is input to a second input portion of the NAND circuit 120_1. Accordingly, an L potential is output from the NAND circuit 120_1. The output signal of the NAND circuit 120_1 is input to an inverter circuit 130_1, and the inverter circuit 130_1 outputs an H potential. The output signal of the inverter circuit 130_1 (H potential) is input to a clock signal input portion CK of an FF circuit 140_1.

Since the H potential is input to the clock signal input portion CK of the FF circuit 140_1, data corresponding to a signal that is input to an input portion D of the FF circuit 140_1 is stored in the FF circuit 140_1. An L potential is input to the input portion D of the FF circuit 140_1, and data corresponding to the L potential is stored in the FF circuit 140_1. A signal corresponding to the data stored in the FF circuit 140_1 (L potential) is output from an output portion Q of the FF circuit 140_1. Accordingly, the output signal OUT_1 is at the L potential. The output signal of the FF circuit 140_1 (output signal OUT_1) is input to the second input portion of the OR circuit 111_1.

[Time T4]
<Register Circuit 101_2>

At Time T4, an output signal OUT_2 in the second stage (H potential) is input to a second input portion of an OR circuit 111_2; thus, an H potential is output from the OR circuit 111_2 regardless of the state of a first input portion of the OR circuit 111_2. The clock signal CLK is changed from the H potential to the L potential, and the L potential is input to a first input portion of a NAND circuit 120_2. An output signal of the OR circuit 111_2 (H potential) is input to a second input portion of the NAND circuit 120_2. Accordingly, an H potential is output from the NAND circuit 120_2. The output signal of the NAND circuit 120_2 is input to a clock signal input portion CK of an FF circuit 140_2.

Since the H potential is input to the clock signal input portion CK of the FF circuit 140_2, data corresponding to a signal that is input to an input portion D of the FF circuit 140_2 is stored in the FF circuit 140_2. The output signal OUT_1 in the previous stage (L potential) is input to the input portion D of the FF circuit 140_2, and data corresponding to the L potential is stored in the FF circuit 140_2. A signal corresponding to the data stored in the FF circuit 140_2 (L potential) is output from an output portion Q of the FF circuit 140_2. Accordingly, the output signal OUT_2 is at an L potential. The output signal of the FF circuit 140_2 (output signal OUT_2) is input to the second input portion of the OR circuit 111_2.

[Time T5]
<Register Circuit 101_3>

At Time T5, an output signal OUT_3 in the third stage (H potential) is input to a second input portion of an OR circuit 111_3. Thus, an H potential is output from the OR circuit 111_3 regardless of the state of a first input portion of the OR circuit 111_3. The clock signal CLK is changed from the L potential to the H potential, and the H potential is input to a first input portion of a NAND circuit 120_3. The output signal of the OR circuit 111_3 (H potential) is input to a second input portion of the NAND circuit 120_3. Accordingly, an L potential is output from the NAND circuit 120_3. The output signal of the NAND circuit 120_3 (L potential) is input to an inverter circuit 130_3, and the inverter circuit 130_3 outputs an H potential. The output signal of the inverter circuit 130_3 (H potential) is input to a clock signal input portion CK of an FF circuit 140_3.

Since the H potential is input to the clock signal input portion CK of the FF circuit 140_3, data corresponding to a signal that is input to an input portion D of the FF circuit 140_3 is stored in the FF circuit 140_3. The output signal OUT_2 in the previous stage (L potential) is input to the input portion D of the FF circuit 140_3. Thus, data corresponding to the L potential is stored in the FF circuit 140_3. A signal corresponding to the data stored in the FF circuit 140_3 (L potential) is output from an output portion Q of the FF circuit 140_3. Accordingly, the output signal OUT_3 is at an L potential. The output signal of the FF circuit 140_3 (output signal OUT_3) is input to the second input portion of the OR circuit 111_3.

[Time T6]
<Register Circuit 101_4>

At Time T6, an output signal OUT_4 in the fourth stage (H potential) is input to a second input portion of an OR circuit 111_4. Thus, an H potential is output from the OR circuit 111_4 regardless of the state of a first input portion of the OR circuit 111_4. The clock signal CLK is changed from the H potential to the L potential, and the L potential is input to a first input portion of a NAND circuit 120_4. The output signal of the OR circuit 111_4 (H potential) is input to a second input portion of the NAND circuit 120_4. Accordingly, an H potential is output from the NAND circuit 120_4. The output signal of the NAND circuit 120_4 (H potential) is input to a clock signal input portion CK of an FF circuit 140_4.

Since the H potential is input to the clock signal input portion CK of the FF circuit 140_4, data corresponding to a signal that is input to an input portion D of the FF circuit 140_4 is stored in the FF circuit 140_4. The output signal OUT_3 in the previous stage (L potential) is input to the input portion D of the FF circuit 140_4, and data corresponding to the L potential is stored in the FF circuit 140_4. A signal corresponding to the data stored in the FF circuit 140_4 (L potential) is output from an output portion Q of the FF circuit 140_4. Accordingly, the output signal OUT_4 is at an L potential. The output signal of the FF circuit 140_4 (output signal OUT_4) is input to the second input portion of the OR circuit 111_4.

The above-described operation is repeated up to the register circuit 101 in the n-th stage, so that the shift register 200 can be operated.

As described above, the operation of changing the output signal OUT of each stage from the H potential to the L potential in the shift register 200 differs from that in the shift register 100. In the shift register 200, in order to output an H potential from the OR circuit 111 in one stage, an output signal OUT in the one stage (H potential) is used. Thus, in the shift register 200, the number of wirings to be used can be further reduced, and thus the occupied area can be further reduced. Furthermore, the shift register 200 and a semiconductor device using the shift register 200 can be reduced in size. The reduction in the number of wirings reduces parasitic capacitance, and thus the shift register 200 and a semiconductor device using the shift register 200 can have higher operation speed and lower power consumption.

This embodiment can be implemented in an appropriate combination with any of the structures described in the other embodiments.

(Embodiment 3)

This embodiment describes a configuration example of a display device 500 including a plurality of pixels provided in a matrix as an example of a semiconductor device using the shift register 100 and/or the shift register 200 disclosed in the above-described embodiments.

<<Configuration Example of the Display Device 500>>

Figure 11A:
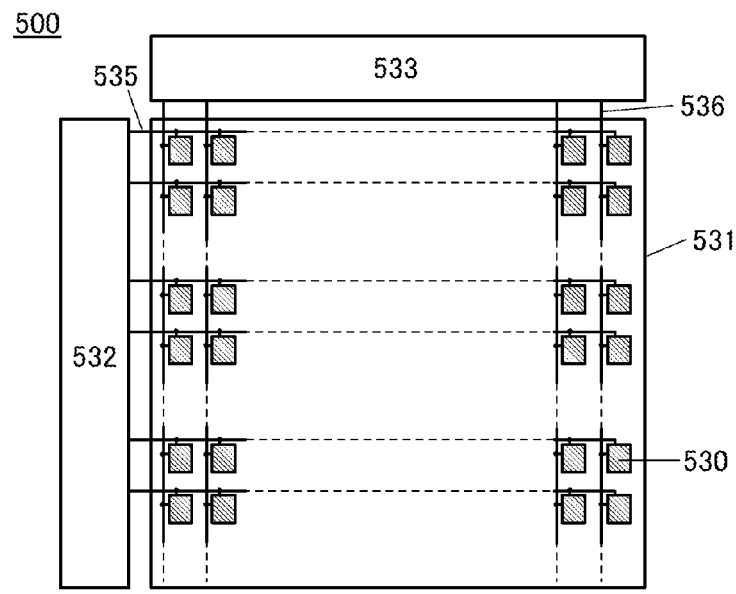
FIGS. 11A to 11C are a block diagram and circuit diagrams illustrating one embodiment of a display device.

FIG. 11A is a block diagram illustrating the configuration of the display device 500. The display device 500 includes a display region 531, a circuit 532, and a circuit 533. The circuit 532 serves as a scan line driver circuit, for example. The circuit 533 serves as a signal line driver circuit, for example.

The display device 500 includes p scan lines 535 that are arranged parallel or substantially parallel to each other and whose potentials are controlled by the circuit 532, and q signal lines 536 that are arranged parallel or substantially parallel to each other and whose potentials are controlled by the circuit 533. The display region 531 includes a plurality of pixels 530 arranged in a matrix of p rows by q columns. Note that p and q are each a natural number of 2 or more.

For example, using the pixels 530 arranged in a matrix of 1920×1080, the display device 500 can display an image with "full high definition" (also referred to as "2K resolution", "2K1K", "2K", and the like). Using the pixels 530 arranged in a matrix of 4096×2160, the display device 500 can display an image with "ultra high definition" (also referred to as "4K resolution", "4K2K", "4K", and the like). Using the pixels 530 arranged in a matrix of 8192×4320, the display device 500 can display an image with "super high definition" (also referred to as "8K resolution", "8K4K", "8K", and the like). Using a larger number of display elements, the display device 500 can display an image with 16K or 32K resolution.

Each of the scan lines 535 is electrically connected to the q pixels 530 in the corresponding row among the pixels 530 in the display region 531. Each of the signal lines 536 is electrically connected to the p pixels 530 in the corresponding column among the pixels 530.

Figure 12A:
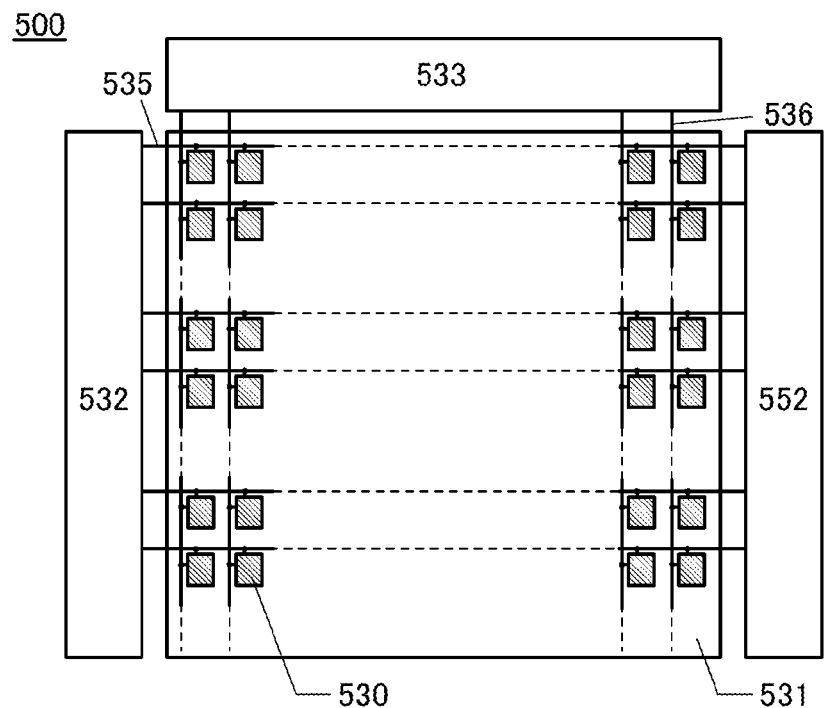
FIGS. 12A and 12B are each a block diagram illustrating one embodiment of a display device.
Figure 12B:
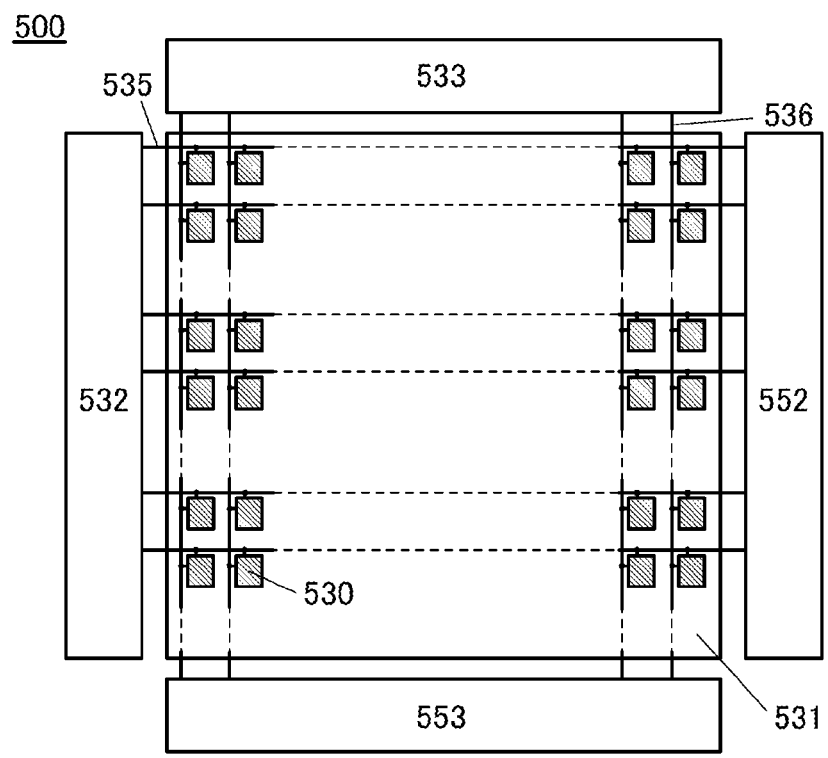

As illustrated in FIG. 12A, a circuit 552 may be provided on the opposite side of the display region 531 from the circuit 532. Furthermore, as illustrated in FIG. 12B, a circuit 553 may be provided on the opposite side of the display region 531 from the circuit 533. In each of FIGS. 12A and 12B, like the circuit 532, the circuit 552 is connected to the scan lines 535. Note that the present invention is not limited to these configurations. For example, the scan lines 535 may be connected alternately to the circuit 532 and the circuit 552 every several rows. In the example of FIG. 12B, like the circuit 533, the circuit 553 is connected to the signal lines 536. Note that the present invention is not limited to this configuration. For example, the signal lines 536 may be connected alternately to the circuit 533 and the circuit 553 every several rows. The circuits 532, 533, 552, and 553 may have a function other than the function of driving the pixel 530.

Note that the circuits 532, 533, 552, and 553 may be referred to as "peripheral circuit" or "driver circuit". The pixel 530 includes a pixel circuit 537 and a display element. The pixel circuit 537 drives the display element. A transistor included in the driver circuit and a transistor included in the pixel circuit 537 can be formed at the same time. Part of the driver circuit or the entire driver circuit may be formed over another substrate and electrically connected to the display device 500. For example, part of the driver circuit or the entire driver circuit may be formed over a single crystal substrate and electrically connected to the display device 500. The shift register 100 and/or the shift register 200 described in the above-described embodiments can be used for the driver circuit.

<<Configuration Example of the Pixel 530>>

Figure 11B:
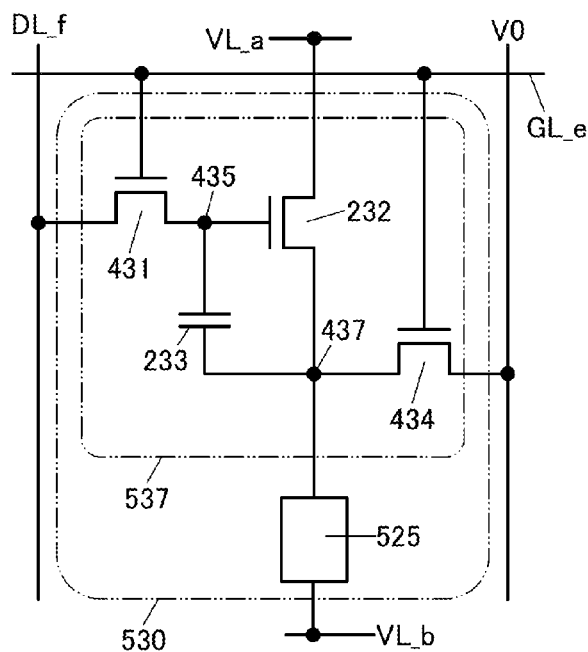
Figure 11C:
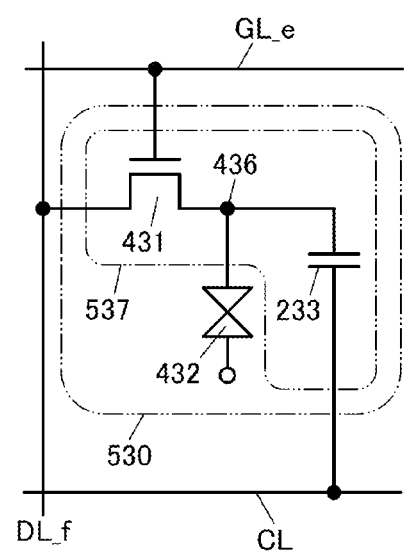

FIGS. 11B and 11C each illustrate a configuration example of a circuit that can be used for the pixel 530.

[Example of Pixel Circuit for Light-Emitting Display Device]

FIG. 11B illustrates a configuration example of a circuit that can be used for a pixel in a light-emitting display device. The pixel circuit 537 illustrated in FIG. 11B includes a transistor 431, a capacitor 233, the transistor 232, and a transistor 434. The pixel circuit 537 is electrically connected to a light-emitting element 525 that can function as a display element.

One of a source electrode and a drain electrode of the transistor 431 is electrically connected to the signal line 536 in the f-th column to which a data signal is supplied (hereinafter referred to as a signal line DL_f. A gate electrode of the transistor 431 is electrically connected to the scan line 535 in the e-th row to which a gate signal is supplied (hereinafter referred to as a scan line GL_e). Note that e is a natural number of greater than or equal to 1 and smaller than or equal to p, and f is a natural number of greater than or equal to 1 and smaller than or equal to q.

The transistor 431 has a function of controlling whether to write a data signal to a node 435.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other of the source electrode and the drain electrode of the transistor 232 is electrically connected to the node 437. A gate electrode of the transistor 232 is electrically connected to the node 435.

One of a source electrode and a drain electrode of the transistor 434 is electrically connected to a potential supply line V0, and the other of the source electrode and the drain electrode of the transistor 434 is electrically connected to the node 437. A gate electrode of the transistor 434 is electrically connected to the scan line GL_e.

One of an anode and a cathode of the light-emitting element 525 is electrically connected to a potential supply line VL_b, and the other of the anode and the cathode of the light-emitting element 525 is electrically connected to the node 437.

As the light-emitting element 525, an organic electroluminescent element (also referred to as an organic EL element) or the like can be used, for example. Note that the light-emitting element 525 is not limited to organic EL elements; an inorganic EL element including an inorganic material can be used, for example.

For example, the potential supply line VL_a has a function of supplying VDD. The potential supply line VL_b has a function of supplying VSS. The potential supply line V0 has a function of supplying VSS.

An operation example of a display device including the pixel circuit 537 illustrated in FIG. 11B is described here. First, the circuit 532 sequentially selects the pixel circuits 537 row by row. In each of the pixel circuits 537, the transistor 431 is turned on so that a data signal (potential) is written into the node 435. Next, the transistor 434 is turned on, and the potential of the node 437 is set to VSS.

Then, the transistor 431 is turned off and the data signal written to the node 435 is stored. Next, the transistor 434 is turned off. The amount of current flowing between the source electrode and the drain electrode of the transistor 232 is determined by the data signal written to the node 435. Thus, the amount of current flowing in the light-emitting element 525 is determined by the data signal written to the node 435. Thus, the light-emitting element 525 emits light with a luminance corresponding to the amount of flowing current. This operation is sequentially performed row by row; thus, an image is displayed.

[Example of Pixel Circuit for Liquid Crystal Display Device]

FIG. 11C illustrates a configuration example of a circuit that can be used for a pixel in a liquid crystal display device. The pixel circuit 537 in FIG. 11C includes the transistor 431 and the capacitor 233. The pixel circuit 537 is electrically connected to a liquid crystal element 432 that can function as a display element.

The potential of one of a pair of electrodes of the liquid crystal element 432 is set in accordance with the specifications of the pixel circuit 537 as appropriate. The alignment state of the liquid crystal element 432 depends on a data signal written to a node 436. A common potential may be applied to one of the pair of electrodes of the liquid crystal element 432 included in each of the plurality of pixel circuits 537.

As examples of an operation mode of the liquid crystal element 432, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples include an electrically controlled birefringence (ECB) mode, a polymer dispersed liquid crystal (PDLC) mode, a polymer network liquid crystal (PNLC) mode, and a guest-host mode. Note that the present invention is not limited to these modes, and various modes can be used.

The liquid crystal element 432 may be formed using a liquid crystal composition including liquid crystal exhibiting a blue phase and a chiral material. The liquid crystal exhibiting a blue phase has a short response time of 1 msec or less and is optically isotropic; thus, alignment treatment is not necessary and viewing angle dependence is small.

In the pixel circuit 537 in the e-th row and the f-th column, one of the source electrode and the drain electrode of the transistor 431 is electrically connected to the signal line DL_f, and the other of the source electrode and the drain electrode of the transistor 431 is electrically connected to the node 436. A gate electrode of the transistor 431 is electrically connected to a scan line GL_e. The transistor 431 has a function of controlling whether to write a data signal to the node 436.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel circuit 537 as appropriate. The capacitor 233 functions as a storage capacitor for storing data written to the node 436.

An operation example of a display device including the pixel circuit 537 illustrated in FIG. 11C is described here. First, the circuit 532 sequentially selects the pixel circuits 537 row by row. In each of the pixel circuits 537, the transistor 431 is turned on to write a data signal into the node 436.

Next, the transistor 431 is turned off and the data signal written to the node 436 is stored. The amount of light transmitting through the liquid crystal element 432 is determined in accordance with the data signal written to the node 436. This operation is sequentially performed row by row; thus, an image can be displayed on the display region 531.

[Display Element]

The display device of one embodiment of the present invention can employ various modes and can include various display elements. The display element includes, for example, at least one of an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), MIRASOL (registered trademark), an interferometric modulator (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Alternatively, quantum dots may be used as the display element. Note that examples of display devices having EL elements include an EL display. Examples of display devices including electron emitters include a field emission display (FED) and an SED-type flat panel display (SED: surface-conduction electron-emitter display). Examples of display devices including quantum dots include a quantum dot display. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display device including electronic ink, electronic liquid powder (registered trademark), or electrophoretic elements include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor layer including crystals. Furthermore, a p-type GaN semiconductor layer including crystals or the like can be provided thereover, and thus the LED can be formed. Note that an AlN layer may be provided between graphene and the n-type GaN semiconductor layer including crystals or between graphite and the n-type GaN semiconductor layer including crystals. The GaN semiconductor layers included in the LED may be formed by MOCVD. Note that when the graphene is provided, the GaN semiconductor layers included in the LED can also be formed by a sputtering method.

[Structure Examples of Pixels for Achieving Color Display]

Figure 13A:
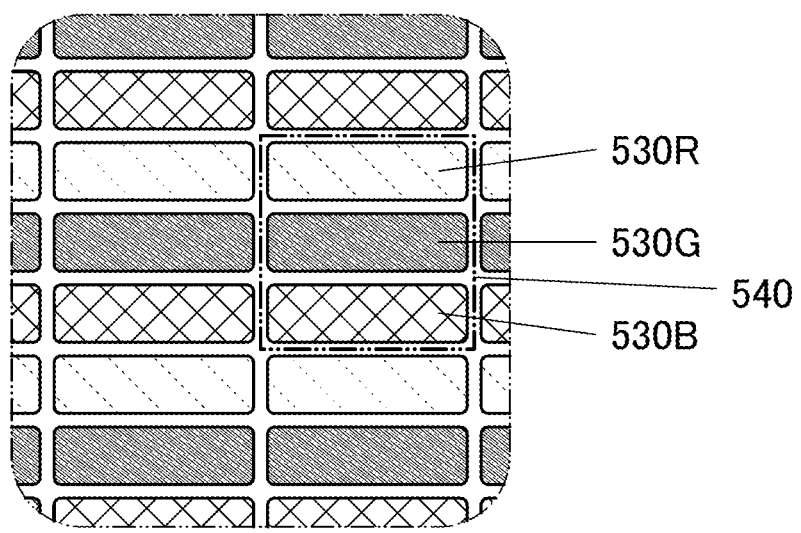
FIGS. 13A and 13B each illustrate an example of a pixel structure of one embodiment of a display device.
Figure 13B:
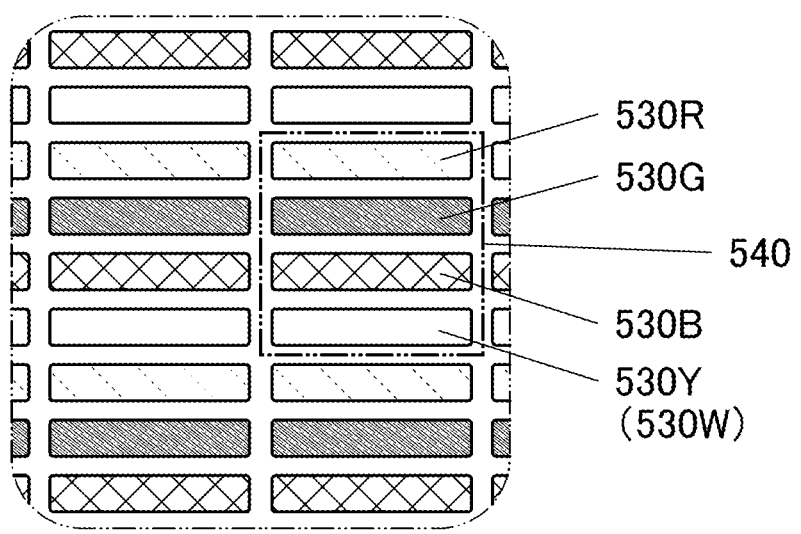

Here, examples of a pixel configuration for achieving color display are described with reference to FIGS. 13A and 13B. FIGS. 13A and 13B and FIGS. 14A and 14B are enlarged schematic plan views of a part of the display region 531. As illustrated in FIG. 13A, for example, each pixel 530 functions as a subpixel and three pixels 530 are collectively used as one pixel 540. Full color display can be achieved in such a manner that red, green, and blue coloring layers are used for the respective three pixels 530. In FIG. 13A, the pixel 530 emitting red light is illustrated as a pixel 530R, the pixel 530 emitting green light is illustrated as a pixel 530G, and the pixel 530 emitting blue light is illustrated as a pixel 530B. The colors of the coloring layers may be a color other than red, green, and blue; for example, the colors of the coloring layer may be yellow, cyan, magenta, or the like.

As illustrated in FIG. 13B, four pixels 530 may function as subpixels and may be collectively used as one pixel 540. For example, the coloring layers corresponding to the four pixels 530 may be red, green, blue, and yellow. In FIG. 13B, the pixel 530 emitting red light is illustrated as a pixel 530R, the pixel 530 emitting green light is illustrated as a pixel 530G, the pixel 530 emitting blue light is illustrated as a pixel 530B, and the pixel 530 emitting yellow light is illustrated as a pixel 530Y. By increasing the number of pixels 530 used as one pixel 540, the color reproducibility can be improved. Thus, the display quality of the display device can be improved.

Alternatively, the coloring layers corresponding to the four pixels 530 may be red, green, blue, and white (see FIG. 13B). With the pixel 530 emitting white light (a pixel 530W), the luminance of the display region can be increased. Note that in the case where the pixel 530W emitting white light is provided, it is not necessary to provide a coloring layer for the pixel 530W. Without the coloring layer corresponding to the pixel 530W, a luminance reduction due to light transmission through the coloring layer does not occur, and the luminance of the display region can be increased accordingly. Moreover, power consumption of the display device can be reduced. When a white coloring layer for the pixel 530W is provided, color temperature of white light can be controlled. Thus, the display quality of the display device can be improved. Depending on the intended use of the display device, each pixel 530 may function as a subpixel and two pixels 530 may be collectively used as one pixel 540.

Figure 14A:
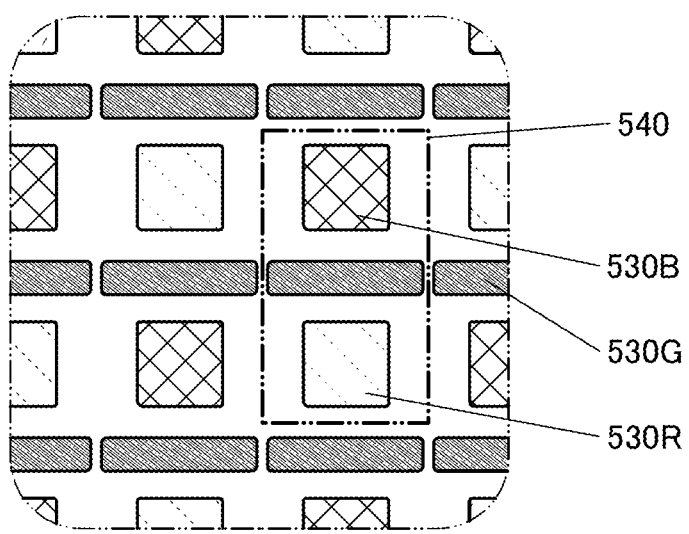
FIGS. 14A and 14B each illustrate an example of a pixel structure of one embodiment of a display device.
Figure 14B:
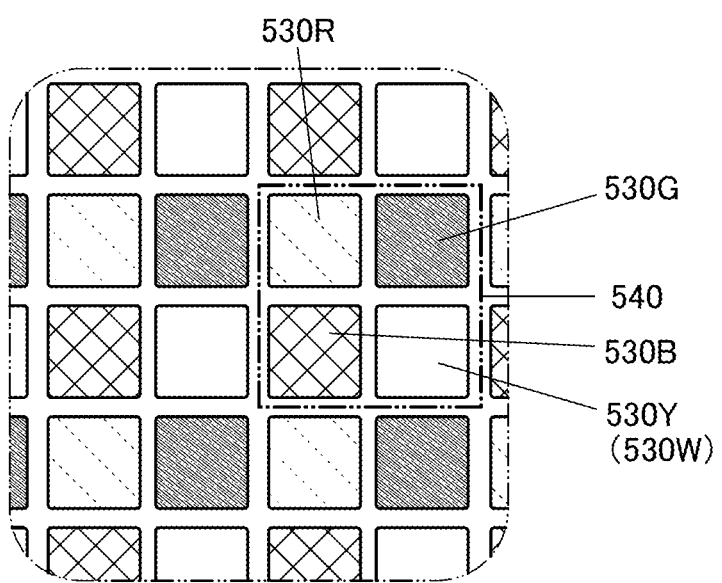

In the case where the four pixels 530 are collectively used as one pixel 540, the four pixels 530 may be arranged in a matrix, as in FIG. 14B. In addition, in the case where the four pixels 530 are collectively used as one pixel 540, a pixel that emits light of cyan, magenta, or the like may be used instead of the pixel 530Y or the pixel 530W. A plurality of pixels 530 that emit light of the same color may be provided in the pixel 540.

Note that the occupied areas or shapes of the pixels 530 included in the pixel 540 may be the same or different. In addition, arrangement is not limited to stripe arrangement or matrix arrangement. For example, delta arrangement, Bayer arrangement, pentile arrangement, or the like can be used. FIG. 14A illustrates an example of pentile arrangement.

(Embodiment 4)

The above-described embodiment describes an example of the display device using a display element for the pixel 530. With the use of an imaging element instead of the display element, an imaging device can be provided. With the use of a memory element instead of the display element, a memory device can be provided.

Figure 15A:
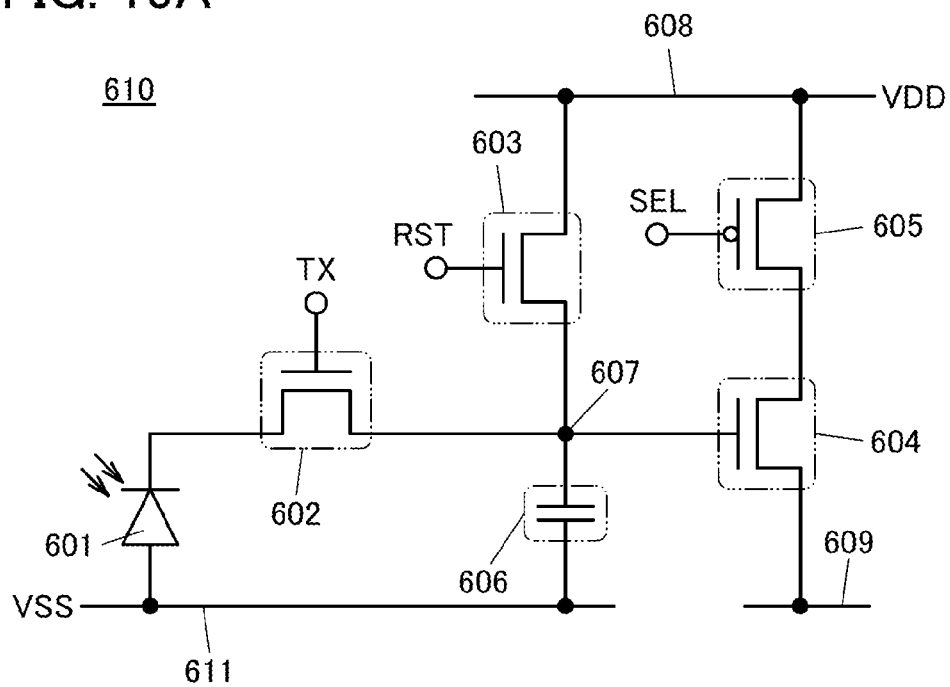
FIGS. 15A to 15C illustrate an example of a circuit of an imaging element and examples of a circuit of a memory element.

FIG. 15A illustrates a circuit 610 as an example of a circuit functioning as an imaging element. The circuit 610 includes a photodiode 601, a transistor 602, a transistor 603, a transistor 604, a transistor 605, and a capacitor 606. One of a source and a drain of the transistor 602 is electrically connected to a cathode of the photodiode 601. The other of the source and the drain of the transistor 602 is electrically connected to a node 607. An anode of the photodiode 601 is electrically connected to a wiring 611. One of a source and a drain of the transistor 603 is electrically connected to the node 607. The other of the source and the drain of the transistor 603 is electrically connected to a wiring 608. A gate of the transistor 604 is electrically connected to the node 607. One of a source and a drain of the transistor 604 is electrically connected to a wiring 609. The other of the source and the drain of the transistor 604 is electrically connected to one of a source and a drain of the transistor 605. The other of the source and the drain of the transistor 605 is electrically connected to the wiring 608. One electrode of the capacitor 606 is electrically connected to the node 607. The other electrode of the capacitor 606 is electrically connected to the wiring 611.

The transistor 602 can function as a transfer transistor. A gate of the transistor 602 is supplied with a transfer signal TX. The transistor 603 can function as a reset transistor. A reset signal RST is supplied to a gate of the transistor 603. The transistor 604 can function as an amplifier transistor. The transistor 605 can function as a selection transistor. A selection signal SEL is supplied to a gate of the transistor 605. Moreover, VDD is supplied to the wiring 608 and VSS is supplied to the wiring 611.

Next, the operation of the circuit 610 is described. First, the transistor 603 is turned on so that VDD is supplied to the node 607. Then, the transistor 603 is turned off so that VDD is stored in the node 607. Next, the transistor 602 is turned on so that the potential of the node 607 is changed in accordance with the amount of light received by the photodiode 601. After that, the transistor 602 is turned off so that the potential of the node 607 is stored. Next, the transistor 605 is turned on so that a potential corresponding to the potential of the node 607 is output to the wiring 609. Measuring the potential of the wiring 609 can determine the amount of light received by the photodiode 601.

A transistor in which a channel is formed in a semiconductor layer including an oxide semiconductor (also referred to as "OS transistor") is preferably used as the transistors 602 and 603. A current flowing between a source and a drain when the transistor is off (also referred to as "off-state current") can be extremely small; thus, the capacitor 606 can be small or omitted. Furthermore, when the transistors 602 and 603 are an OS transistor, the potential of the node 607 is less likely to be changed. Thus, an imaging device that is less likely to be affected by noise can be provided. Furthermore, an imaging device with high linearity can be provided.

Figure 15B:
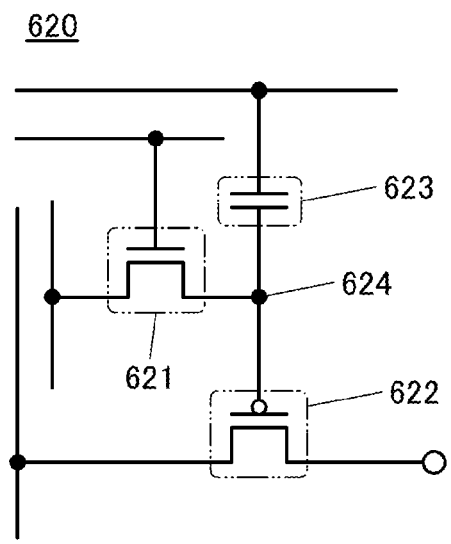
Figure 15C:
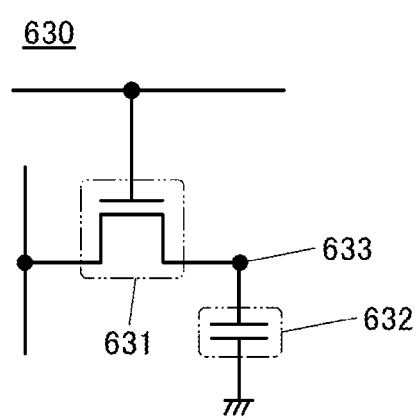

FIG. 15B illustrates a circuit 620 as an example of a circuit functioning as a memory element. FIG. 15C illustrates a circuit 630.

The circuit 620 includes a transistor 621, a transistor 622, and a capacitor 623. A node 624 is electrically connected to one of a source and a drain of the transistor 621, a gate of the transistor 622, and one electrode of the capacitor 623.

The circuit 630 includes a transistor 631 and a capacitor 632. A node 633 is electrically connected to one of a source and a drain of the transistor 631 and one electrode of the capacitor 632.

In the circuit 620, electric charges input from the other of the source and the drain of the transistor 621 can be stored in the node 624. When the transistor 621 is an OS transistor, the transistor 621 can store electric charges in the node 624 for a long period.

In the circuit 630, electric charges input from the other of the source and the drain of the transistor 631 can be stored in the node 633. When the transistor 631 is an OS transistor, the transistor 631 can store electric charges in the node 633 for a long period.

This embodiment can be implemented in an appropriate combination with any of the structures described in the other embodiments.

(Embodiment 5)

This embodiment describes an example of a transistor that can be used for a shift register or the like described in the above-described embodiments.

[Bottom-gate Transistor]

FIG. 16A1 is a cross-sectional view of a transistor 410 that is a channel-protective transistor, which is a type of bottom-gate transistor. The transistor 410 includes an electrode 246 over a substrate 271 with an insulating layer 272 positioned therebetween. The transistor 410 includes a semiconductor layer 242 over the electrode 246 with an insulating layer 216 positioned therebetween. The electrode 246 can function as a gate electrode. The insulating layer 216 can function as a gate insulating layer.

The transistor 410 includes an insulating layer 209 over a channel formation region in the semiconductor layer 242. The transistor 410 includes an electrode 244a and an electrode 244b that are partly in contact with the semiconductor layer 242 and over the insulating layer 216. Part of the electrode 244a and part of the electrode 244b are formed over the insulating layer 209.

The insulating layer 209 can function as a channel protective layer. With the insulating layer 209 provided over the channel formation region, the semiconductor layer 242 can be prevented from being exposed at the time of forming the electrodes 244a and 244b. Thus, the channel formation region in the semiconductor layer 242 can be prevented from being etched at the time of forming the electrodes 244a and 244b. With one embodiment of the present invention, a transistor with favorable electrical characteristics can be provided.

The transistor 410 includes an insulating layer 218 over the electrode 244a, the electrode 244b, and the insulating layer 209 and further includes an insulating layer 219 over the insulating layer 218.

As the substrate 271, any of the following substrates can be used: a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate of silicon or silicon carbide (e.g., a single crystal semiconductor substrate, a polycrystalline semiconductor substrate, and a compound semiconductor substrate), a silicon on insulator (SOI) substrate, and the like. Alternatively, a plastic substrate having heat resistance to the processing temperature of this embodiment may be used. As an example of a glass substrate, a barium borosilicate glass substrate, an aluminosilicate glass substrate, an aluminoborosilicate glass substrate, a soda lime glass substrate, and the like can be given. Alternatively, crystallized glass or the like may be used.

Alternatively, a flexible substrate, an attachment film, a base film, or the like can be used as the substrate 271. As materials of the flexible substrate, the attachment film, and the base material film, the following materials can be used: polyethylene terephthalate (PET), polyethylene naphthalate (PEN), polyether sulfone (PES), polytetrafluoroethylene (PTFE), polypropylene, polyester, polyvinyl fluoride, polyvinyl chloride, polyamide, polyimide, aramid, an epoxy resin, an acrylic resin, and the like.

Still alternatively, as the substrate 271, a paper substrate, a cellophane substrate, a stone substrate, a wood substrate, a cloth substrate (a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, or the like can be used. By using such a substrate, a transistor with excellent properties or a transistor with low power consumption can be formed, a semiconductor device with high durability can be formed, heat resistance can be provided, or reduction in weight or thickness can be achieved.

Specifically, when a transistor is formed using a semiconductor substrate, a single crystal substrate, an SOI substrate, or the like, it is possible to form a transistor with few variations in characteristics, size, shape, or the like and with high current supply capability and a small size. A circuit using such transistors achieves lower power consumption of the circuit or higher integration of the circuit.

The insulating layer 272 can be formed with a single layer or a stack of layers using one or more materials selected from aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, hafnium silicate, hafnium silicate to which nitrogen is added, and hafnium aluminate to which nitrogen is added. Alternatively, a material in which two or more materials selected from an oxide material, a nitride material, an oxynitride material, and a nitride oxide material are mixed may be used. The insulating layer 272 can be formed by a sputtering method, a CVD method, a thermal oxidation method, a coating method, a printing method, or the like.

Note that in this specification, a nitride oxide refers to a compound that includes more nitrogen than oxygen. An oxynitride refers to a compound that includes more oxygen than nitrogen. The content of each element can be measured by Rutherford backscattering spectrometry (RBS), for example.

In the case where the insulating layer 272 is a stacked layer including a plurality of layers, the stacked layer may include a silicon nitride layer as a first layer and a silicon oxide layer as a second layer. In that case, the silicon oxide layer may be a silicon oxynitride layer. In addition, the silicon nitride layer may be a silicon nitride oxide layer.

The insulating layer 272 is preferably formed using an insulating material that does not easily transmit oxygen and impurities such as hydrogen, water, an alkali metal, and an alkaline earth metal. Examples of the material include oxide materials such as aluminum oxide, aluminum nitride, aluminum oxynitride, aluminum nitride oxide, gallium oxide, germanium oxide, yttrium oxide, zirconium oxide, lanthanum oxide, neodymium oxide, hafnium oxide, and tantalum oxide. The insulating layer 272 formed using the above material can prevent or reduce impurity diffusion from the substrate 271 side to the transistor. The insulating layer 272 can function as a base layer.

An insulating layer that contains oxygen at a higher proportion than oxygen in the stoichiometric composition, which is described later, may be used as the insulating layer 272. In the case where the insulating layer 272 is formed using a silicon oxide film, a silicon oxynitride film, or a silicon nitride oxide film, a deposition gas containing silicon and an oxidizing gas are preferably used as a source gas. Typical examples of the deposition gas containing silicon include silane, disilane, trisilane, and silane fluoride. Examples of the oxidizing gas include oxygen, ozone, dinitrogen monoxide, and nitrogen dioxide.

Furthermore, the surface of the insulating layer 272 may be subjected to chemical mechanical polishing (CMP) treatment (hereinafter also referred to as CMP treatment). By the CMP treatment, unevenness of the surface can be reduced, and coverage with an insulating layer or a conductive layer formed later can be increased.

As a conductive material for forming the electrode 246 (including other electrodes and wirings formed using the same layer), a metal element selected from aluminum, chromium, copper, silver, gold, platinum, tantalum, nickel, titanium, molybdenum, tungsten, hafnium (Hf), vanadium (V), niobium (Nb), manganese, magnesium, zirconium, beryllium, and the like; an alloy containing any of the above metal elements; an alloy containing a combination of the above metal elements; or the like can be used. Alternatively, a semiconductor having a high electric conductivity typified by polycrystalline silicon including an impurity element such as phosphorus, or silicide such as nickel silicide may be used. There is no particular limitation on a formation method of the conductive layer, and a variety of formation methods such as an evaporation method, a CVD method, a sputtering method, and a spin coating method can be employed.

The electrode 246 may have a single-layer structure or a stacked-layer structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, an alloy film or a nitride film that contains aluminum and one or more elements selected from titanium, tantalum, tungsten, molybdenum, chromium, neodymium, and scandium may be used.

The electrode 246 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. Alternatively, a stacked structure of a layer of the light-transmitting conductive material and a layer containing the above metal element may be employed.

For example, the electrode 246 can be formed as follows. First, a conductive layer to be the electrode 246 is formed over the insulating layer 272 by a sputtering method, a CVD method, an evaporation method, or the like, and a resist mask is formed over the conductive layer. The resist mask can be formed by a photolithography method, a printing method, an inkjet method, or the like as appropriate. Formation of the resist mask by an inkjet method needs no photomask; thus, manufacturing cost can be reduced. Next, part of the conductive layer is etched using the resist mask, and then the resist mask is removed; thus, the electrode 246 is formed. At the same time, a wiring and another electrode can be formed.

The etching of the conductive layer may be performed by dry etching, wet etching, or both dry etching and wet etching. Note that in the case where the conductive layer is etched by a dry etching method, ashing treatment may be performed before the resist mask is removed, whereby the resist mask can be easily removed using a stripper. After the etching of the conductive layer, the resist mask is removed.

Note that instead of the above formation method, the electrode 246 may be formed by an electrolytic plating method, a printing method, an ink-jet method, or the like.

The insulating layer 216 can be formed using a material and a method similar to those of the insulating layer 272. The insulating layer 216 may be, for example, a multilayer film including a silicon nitride layer as a first layer and a silicon oxide layer as a second layer. In that case, the silicon oxide layer may be a silicon oxynitride layer. In addition, the silicon nitride layer may be a silicon nitride oxide layer. As the silicon oxide layer, a silicon oxide layer whose defect density is low is preferably used. Specifically, a silicon oxide layer whose density of a spin corresponding to a signal with a g factor of 2.001 in electron spin resonance (ESR) is less than or equal to $3 \times 10^{17}$ spins/cm$^3$, preferably less than or equal to $5 \times 10^{16}$ spins/cm$^3$ is used. As the silicon oxide layer, a silicon oxide layer containing excess oxygen is preferably used. As the silicon nitride layer, it is preferable to use a silicon nitride layer from which hydrogen and ammonia are less likely to be released is preferably used. The amount of discharge of hydrogen or ammonia may be measured by TDS.

A capacitor typically has such a structure that a dielectric is sandwiched between two electrodes that face to each other, and as the thickness of the dielectric is smaller (as the distance between the two facing electrodes is shorter) or as the dielectric constant of the dielectric is higher, the capacitance becomes higher. However, if the thickness of the dielectric is reduced in order to increase the capacitance of the capacitor, because of a tunnel effect or the like, current unintentionally flowing between the two electrodes (leakage current) tends to increase and the withstand voltage of the capacitor tends to be lower.

A portion where a gate electrode, a gate insulating layer, and a semiconductor layer of a transistor overlap with each other functions as a capacitor (hereinafter also referred to as "gate capacitor"). A channel is formed in a region in the semiconductor layer, which overlaps with the gate electrode with the gate insulating layer provided therebetween. That is, the gate electrode and the channel formation region function as two electrodes of the capacitor. Furthermore, the gate insulating layer functions as a dielectric of the capacitor. Although it is preferable that the capacitance of the gate capacitor be as high as possible, a reduction in the thickness of the gate insulating layer for the purpose of increasing the capacitance increases the probability of occurrence of an increase in the leakage current or a reduction in the withstand voltage.

In the case where a high-k material such as hafnium silicate ($HfSi_xO_y$, (x>0, y>0)), hafnium silicate to which nitrogen is added ($HfSi_xO_yN_z$ (x>0, y>0, z>0)), hafnium aluminate to which nitrogen is added ($HfAl_xO_yN_z$ (x>0, y>0, z>0)), hafnium oxide, or yttrium oxide is used for the insulating layer 216, even if the thickness of the insulating layer 216 is made thick, sufficient capacitance between the insulating layer 216 and the semiconductor layer 242 can be ensured.

For example, in the case where a high-k material with a high dielectric constant is used for the insulating layer 216, even when the insulating layer 216 is made thick, a capacitance similar to that in the case of using silicon oxide for the insulating layer 216 can be obtained. This enables a reduction in leakage current between the electrode 246 and the semiconductor layer 242. Furthermore, leakage current between the wiring formed using the same layer as the electrode 246 and another wiring that overlaps with the wiring with the insulating layer 216 positioned therebetween can also be reduced. The insulating layer 216 may have a stacked-layer structure of the high-k material and another insulating material.

When an oxide semiconductor is used for the semiconductor layer 242, the hydrogen concentration in the insulating layer 216 is preferably lowered in order to prevent an increase in hydrogen concentration in the oxide semiconductor. Specifically, in the insulating layer 216, the hydrogen concentration measured by secondary ion mass spectrometry (SIMS) is $2\times10^{20}$ atoms/cm$^3$ or lower, preferably $5\times10^{19}$ atoms/cm$^3$ or lower, further preferably $1\times10^{19}$ atoms/cm$^3$ or lower, still further preferably $5\times10^{18}$ atoms/cm$^3$ or lower. Furthermore, the nitrogen concentration in at least part of the insulating layer 216 that is in contact with or near the semiconductor layer 242 is preferably lowered in order to prevent an increase in nitrogen concentration in the oxide semiconductor. Specifically, the nitrogen concentration in the insulating layer, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

The concentration measured by SIMS analysis may include a variation within a range of ±40%.

In the case where an oxide semiconductor is used for the semiconductor layer 242, an insulating layer containing oxygen or an insulating layer containing oxygen at a higher proportion than oxygen in the stoichiometric composition is preferably used for the insulating layer 216. From such an insulating layer, part of oxygen is released by heating. For example, the insulating layer is preferably an insulating layer of which the amount of released oxygen converted into oxygen atoms is greater than or equal to $1.0\times10^{18}$ atoms/cm$^3$, preferably greater than or equal to $3.0\times10^{20}$ atoms/cm$^3$ in TDS analysis in which heat treatment is performed so that the surface temperature of the insulating layer is higher than or equal to 100° C. and lower than or equal to 700° C., preferably higher than or equal to 100° C. and lower than or equal to 500° C.

The insulating layer that contains oxygen at a higher proportion than oxygen in the stoichiometric composition (hereinafter also referred to as "insulating layer containing excess oxygen") can be formed through a treatment in which oxygen is added to an insulating layer. The treatment for adding oxygen can be performed by heat treatment under an oxygen atmosphere or performed with an ion implantation apparatus, an ion doping apparatus, or a plasma treatment apparatus. As a gas for adding oxygen, an oxygen gas of $^{16}O_2$, $^{18}O_2$, or the like, a nitrous oxide gas, an ozone gas, or the like can be used. In this specification and the like, the treatment for adding oxygen is also referred to as "oxygen doping treatment". When oxygen doping treatment is performed on an insulating layer or a semiconductor layer, the insulating layer or the semiconductor layer is preferably heated during oxygen doping treatment because damage in oxygen doping treatment can be reduced.

When an oxide semiconductor is used for the semiconductor layer 242, not only the insulating layer 216 but also the insulating layer in contact with the semiconductor layer 242 preferably contains oxygen. In particular, an insulating layer containing excess oxygen is preferably used.

The semiconductor layer 242 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In the case of using an organic semiconductor for the semiconductor layer 242, a low molecular organic material having an aromatic ring, a π-electron conjugated conductive polymer, or the like can be used. For example, rubrene, tetracene, pentacene, perylenediimide, tetracyanoquinodimethane, polythiophene, polyacetylene, or polyparaphenylene vinylene can be used.

An oxide semiconductor has a band gap of 2 eV or more; thus, the off-state current of an OS transistor can be extremely small. Specifically, the off-state current per micrometer of channel width at room temperature can be lower than $1\times10^{-20}$ A, lower than $1\times10^{-22}$ A, or lower than $1\times10^{-24}$ A. Thus, a transistor with low power consumption can be provided. Furthermore, a semiconductor device or the like with low power consumption can be provided.

An OS transistor has high withstand voltage between its source and drain. Thus, a transistor with high reliability can be provided. Furthermore, a semiconductor device or the like with high reliability can be provided.

When the semiconductor layer 242 is formed using an oxide semiconductor, heat treatment is preferably performed on the semiconductor layer 242 so that impurities such as moisture and hydrogen in the semiconductor layer 242 are reduced (the semiconductor layer 242 is dehydrated or dehydrogenated) to purify the oxide semiconductor used for the semiconductor layer 242. For example, the semiconductor layer 242 is subjected to heat treatment in a reduced-pressure atmosphere, an inert gas atmosphere of nitrogen, a rare gas, or the like, an oxidation atmosphere, or an ultra dry air atmosphere (the moisture amount is 20 ppm (−55° C. by conversion into a dew point) or less, preferably 1 ppm or less, further preferably 10 ppb or less, in the case where the measurement is performed by a dew point meter in a cavity ring down laser spectroscopy (CRDS) system). Note that the oxidation atmosphere refers to an atmosphere including an oxidation gas such as oxygen, ozone, or nitrogen oxide at 10 ppm or higher. The inert gas atmosphere refers to an atmosphere including the oxidation gas at lower than 10 ppm and is filled with nitrogen or a rare gas.

The heat treatment is performed at a temperature higher than or equal to 250° C. and lower than or equal to 650° C., preferably higher than or equal to 300° C. and lower than or equal to 500° C. The treatment time is 3 minutes to 24 hours. Heat treatment for over 24 hours is not preferable because the productivity is reduced.

There is no particular limitation on a heat treatment apparatus used for the heat treatment, and the apparatus may be provided with a device for heating an object to be processed by heat radiation or heat conduction from a heating element such as a resistance heating element. For example, an electric furnace or a rapid thermal annealing (RTA) apparatus such as a lamp rapid thermal annealing (LRTA) apparatus or a gas rapid thermal annealing (GRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas.

This heat treatment enables impurities such as hydrogen (water or a compound having a hydroxyl group) to be released from the oxide semiconductor used for the semiconductor layer 242. Thus, the impurities in the oxide semiconductor can be reduced, so that the oxide semiconductor used for the semiconductor layer 242 can be highly purified. Furthermore, in particular, hydrogen serving as an unstable carrier source can be detached from the semiconductor layer 242; thus, the negative shift of the threshold voltage of the transistor can be prevented. As a result, the reliability of the transistor can be improved.

By heat treatment performed in an atmosphere containing an oxidation gas, oxygen vacancies in the oxide semiconductor used for the semiconductor layer 242 can be reduced at the same time as the release of the impurities. Alternatively, the heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. Alternatively, the heat treatment may be performed in such a manner that heat treatment is performed in an inert gas atmosphere, the atmosphere is switched to an atmosphere containing an oxidizing gas at 10 ppm or more, 1% or more, or 10% or more, and another heat treatment is successively performed.

In the formation of the oxide semiconductor layer with the sputtering apparatus, increasing the purity of the sputtering gas is necessary. For example, as an oxygen gas or an argon gas used for a sputtering gas, a gas that is highly purified to have a dew point of −40° C. or lower, preferably −80° C. or lower, further preferably −100° C. or lower, still further preferably −120° C. or lower is used, whereby entry of moisture or the like into the oxide semiconductor layer can be minimized. Furthermore, a chamber in the sputtering apparatus is preferably subjected to high vacuum evacuation (to a vacuum of about $5 \times 10^{-7}$ Pa to $1 \times 10^{-4}$ Pa) with use of a suction vacuum evacuation pump such as a cryopump so that water or the like, which is an impurity for the oxide semiconductor layer, is removed as much as possible. Alternatively, a turbo molecular pump and a cold trap are preferably combined to prevent a backflow of a gas, especially a gas containing carbon or hydrogen from an exhaust system to the inside of the chamber.

The heat treatment may be performed at any time after the oxide semiconductor layer for forming the semiconductor layer 242 is formed. Furthermore, the heat treatment may be performed more than once. For example, the heat treatment may be performed before and/or after the oxide semiconductor layer is processed into the island-shaped semiconductor layer 242. The heat treatment can reduce oxygen vacancies in the semiconductor layer 242 by diffusing oxygen contained in the insulating layer 216 into the oxide semiconductor layer (the semiconductor layer 242). Furthermore, oxygen doping treatment may be performed before and/or after the oxide semiconductor layer is processed into the island-shaped semiconductor layer 242. The oxygen doping treatment may be performed before and/or after the heat treatment.

The insulating layer 209 can be formed using a material and a method that are similar to those of the insulating layer 216.

The electrodes 244a and 244b (including another electrode or wiring that is formed using the same layer as these electrodes) can be formed using a material and a method similar to those of the electrode 246. That is, a conductive layer for forming the electrodes 244a and 244b is selectively etched, so that the electrodes 244a and 244b can be formed. At this time, part of the exposed semiconductor layer 242 is etched in some cases.

The electrodes 244a and 244b may have a single-layer structure or a stacked-layer structure of two or more layers. For example, a single-layer structure of an aluminum layer containing silicon, a two-layer structure in which an aluminum layer and a titanium layer are stacked, a two-layer structure in which a titanium nitride layer and a titanium layer are stacked, a two-layer structure in which a titanium nitride layer and a tungsten layer are stacked, a two-layer structure in which a tantalum nitride layer and a tungsten layer are stacked, a two-layer structure in which a tungsten layer and a copper layer are stacked, a three-layer structure in which a titanium layer, an aluminum layer, and a titanium layer are stacked in this order, and the like can be given. Alternatively, an aluminum alloy that contains aluminum and one or more elements selected from titanium, tantalum, tungsten, molybdenum, chromium, neodymium, and scandium may be used as the electrodes 244a and 244b.

In the case where an oxide semiconductor is used for the semiconductor layer 242, a material that is capable of removing oxygen from part of the semiconductor layer 242 to generate oxygen vacancies is preferably used for regions of the electrodes 244a and 244b that are in contact with at least the semiconductor layer 242. The carrier concentration of the regions of the semiconductor layer 242 in which oxygen vacancies are generated is increased, so that the regions become n-type regions ($n^+$ layers). Accordingly, the regions can function as a source region and a drain region. When an oxide semiconductor is used for the oxide semiconductor layer 242, examples of the material that is capable of removing oxygen from the oxide semiconductor layer 242 to cause oxygen vacancies include tungsten and titanium.

Formation of the source region and the drain region in the semiconductor layer 242 makes it possible to reduce contact resistance between the semiconductor layer 242 and the electrode 244a and contact resistance between the semiconductor layer 242 and the electrode 244b. Accordingly, the electrical characteristics of the transistor, such as the field-effect mobility and the threshold voltage, can be favorable.

In the case where a semiconductor such as silicon is used for the semiconductor layer 242, a layer that functions as an n-type semiconductor or a p-type semiconductor is preferably provided between the semiconductor layer 242 and the electrode 244a and between the semiconductor layer 242 and the electrode 244b. The layer that functions as an n-type semiconductor or a p-type semiconductor can function as a source region or a drain region in the transistor.

The insulating layer 218 can be formed using a material and a method similar to those of the insulating layer 272. The insulating layer 218 may have a single-layer structure or a stacked structure.

The insulating layer 219 can be formed using a material and a method similar to those of the insulating layer 272. The insulating layer 219 is preferably formed using a material that can prevent or reduce diffusion of external impurities into the transistor. If needed, the formation of the insulating layer 219 may be omitted.

When an oxide semiconductor is used for the semiconductor layer 242, heat treatment may be performed before and/or after the insulating layer 219 is formed. The heat treatment can fill oxygen vacancies in the semiconductor layer 242 by diffusing oxygen contained in the insulating layer 219 or another insulating layer into the semiconductor layer 242. Alternatively, the insulating layer 219 is formed while the heat treatment is performed, so that oxygen vacancies in the semiconductor layer 242 can be filled.

Note that the CVD method can be typically classified into a plasma enhanced CVD (PECVD) method using plasma, a thermal CVD (TCVD) method using heat, and the like. The CVD method can be further classified into a metal CVD (MCVD) method and a metal organic CVD (MOCVD) method according to a source gas to be used.

Furthermore, the evaporation method can be typically classified into a resistance heating evaporation method, an electron beam evaporation method, a molecular beam epitaxy (MBE) method, a pulsed laser deposition (PLD) method, an ion beam assisted deposition (IAD) method, an atomic layer deposition (ALD) method, and the like.

By using the PECVD method, a high-quality film can be formed at a relatively low temperature. By using a deposition method that does not use plasma for deposition, such as the MOCVD method or the evaporation method, a film can be formed with few defects because damage is not easily caused on a surface on which the film is deposited.

A sputtering method is typically classified into a DC sputtering method, a magnetron sputtering method, an RF sputtering method, an ion beam sputtering method, an electron cyclotron resonance (ECR) sputtering method, a facing-target sputtering method, and the like.

In the facing-target sputtering method, plasma is confined between the targets; thus, plasma damage to a substrate can be reduced. Furthermore, step coverage can be improved because an incident angle of a sputtered particle to the substrate can be made smaller depending on the inclination of the target.

A transistor 411 illustrated in FIG. 16A2 is different from the transistor 410 in that an electrode 213 that can function as a back gate electrode is provided over the insulating layer 219. The electrode 213 can be formed using a material and a method that are similar to those of the electrode 246.

The back gate electrode is typically formed using a conductive layer and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a ground (GND) potential or an arbitrary potential. By changing a potential of the back gate electrode independently of the potential of the gate electrode, the threshold voltage of the transistor can be changed.

The electrodes 246 and 213 can both function as gate electrodes. Thus, the insulating layers 216, 209, 218, and 219 each can function as a gate insulating layer. The electrode 213 may be provided between the insulating layers 218 and 219.

In the case where one of the electrodes 246 and 213 is simply referred to as a "gate electrode", the other can be referred to as a "back gate electrode". For example, in the transistor 411, in the case where the electrode 213 is referred to as a "gate electrode", the electrode 246 may be referred to as a "back gate electrode". In the case where the electrode 213 is used as a "gate electrode", the transistor 411 is a kind of bottom-gate transistor. Furthermore, one of the electrodes 246 and 213 may be referred to as a "first gate electrode", and the other may be referred to as a "second gate electrode".

By providing the electrodes 246 and 213 with the semiconductor layer 242 positioned therebetween and setting the potentials of the electrodes 246 and 213 to be the same, a region of the semiconductor layer 242 through which carriers flow is enlarged in the film thickness direction; thus, the number of transferred carriers is increased. As a result, the on-state current and the field-effect mobility of the transistor 411 are increased.

Thus, the transistor 411 has large on-state current for the area occupied by the transistor 411. That is, the area occupied by the transistor 411 can be small for required on-state current. With one embodiment of the present invention, the area occupied by a transistor can be reduced. Thus, with one embodiment of the present invention, a semiconductor device having a high degree of integration can be provided.

Furthermore, the gate electrode and the back gate electrode are formed using conductive layers and thus each have a function of preventing an electric field generated outside the transistor from influencing the semiconductor layer in which the channel is formed (in particular, an electric field blocking function against static electricity and the like). When the back gate electrode is formed larger than the semiconductor layer so that the semiconductor layer is covered with the back gate electrode, the electric field blocking function can be enhanced.

Since the electrodes 246 and 213 each have a function of blocking an electric field generated outside, charges of charged particles and the like generated on the insulating layer 272 side or above the electrode 213 do not influence the channel formation region in the semiconductor layer 242. Thus, degradation by a stress test (e.g., a negative gate bias temperature (−GBT) stress test in which negative charges are applied to a gate) can be reduced. Furthermore, a change in gate voltage (rising voltage) at which on-state current starts flowing at different drain voltages can be reduced. Note that this effect can be obtained when the electrodes 246 and 213 have the same potential or different potentials.

The BT stress test is one kind of accelerated test and can evaluate, in a short time, a change by long-term use (i.e., a change over time) in characteristics of transistors. In particular, the amount of change in threshold voltage of the transistor between before and after the BT stress test is an important indicator when examining the reliability of the transistor. As the change in the threshold voltage is smaller, the transistor has higher reliability.

By providing the electrodes 246 and 213 and setting the potentials of the electrodes 246 and 213 to be the same, the change in threshold voltage is reduced. Accordingly, variation in electrical characteristics among a plurality of transistors is also reduced.

The transistor including the back gate electrode has a smaller change in threshold voltage by a positive GBT stress test in which positive electric charge is applied to a gate than a transistor including no back gate electrode.

In the case where light is incident on the back gate electrode side, when the back gate electrode is formed using a light-blocking conductive film, light can be prevented from entering the semiconductor layer from the back gate electrode side. Thus, photodegradation of the semiconductor layer can be prevented and deterioration in electrical characteristics of the transistor, such as a shift of the threshold voltage, can be prevented.

With one embodiment of the present invention, a transistor with high reliability can be provided. Moreover, a semiconductor device with high reliability can be provided.

FIG. 16B1 shows a cross-sectional view of a channel-protective transistor 420 that is a type of bottom-gate transistor. The transistor 420 has substantially the same structure as the transistor 410 but is different from the transistor 410 in that the insulating layer 209 has an opening 231*a* and an opening 231*b* and covers the semiconductor layer 242. For example, the openings 231*a* and 231*b* can be formed by selectively removing part of the insulating layer 209 overlapping with the semiconductor layer 242. The semiconductor layer 242 is electrically connected to the electrode 244*a* in the opening 231*a*. Furthermore, the semiconductor layer 242 is electrically connected to the electrode 244*b* in the opening 231*b*. A region of the insulating layer 209 that overlaps with the channel formation region can function as a channel protective layer.

With the insulating layer 209, the semiconductor layer 242 can be prevented from being exposed at the time of forming the electrodes 244*a* and 244*b*. Thus, the semiconductor layer 242 can be prevented from being reduced in thickness at the time of forming the electrodes 244*a* and 244*b*.

A transistor 421 illustrated in FIG. 16B2 is different from the transistor 420 in that the electrode 213 that can function as a back gate electrode is provided over the insulating layer 219.

The distance between the electrodes 244*a* and 246 and the distance between the electrodes 244*b* and 246 in the transistors 420 and 421 are longer than those in the transistors 410 and 411. Thus, the parasitic capacitance generated between the electrodes 244*a* and 246 can be reduced. Furthermore, the parasitic capacitance generated between the electrodes 244*b* and 246 can be reduced. With one embodiment of the present invention, a transistor with favorable electrical characteristics can be provided.

A transistor 425 illustrated in FIG. 16C1 is a channel-etched transistor that is a type of bottom-gate transistor. In the transistor 425, the electrodes 244*a* and 244*b* are formed without using the insulating layer 209. Thus, part of the semiconductor layer 242 that is exposed when the electrodes 244*a* and 244*b* are formed is etched in some cases. Since the insulating layer 209 is not provided, the transistor can be manufactured with improved productivity.

A transistor 426 illustrated in FIG. 16C2 is different from the transistor 425 in that the electrode 213 that can function as a back gate electrode is provided over the insulating layer 219.

[Top-gate Transistor]

FIG. 17A1 is a cross-sectional view of a transistor 430 that is a type of top-gate transistor. The transistor 430 includes the semiconductor layer 242 over the insulating layer 272; the electrodes 244*a* and 244*b* that are over the semiconductor layer 242 and the insulating layer 272 and in contact with part of the semiconductor layer 242; the insulating layer 216 over the semiconductor layer 242 and the electrodes 244*a* and 244*b*; and the electrode 246 over the insulating layer 216.

Since the electrode 246 overlaps with neither the electrode 244*a* nor the electrode 244*b* in the transistor 430, the parasitic capacitance generated between the electrodes 246 and 244*a* and the parasitic capacitance generated between the electrodes 246 and 244*b* can be reduced. After the formation of the electrode 246, an impurity element 255 is introduced into the semiconductor layer 242 using the electrode 246 as a mask, so that an impurity region can be formed in the semiconductor layer 242 in a self-aligned manner (see FIG. 17A3). With one embodiment of the present invention, a transistor with favorable electrical characteristics can be provided.

The introduction of the impurity element 255 can be performed with an ion implantation apparatus, an ion doping apparatus, or a plasma treatment apparatus.

As the impurity element 255, for example, at least one kind of element of Group 13 elements and Group 15 elements can be used. In the case where an oxide semiconductor is used for the semiconductor layer 242, it is possible to use at least one kind of element of a rare gas, hydrogen, and nitrogen as the impurity element 255.

A transistor 431 illustrated in FIG. 17A2 is different from the transistor 430 in that the electrode 213 and an insulating layer 217 are included. The transistor 431 includes the electrode 213 formed over the insulating layer 272 and the insulating layer 217 formed over the electrode 213. The electrode 213 can function as a back gate electrode. Thus, the insulating layer 217 can function as a gate insulating layer. The insulating layer 217 can be formed using a material and a method that are similar to those of the insulating layer 216.

The transistor 431 as well as the transistor 411 has large on-state current for the area occupied by the transistor 431. That is, the area occupied by the transistor 431 can be small for required on-state current. With one embodiment of the present invention, the area occupied by a transistor can be reduced. Thus, with one embodiment of the present invention, a semiconductor device having a high degree of integration can be provided.

A transistor 440 illustrated in FIG. 17B1 as an example is a type of top-gate transistor. The transistor 440 is different from the transistor 430 in that the semiconductor layer 242 is formed after the formation of the electrodes 244*a* and 244*b*. A transistor 441 illustrated in FIG. 17B2 as an example is different from the transistor 440 in that the electrode 213 and the insulating layer 217 are provided. Thus, in the transistors 440 and 441, part of the semiconductor layer 242 is formed over the electrode 244a and another part of the semiconductor layer 242 is formed over the electrode 244b.

The transistor 441 as well as the transistor 411 has large on-state current for the area occupied by the transistor 441. That is, the area occupied by the transistor 441 can be small for required on-state current. With one embodiment of the present invention, the area occupied by a transistor can be reduced. Thus, with one embodiment of the present invention, a semiconductor device having a high degree of integration can be provided.

Also in the transistors 440 and 441, after the formation of the electrode 246, the impurity element 255 is introduced into the semiconductor layer 242 using the electrode 246 as a mask, so that an impurity region can be formed in the semiconductor layer 242 in a self-aligned manner. With one embodiment of the present invention, a transistor with favorable electrical characteristics can be provided. Furthermore, with one embodiment of the present invention, a semiconductor device having a high degree of integration can be provided.

Figure 18:
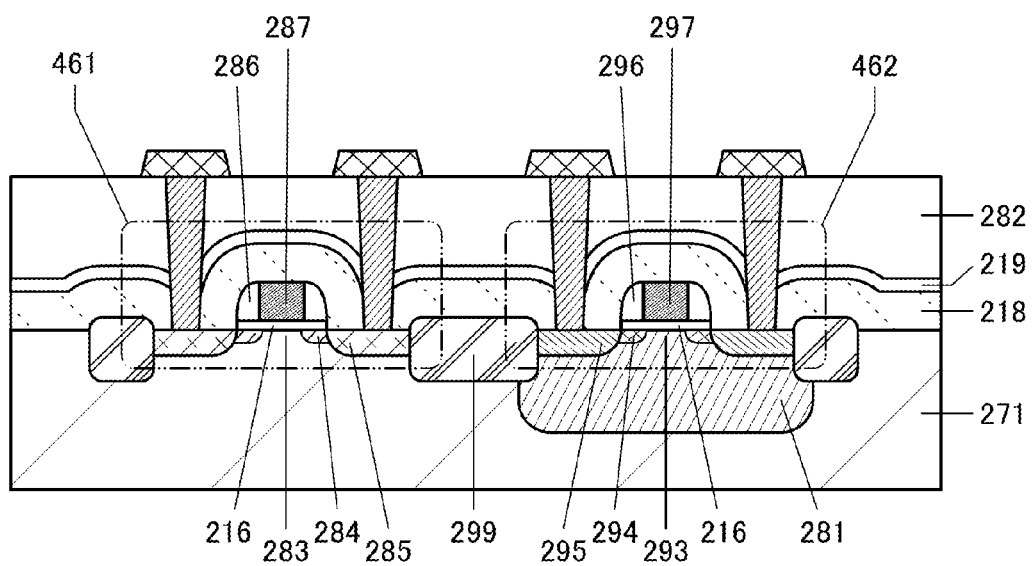
FIG. 18 illustrates an example of a semiconductor device.

FIG. 18 is a cross-sectional view of a transistor 461 and a transistor 462 that use a semiconductor substrate as the substrate 271, which are examples of a top-gate transistor. A transistor manufactured using a semiconductor substrate can operate at high speed. In this embodiment, an example in which a p-type single crystal silicon substrate is used as the substrate 271 is described. In each of the transistors 461 and 462, a channel is formed in the substrate 271.

The transistor 461 can function as an n-channel transistor. The transistor 461 includes a channel formation region 283, n-type impurity regions 284 functioning as lightly doped drain (LDD) regions or extension regions, n-type impurity regions 285 functioning as a source region and a drain region, an insulating layer 216, and an electrode 287. The electrode 287 can function as a gate electrode. The insulating layer 216 functions as a gate insulating layer. The n-type impurity regions 285 have a higher impurity concentration than the n-type impurity regions 284. A sidewall insulating layer 286 is provided on a side surface of the electrode 287. The n-type impurity regions 284 and the n-type impurity regions 285 can be formed in a self-aligned manner using the electrode 287 and the sidewall insulating layer 286 as masks.

The transistor 462 can function as a p-channel transistor. The transistor 462 is formed in an n-well 281. The n-well 281 is formed by adding an impurity element imparting n-type conductivity to part of the substrate 271. The transistor 462 includes a channel formation region 293, p-type impurity regions 294 functioning as LDD regions or extension regions, p-type impurity regions 295 functioning as a source region and a drain region, an insulating layer 216, and an electrode 297. The electrode 297 can function as a gate electrode. The insulating layer 216 functions as a gate insulating layer. The p-type impurity regions 295 have a higher impurity concentration than the p-type impurity regions 294. A sidewall insulating layer 296 is provided on a side surface of the electrode 297. The p-type impurity regions 294 and the p-type impurity regions 295 can be formed in a self-aligned manner using the electrode 297 and the sidewall insulating layer 296 as masks.

The transistors 461 and 462 are separated from another transistor formed in the substrate 271 by an element separation region 299. The insulating layers 218 and 219 are formed to cover the electrode 287, the sidewall insulating layer 286, the electrode 297, and the sidewall insulating layer 296. An insulating layer 282 having a flat surface is formed over the insulating layer 219.

The element separation region 299 can be formed by a shallow trench isolation (STI) method or a local oxidation of silicon (LOCOS) method. The STI method can reduce the generation of a bird's beak in an element isolation region, which is caused in the LOCOS element isolation method, and can reduce the size of the element isolation region, for example. Thus, it is preferable to employ the STI method to form the element separation region 299.

As the transistor 461 and/or the transistor 462, a transistor containing silicide (salicide) or a transistor that does not include a sidewall insulating layer may be used. When a structure that contains silicide (salicide) is used, the resistance of the source region and the drain region can be further lowered and the speed of the semiconductor device can be increased. Furthermore, the semiconductor device can be operated at low voltage, so that power consumption of the semiconductor device can be reduced.

In the case where the substrate 271 is a silicon substrate, phosphorus (P), arsenic (As), or the like can be used as the impurity element imparting n-type conductivity. As the impurity element imparting p-type conductivity, boron (B) or the like may be used. The electrodes 287 and 297 can be formed using a material and a method that are similar to those of the electrode 246. The sidewall insulating layers 286 and 296 can be formed by a known method.

The insulating layer 282 having a flat surface can be formed using an organic material having heat resistance, such as a polyimide, an acrylic-based resin, a benzocyclobutene-based resin, a polyamide, or an epoxy-based resin. Other than such organic materials, the insulating layer 282 can be formed using a material such as a low-dielectric constant material (a low-k material), a siloxane-based resin, phosphosilicate glass (PSG), or borophosphosilicate glass (BPSG). Note that the insulating layer 282 may be formed by stacking a plurality of insulating films formed of any of these materials. Alternatively, the insulating layer 282 may be formed using a material and a method that are similar to those of the insulating layer 272 and then CMP treatment may be performed.

[S-channel Transistor]

Figure 19A:
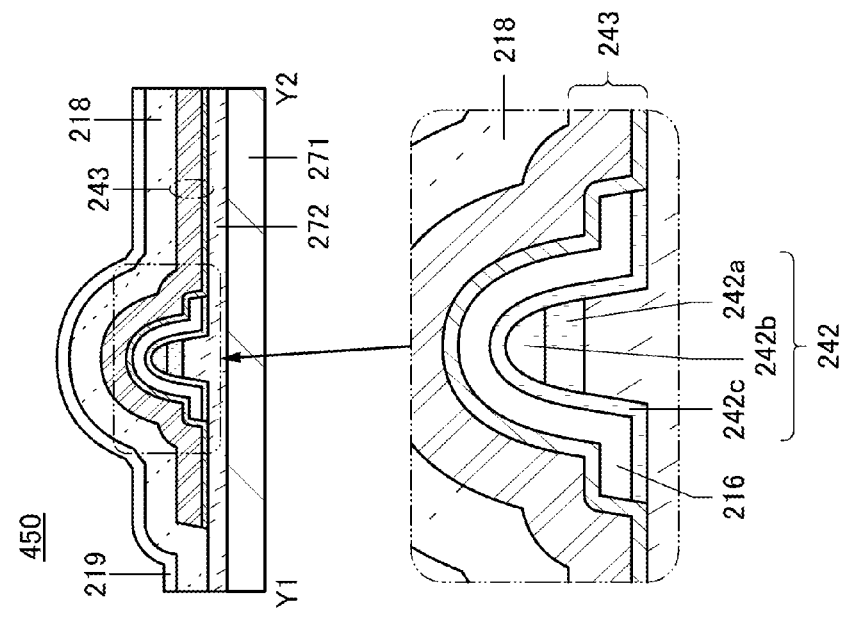
FIGS. 19A to 19C each illustrate an example of a semiconductor device.
Figure 19B:
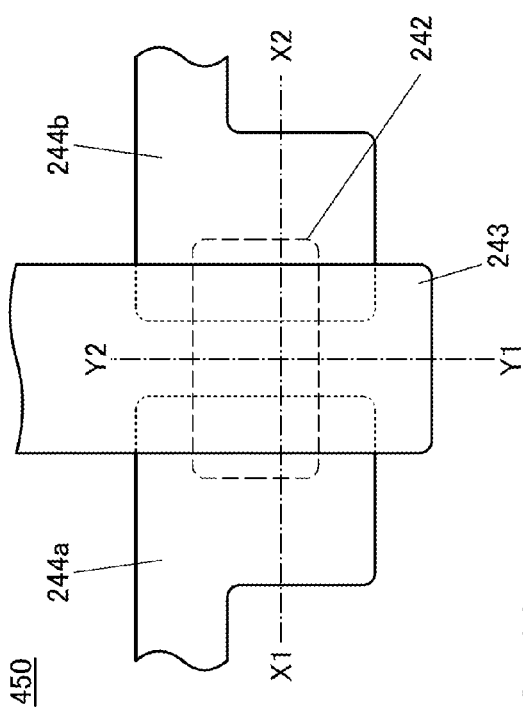
Figure 19C:
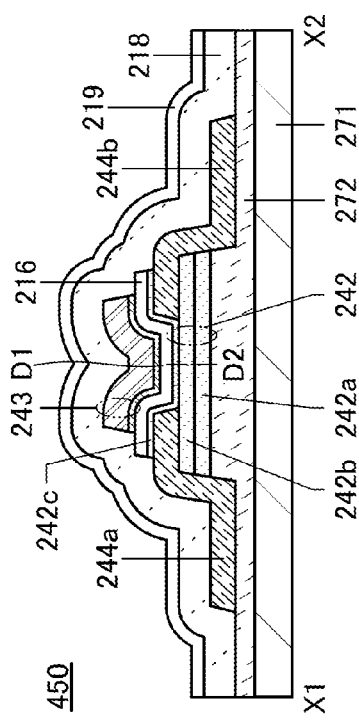

FIGS. 19A to 19C illustrate an example of a structure of a transistor using an oxide semiconductor for the semiconductor layer 242. In a transistor 450 illustrated in FIGS. 19A to 19C, a semiconductor layer 242b is formed over a semiconductor layer 242a, and a semiconductor layer 242c covers a top surface and a side surface of the semiconductor layer 242b and a side surface of the semiconductor layer 242a. FIG. 19A is a top view of the transistor 450. FIG. 19B is a cross-sectional view (in the channel length direction) taken along dashed-dotted line X1-X2 in FIG. 19A. FIG. 19C is a cross-sectional view (in the channel width direction) taken along dashed-dotted line Y1-Y2 in FIG. 19A.

The transistor 450 includes an electrode 243 functioning as a gate electrode. The electrode 243 can be formed using a material and a method similar to those of the electrode 246. The electrode 243 is formed of two conductive layers in this embodiment.

Each of the semiconductor layers 242a, 242b, and 242c is formed using a material containing either In or Ga or both of them. Typical examples are an In—Ga oxide (an oxide containing In and Ga), an In—Zn oxide (an oxide containing In and Zn), and an In-M-Zn oxide (an oxide containing In, an element M, and Zn). The element M is one or more kinds of elements selected from Al, Ti, Ga, Y, Zr, La, Ce, Nd, and Hf and has a higher strength of bonding with oxygen than In has.

The semiconductor layers 242a and 242c are preferably formed using a material containing one or more kinds of metal elements contained in the semiconductor layer 242b. With the use of such a material, interface states at interfaces between the semiconductor layers 242a and 242b and between the semiconductor layers 242c and 242b are less likely to be generated. Accordingly, carriers are not likely to be scattered or captured at the interfaces, which results in an improvement in field-effect mobility of the transistor. Furthermore, threshold voltage variation of the transistor can be reduced. Thus, a semiconductor device having favorable electrical characteristics can be obtained.

Each of the thicknesses of the semiconductor layers 242a and 242c is greater than or equal to 3 nm and less than or equal to 100 nm, preferably greater than or equal to 3 nm and less than or equal to 50 nm. The thickness of the semiconductor layer 242b is greater than or equal to 3 nm and less than or equal to 200 nm, preferably greater than or equal to 3 nm and less than or equal to 100 nm, more preferably greater than or equal to 3 nm and less than or equal to 50 nm.

In the case where the semiconductor layer 242b is an In-M-Zn oxide and the semiconductor layers 242a and 242c are each an In-M-Zn oxide, the semiconductor layers 242a and 242c each have the atomic ratio where In:M:Zn=$x_1$:$y_1$:$z_1$, and the semiconductor layer 242b has an atomic ratio where In:M:Zn=$x_2$:$y_2$:$z_2$, for example. In that case, the compositions of the semiconductor layers 242a, 242c, and 242b can be determined so that $y_1/x_1$ is larger than $y_2/x_2$. It is preferable that the compositions of the semiconductor layers 242a, 242c, and 242b are determined so that $y_1/x_1$ is 1.5 times or more as large as $y_2/x_2$. It is further preferable that the compositions of the semiconductor layers 242a, 242c, and 242b are determined so that $y_1/x_1$ is twice or more as large as $y_2/x_2$. It is still further preferable that the compositions of the semiconductor layers 242a, 242c, and 242b are determined so that $y_1/x_1$ is three times or more as large as $y_2/x_2$. It is preferred that $y_1$ be larger than or equal to $x_1$ because the transistor can have stable electrical characteristics. However, when $y_1$ is three times or more as large as $x_1$, the field-effect mobility of the transistor is reduced; accordingly, $y_1$ is preferably smaller than three times $x_1$. When the semiconductor layers 242a and 242c have the above compositions, the semiconductor layers 242a and 242c can each be a layer in which oxygen vacancies are less likely to be generated than in the semiconductor layer 242b.

In the case where the semiconductor layers 242a and 242c are each an In-M-Zn oxide and the summation of In and the element M is assumed to be 100 atomic %, the content percentages of In and an element M are preferably as follows: the content percentage of In is lower than 50 atomic % and the percentage of M is higher than or equal to 50 atomic %. The content percentages of In and M are more preferably as follows: the content percentage of In is lower than 25 atomic % and the content percentage of M is higher than or equal to 75 atomic %. In the case of using an In-M-Zn oxide for semiconductor layer 242b and the summation of In and the element M is assumed to be 100 atomic %, the content percentages of In and element M are preferably as follows: the percentage of In is higher than or equal to 25 atomic % and the percentage of M is lower than 75 atomic %. The content percentages of In and element M are further preferably as follows: the percentage of In is higher than or equal to 34 atomic % and the percentage of M is lower than 66 atomic %.

For example, an In—Ga—Zn oxide that is formed using a target having an atomic ratio of In:Ga:Zn=1:3:2, 1:3:4, 1:3:6, 1:6:4, or 1:9:6, an In—Ga oxide that is formed using a target having an atomic ratio of In:Ga=1:9, or gallium oxide can be used for each of the semiconductor layers 242a and 242c containing In or Ga. Furthermore, an In—Ga—Zn oxide that is formed using a target having an atomic ratio of In:Ga:Zn=3:1:2, 1:1:1, 5:5:6, 4:2:4.1, or the like can be used for the semiconductor layer 242b. Note that the atomic ratio of each of the semiconductor layers 242a, 242b, and 242c may vary within a range of ±20% of any of the above-described atomic ratios as an error.

In order to give stable electrical characteristics to the transistor including the semiconductor layer 242b, it is preferable that impurities and oxygen vacancies in the semiconductor layer 242b be reduced to obtain a highly purified semiconductor layer; accordingly, the semiconductor layer 242b can be regarded as an intrinsic or substantially intrinsic oxide semiconductor layer. Furthermore, it is preferable that at least the channel formation region of the semiconductor layer 242b be a semiconductor layer that can be regarded as an intrinsic or substantially intrinsic semiconductor layer.

Note that the substantially intrinsic oxide semiconductor layer refers to an oxide semiconductor layer in which the carrier density is higher than or equal to $1\times10^{-9}/cm^3$ and lower than $8\times10^{11}/cm^3$, preferably lower than $1\times10^{11}/cm^3$, further preferably lower than $1\times10^{10}/cm^3$.

Figure 20A:
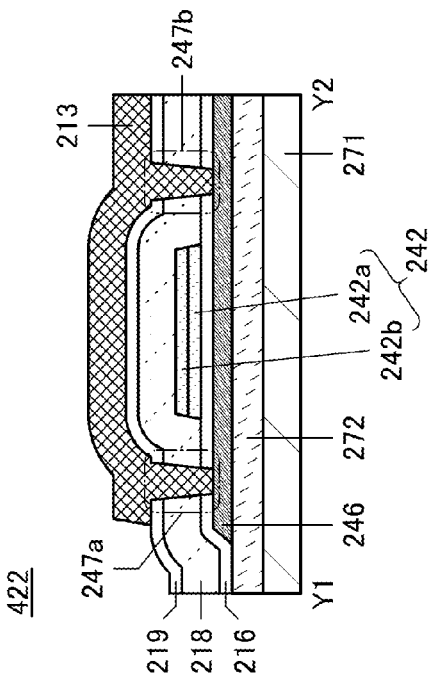
FIGS. 20A to 20C each illustrate an example of a semiconductor device.
Figure 20B:
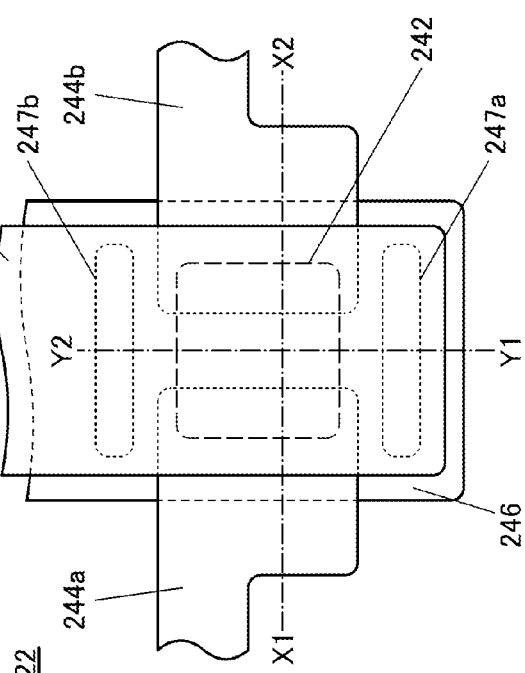
Figure 20C:
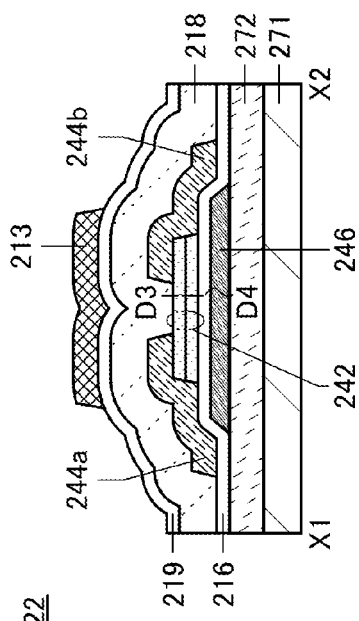

FIGS. 20A to 20C illustrate an example of a structure of a transistor including an oxide semiconductor for the semiconductor layer 242. In a transistor 422 illustrated in FIGS. 20A to 20C as an example, the semiconductor layer 242b is formed over the semiconductor layer 242a. The transistor 422 is a kind of bottom-gate transistor having a back-gate electrode. FIG. 20A is a top view of the transistor 422. FIG. 20B is a cross-sectional view (in the channel length direction) taken along dashed-dotted line X1-X2 in FIG. 20A. FIG. 20C is a cross-sectional view (in the channel width direction) taken along the dash-dot line Y1-Y2 in FIG. 20A.

The electrode 213 over the insulating layer 219 is electrically connected to the electrode 246 at an opening 247a and an opening 247b provided in the insulating layers 216, 218, and 219. Thus, the same potential is supplied to the electrodes 213 and 246. Furthermore, either or both of the openings 247a and 247b may be omitted. In the case neither the opening 247a nor the opening 247b is provided, different potentials can be applied to the electrode 213 and 246.

[Energy Band Structure of Oxide Semiconductor]

Figure 23A:
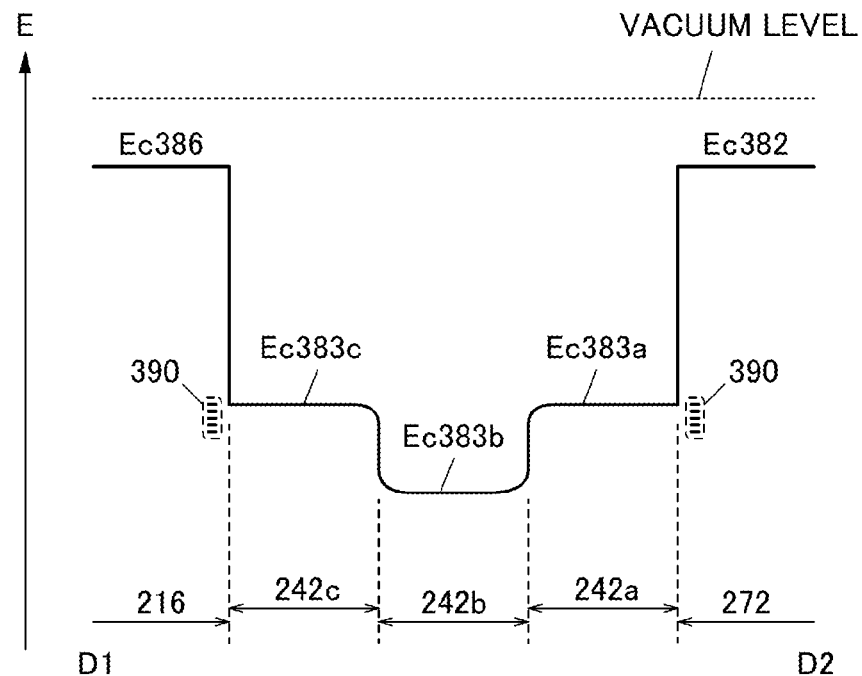
FIGS. 23A and 23B each illustrate an energy band structure.
Figure 23B:
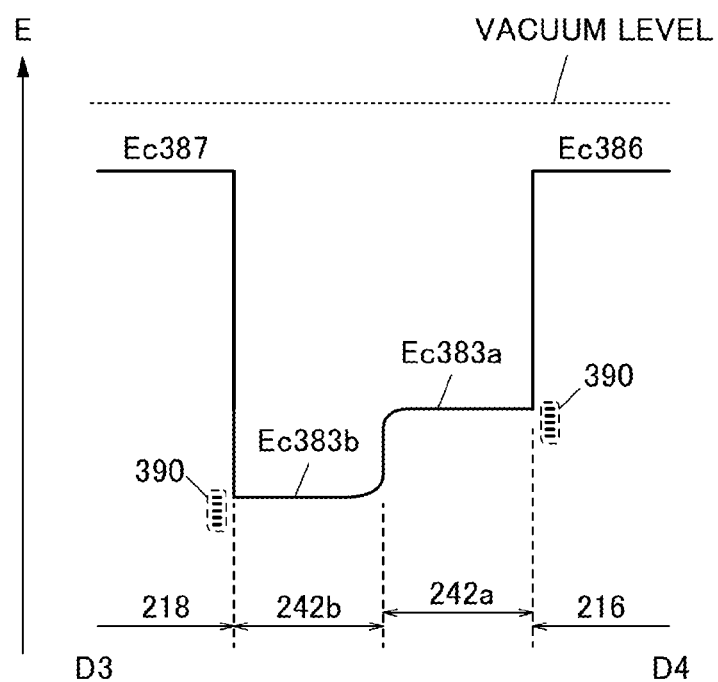

The function and effect of the semiconductor layer 242 that is a stacked layer including the semiconductor layers 242a, 242b, and 242c are described with an energy band structure diagram shown in FIGS. 23A and 23B. FIG. 23A shows the energy band structure of a channel formation region of the transistor 450 (a portion along dashed-dotted line D1-D2 in FIG. 19B).

In FIG. 23A, Ec382, Ec383a, Ec383b, Ec383c, and Ec386 are the energies of bottoms of the conduction band in the insulating layer 272, the semiconductor layer 242a, the semiconductor layer 242b, the semiconductor layer 242c, and the insulating layer 216, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer (e.g., UT-300 manufactured by HORIBA JOBIN YVON S.A.S.). The energy difference between the vacuum level and the top of the valence band can be measured using an ultraviolet photoelectron spectroscopy (UPS) device (e.g., VersaProbe manufactured by ULVAC-PHI, Inc.).

Note that an In—Ga—Zn oxide that is formed using a target having an atomic ratio of In:Ga:Zn=1:3:2 has an energy gap of approximately 3.5 eV and an electron affinity of approximately 4.5 eV. An In—Ga—Zn oxide that is formed using a target having an atomic ratio of In:Ga:Zn=1:3:4 has an energy gap of approximately 3.4 eV and an electron affinity of approximately 4.5 eV. An In—Ga—Zn oxide that is formed using a target having an atomic ratio of In:Ga:Zn=1:3:6 has an energy gap of approximately 3.3 eV and an electron affinity of approximately 4.5 eV. An In—Ga—Zn oxide that is formed using a target having an atomic ratio of In:Ga:Zn=1:6:2 has an energy gap of approximately 3.9 eV and an electron affinity of approximately 4.3 eV. An In—Ga—Zn oxide that is formed using a target having an atomic ratio of In:Ga:Zn=1:6:8 has an energy gap of approximately 3.5 eV and an electron affinity of approximately 4.4 eV. An In—Ga—Zn oxide that is formed using a target having an atomic ratio of In:Ga:Zn=1:6:10 has an energy gap of approximately 3.5 eV and an electron affinity of approximately 4.5 eV. An In—Ga—Zn oxide that is formed using a target having an atomic ratio of In:Ga:Zn=1:1 has an energy gap of approximately 3.2 eV and an electron affinity of approximately 4.7 eV. An In—Ga—Zn oxide that is formed using a target having an atomic ratio of In:Ga:Zn=3:1:2 has an energy gap of approximately 2.8 eV and an electron affinity of approximately 5.0 eV.

Since the insulating layers 272 and 216 are insulators, Ec382 and Ec386 are closer to the vacuum level (have a smaller electron affinity) than Ec383a, Ec383b, and Ec383c.

Furthermore, Ec383a is closer to the vacuum level than Ec383b. Specifically, Ec383a is preferably closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

Furthermore, Ec383c is closer to the vacuum level than Ec383b. Specifically, Ec383c is preferably located closer to the vacuum level than Ec383b by 0.05 eV or more, 0.07 eV or more, 0.1 eV or more, or 0.15 eV or more and 2 eV or less, 1 eV or less, 0.5 eV or less, or 0.4 eV or less.

In the vicinity of an interface between the semiconductor layers 242a and 242b and the vicinity of an interface between the semiconductor layers 242b and 242c, mixed regions are formed; thus, the energy of the bottom of the conduction band continuously changes. In other words, no state or few states exist at these interfaces.

Accordingly, electrons transfer mainly through the semiconductor layer 242b in the stacked-layer structure having the above energy band structure. Thus, even when an interface state exists at an interface between the semiconductor layer 242a and the insulating layer 272 or an interface between the semiconductor layer 242c and the insulating layer 216, the interface state hardly influences the transfer of the electrons. In addition, the interface state does not exist or hardly exists at the interface between the semiconductor layers 242a and 242b and at the interface between the semiconductor layers 242c and 242b; thus, transfer of electrons are not prohibited in the region. Accordingly, high field-effect mobility can be obtained in the transistor 450 having the above stacked-layer structure of the oxide semiconductor layers.

Note that although trap states 390 due to impurities or defects might be formed in the vicinity of the interface between the semiconductor layer 242a and the insulating layer 272 and in the vicinity of the interface between the semiconductor layer 242c and the insulating layer 216 as shown in FIG. 23A, the semiconductor layer 242b can be separated from the trap states owing to the existence of the semiconductor layers 242a and 242c.

In particular, in the transistor 450 described in this embodiment, an upper surface and a side surface of the semiconductor layer 242b are in contact with the semiconductor layer 242c, and a bottom surface of the semiconductor layer 242b is in contact with the semiconductor layer 242a. In this manner, the semiconductor layer 242b is surrounded by the semiconductor layers 242a and 242c, whereby the influence of the trap state can be further reduced.

However, in the case where an energy difference between Ec383a and Ec383b or between Ec383c and Ec383b is small, electrons in the semiconductor layer 242b might reach the trap states by passing over the energy gap. The electrons are trapped by the trap states, which generates a negative fixed charge at the interface with the insulating layer, causing the threshold voltage of the transistor to be shifted in the positive direction.

Thus, each of the energy differences between Ec383a and Ec383b and between Ec383c and Ec383b is preferably set to be larger than or equal to 0.1 eV, further preferably larger than or equal to 0.15 eV, in which case a change in the threshold voltage of the transistor can be reduced and the transistor can have favorable electrical characteristics.

Each of the band gaps of the semiconductor layers 242a and 242c is preferably larger than that of the semiconductor layer 242b.

FIG. 23B illustrates the energy band structure of a channel formation region of the transistor 422 (a portion along dashed-dotted line D3-D4 in FIG. 20B).

In FIG. 23B, Ec387 shows an energy of the bottom of the conduction band of the insulating layer 218. The semiconductor layer 242 is formed using two layers, the semiconductor layers 242a and 242b; thus, the transistor can be manufactured with improved productivity. Since the semiconductor layer 242c is not provided, the transistor including the two semiconductor layers is easily affected by the trap states 390 but can have higher field-effect mobility than a transistor including one semiconductor layer as the semiconductor layer 242.

One embodiment of the present invention can provide a transistor with a small variation in electrical characteristics. Accordingly, a semiconductor device with a small variation in electrical characteristics can be provided. One embodiment of the present invention can provide a transistor with high reliability. Accordingly, a semiconductor device with high reliability can be provided.

Note that an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1 \times 10^{-19}$ A), less than or equal to 10 zA ($1 \times 10^{-20}$ A), and further less than or equal to 1 zA ($1 \times 10^{-21}$ A).

With one embodiment of the present invention, a transistor with low power consumption can be provided. Accordingly, a semiconductor device with low power consumption can be provided. Moreover, a semiconductor device with high reliability can be provided.

The transistor 450 illustrated in FIGS. 19A to 19C is described again. A semiconductor layer 242b is provided over a projecting portion of the insulating layer 272, in which case the electrode 243 can cover a side surface of the semiconductor layer 242b. Thus, the transistor 450 has a structure in which the semiconductor layer 242b can be electrically surrounded by electric field of the electrode 243. In this way, the structure of a transistor in which the semiconductor layer in which the channel is formed is electrically surrounded by the electric field of the conductive film is called a surrounded channel (s-channel) structure. A transistor having an s-channel structure is referred to as an s-channel transistor.

In the s-channel transistor, a channel can be formed in the whole (bulk) of the semiconductor layer 242b. In the s-channel structure, the drain current of the transistor is increased, so that a larger amount of on-state current can be obtained. Furthermore, the entire channel formation region of the semiconductor layer 242b can be depleted by the electric field of the electrode 243. Accordingly, the off-state current of the transistor with an s-channel structure can be further reduced.

When the projecting portion of the insulating layer 272 is increased in height, and the channel width is shortened, the effects of the s-channel structure to increase the on-state current and reduce the off-state current can be enhanced. Part of the semiconductor layer 242a exposed in the formation of the semiconductor layer 242b may be removed. In this case, the side surfaces of the semiconductor layers 242a and 242b may be aligned to each other.

As in a transistor 451 illustrated in FIGS. 21A to 21C, the electrode 213 may be provided below the semiconductor layer 242 with an insulating layer interposed therebetween. FIG. 21A is a top view of a transistor 451. FIG. 21B is a cross-sectional view taken along the dashed-dotted line X1-X2 in FIG. 21A. FIG. 21C is a cross-sectional view taken along the dashed-dotted line Y1-Y2 in FIG. 21A.

Figure 22A:
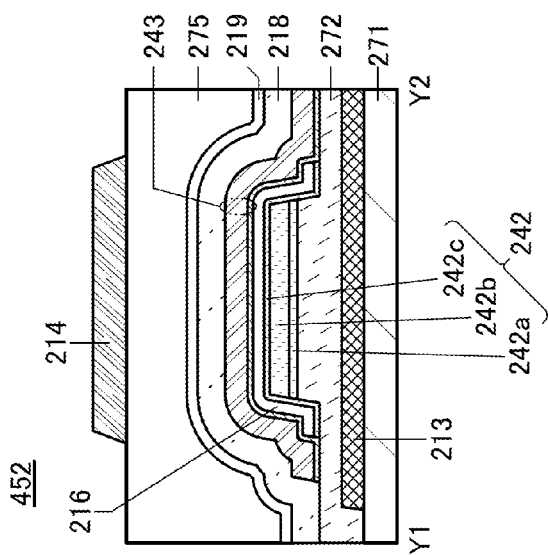
FIGS. 22A to 22C each illustrate an example of a semiconductor device.
Figure 22B:
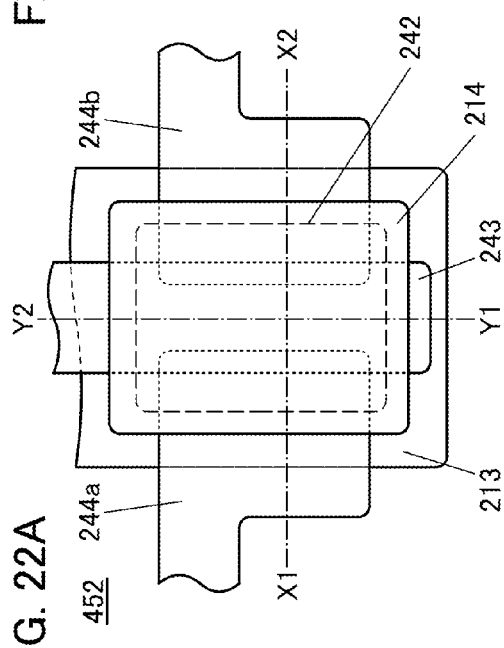
Figure 22C:
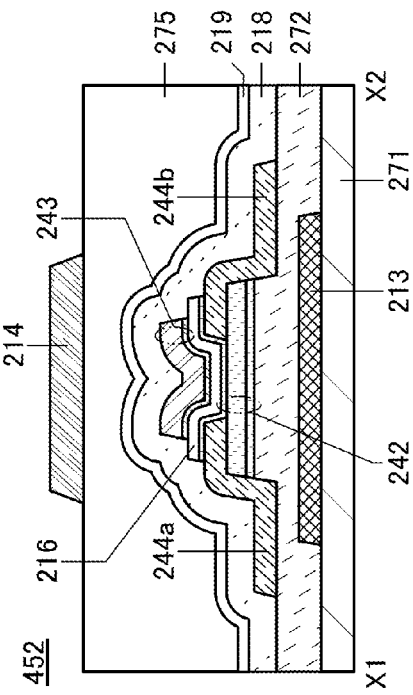

As in a transistor 452 illustrated in FIGS. 22A to 22C, an insulating layer 275 may be provided above the electrode 243 and a layer 214 may be provided over the insulating layer 275. FIG. 22A is a top view of the transistor 452. FIG. 22B is a cross-sectional view taken along the dashed-dotted line X1-X2 in FIG. 22A. FIG. 22C is a cross-sectional view taken along the dashed-dotted line Y1-Y2 in FIG. 22A.

Although the layer 214 is provided over the insulating layer 275 in FIGS. 22A to 22C, the layer 214 may be provided over the insulating layer 218 or 219. When the layer 214 is formed using a material having a light-blocking property, change in characteristics or decrease in reliability of the transistor, which is caused by light irradiation, can be prevented. When the layer 214 is formed larger than at least the semiconductor layer 242b to cover the semiconductor layer 242b, the above effects can be improved. The layer 214 can be formed using an organic material, an inorganic material, or a metal material. In the case where the layer 214 is formed using a conductive material, voltage can be supplied to the layer 214 or the layer 214 may be set to an electrically-floating state.

This embodiment can be implemented in an appropriate combination with any of the structures described in the other embodiments.

(Embodiment 6)

In this embodiment, a CPU is described as an example of a semiconductor device.

Figure 24:
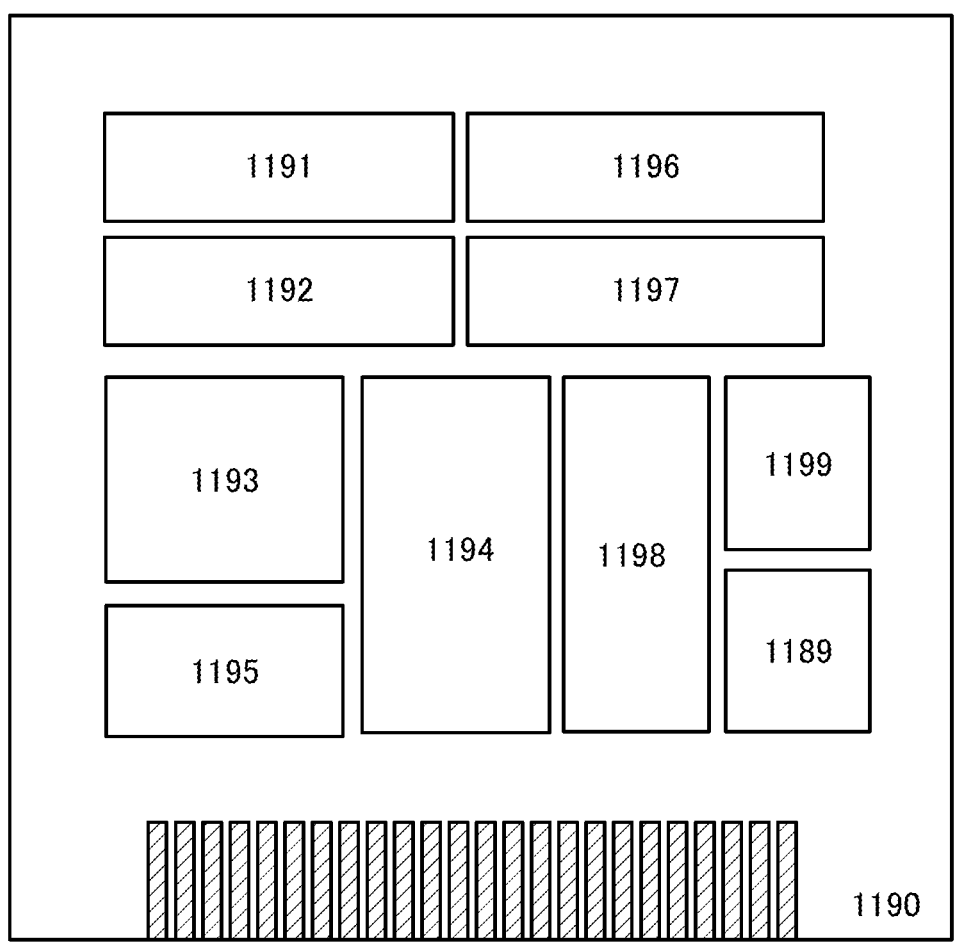
FIG. 24 illustrates an example of a semiconductor device.

FIG. 24 is a block diagram illustrating a configuration example of a CPU including at least the semiconductor device of any of the embodiments of the present invention.

The CPU illustrated in FIG. 24 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (BUS I/F), a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Obviously, the CPU illustrated in FIG. 24 is only an example in which the structure is simplified, and an actual CPU may have various structures depending on the application. For example, the CPU may have the following configuration: a structure including the CPU illustrated in FIG. 24 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads data from or writes data to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 on the basis of a reference clock signal CLK1, and supplies the internal clock signal CLK2 to the above circuits.

In the CPU illustrated in FIG. 24, a memory device is provided in the register 1196. The memory device in the above embodiments is used as the memory device provided in the register 1196.

In the CPU illustrated in FIG. 24, the register controller 1197 controls the storing operation in the register 1196 in accordance with an instruction from the ALU 1191.

Although the CPU is described in this embodiment as the semiconductor device of one embodiment of the present invention, the semiconductor device can also be used in an LSI such as a digital signal processor (DSP), a custom LSI, or a programmable logic device (PLD), and a radio frequency identification (RF-ID).

This embodiment can be implemented in an appropriate combination with any of the structures described in the other embodiments.

(Embodiment 7)

In this embodiment, examples of an electronic device that uses a semiconductor device of one embodiment of the present invention are described.

Specific examples of the electronic device that uses the semiconductor device of one embodiment of the present invention are as follows: display devices of televisions, monitors, and the like, lighting devices, desktop and laptop personal computers, word processors, image reproduction devices that reproduce still images and moving images stored in recording media such as digital versatile discs (DVDs), portable CD players, radios, tape recorders, headphone stereos, stereos, table clocks, wall clocks, cordless phone handsets, transceivers, mobile phones, car phones, portable game machines, tablet terminals, stationary game machines such as pachinko machines, calculators, portable information terminals, electronic notebooks, e-book readers, electronic translators, audio input devices, video cameras, digital still cameras, electric shavers, high-frequency heating appliances such as microwave ovens, electric rice cookers, electric washing machines, electric vacuum cleaners, water heaters, electric fans, hair dryers, air-conditioning systems such as air conditioners, humidifiers, and dehumidifiers, dishwashers, dish dryers, clothes dryers, futon dryers, electric refrigerators, electric freezers, electric refrigerator-freezers, freezers for preserving DNA, flashlights, electrical tools such as a chain saw, smoke detectors, and medical equipment such as dialyzers. Furthermore, industrial equipment such as guide lights, traffic lights, belt conveyors, elevators, escalators, industrial robots, power storage systems, and power storage devices for leveling the amount of power supply and smart grid can be given. In addition, moving objects and the like driven by fuel engines or electric motors using power from a power storage unit are also included in the category of electronic devices. Examples of the moving objects are electric vehicles (EV), hybrid electric vehicles (HEV) that include both an internal-combustion engine and a motor, plug-in hybrid electric vehicles (PHEV), tracked vehicles in which caterpillar tracks are substituted for wheels of these vehicles, motorized bicycles including motor-assisted bicycles, motorcycles, electric wheelchairs, golf carts, boats, ships, submarines, helicopters, aircrafts, rockets, artificial satellites, space probes, planetary probes, and spacecraft.

Figure 25A:
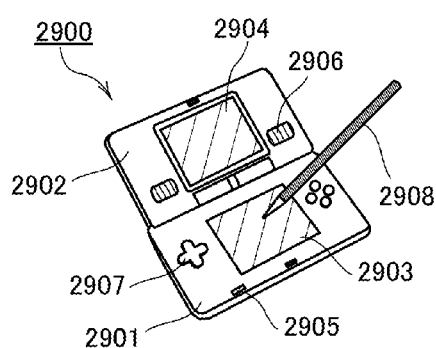
FIGS. 25A to 25H each illustrate an example of an electronic device.

FIG. 25A illustrates a portable game console 2900 including a housing 2901, a housing 2902, a display portion 2903, a display portion 2904, a microphone 2905, a speaker 2906, an operation key 2907, and the like. The display portion 2903 is provided with a touch screen as an input device, which can be handled with a stylus 2908 or the like.

Figure 25B:
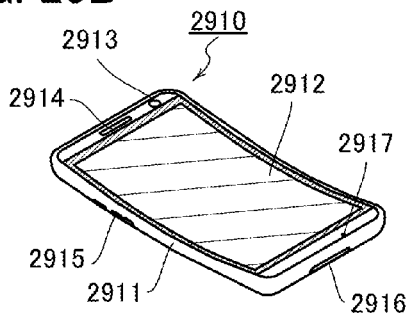

An information terminal 2910 illustrated in FIG. 25B includes a housing 2911, a display portion 2912, a microphone 2917, a speaker portion 2914, a camera 2913, an external connection portion 2916, an operation button 2915, and the like. A display panel that uses a flexible substrate and a touch screen are provided in the display portion 2912. The information terminal 2910 can be used as, for example, a smartphone, a mobile phone, a tablet information terminal, a tablet PC, or an e-book reader.

Figure 25C:
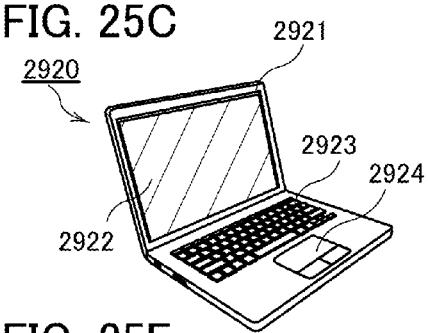

A laptop personal computer 2920 in FIG. 25C includes a housing 2921, a display portion 2922, a keyboard 2923, a pointing device 2924, and the like.

Figure 25D:
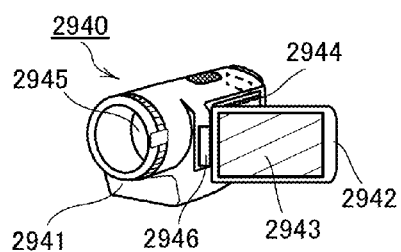

FIG. 25D illustrates a video camera 2940, which includes a housing 2941, a housing 2942, a display portion 2943, operation keys 2944, a lens 2945, a joint 2946, and the like. The operation keys 2944 and the lens 2945 are provided for the housing 2941, and the display portion 2943 is provided for the housing 2942. The housings 2941 and 2942 are connected to each other with the joint 2946, and an angle between the housings 2941 and 2942 can be changed with the joint 2946. The direction of an image on the display portion 2943 may be changed and display and non-display of an image may be switched depending on the angle between the housings 2941 and 2942.

Figure 25E:
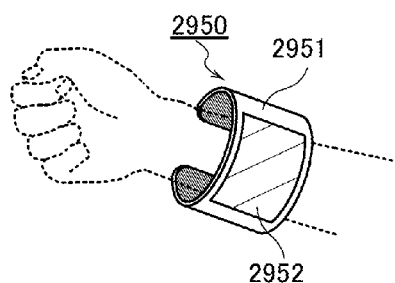

FIG. 25E illustrates an example of a bangle-type information terminal. An information terminal 2950 includes a housing 2951, a display portion 2952, and the like. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 25F:
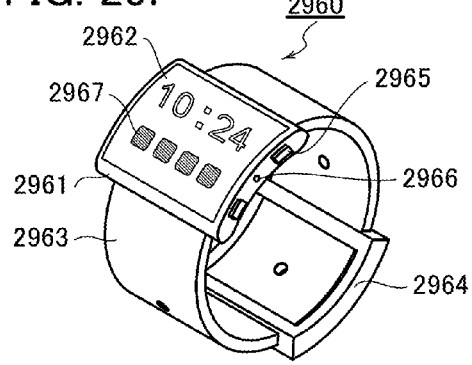

FIG. 25F illustrates an example of a watch-type information terminal. An information terminal 2960 includes a housing 2961, a display portion 2962, a band 2963, a buckle 2964, an operation button 2965, an input/output terminal 2966, and the like. The information terminal 2960 is capable of executing a variety of applications such as mobile phone calls, e-mailing, viewing and editing texts, music reproduction, Internet communication, and computer games.

The display surface of the display portion 2962 is bent, and images can be displayed on the bent display surface. Furthermore, the display portion 2962 includes a touch sensor, and operation can be performed by touching the screen with a finger, a stylus, or the like. For example, an application can be started by touching an icon 2967 displayed on the display portion 2962. With the operation button 2965, a variety of functions such as time setting, ON/OFF of the power, ON/OFF of wireless communication, setting and cancellation of a silent mode, and setting and cancellation of a power saving mode can be performed. For example, the functions of the operation button 2965 can be set by setting the operating system incorporated in the information terminal 2960.

The portable information terminal 2960 can employ near field communication that is a communication method in accordance with an existing communication standard. In that case, for example, mutual communication between the portable information terminal 2960 and a headset capable of wireless communication can be performed, and thus hands-free calling is possible. Moreover, the portable information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

Figure 25G:
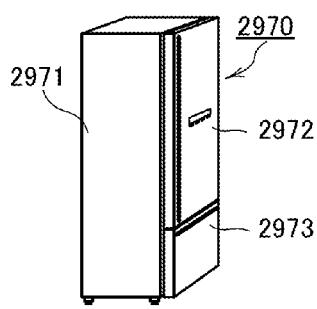

FIG. 25G illustrates an electric refrigerator-freezer as an example of a home electronic device. An electric refrigerator-freezer 2970 includes a housing 2971, a refrigerator door 2972, a freezer door 2973, and the like.

Figure 25H:
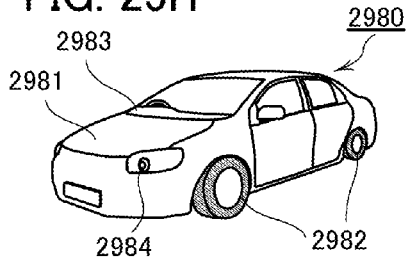

FIG. 25H is an external view illustrating an example of a car. A car 2980 includes a car body 2981, wheels 2982, a dashboard 2983, lights 2984, and the like.

An electronic component including the semiconductor device described in the above embodiment is provided in each of the electronic devices described in this embodiment.

This application is based on Japanese Patent Application serial No. 2014-262854 filed with Japan Patent Office on Dec. 25, 2014, the entire contents of which are hereby incorporated by reference.

What is claimed is:
1. A shift register comprising a plurality of register circuits connected to each other in series, each register circuit comprising an OR circuit and a NAND circuit,
  wherein an output signal of the register circuit in an (i−1)-th stage, an output signal of the register circuit in an i-th stage, and an output signal of the register circuit in an (i+1)-th stage are input to the OR circuit of the register circuit in the i-th stage, and
  wherein a clock signal and an output signal of the OR circuit of the register circuit in the i-th stage are input to the NAND circuit of the register circuit in the i-th stage.

2. The shift register according to claim 1,
wherein each register circuit further comprises a flip-flop circuit, and
wherein an output signal of the flip-flop circuit of the register circuit in the i-th stage is input to the OR circuit of the register circuit in the i-th stage.

3. The shift register according to claim 2, wherein data stored in the flip-flop circuits in the register circuits in the stages before the (i−1)-th stage and in the register circuits in the stages after the (i+1)-th stage are not rewritten.

4. A semiconductor device comprising:
the shift register according to claim 1; and
a display element, an imaging element, or a memory element.

5. An electronic device comprising:
the semiconductor device according to claim 4; and
a microphone, a speaker, or a sensor.

6. A shift register comprising a plurality of register circuits, each register circuit comprising an OR circuit, a NAND circuit, and a flip-flop circuit,
wherein an output signal of the flip-flop circuit of the register circuit in an (i−1)-th stage, an output signal of the flip-flop circuit of the register circuit in an i-th stage, and an output signal of the flip-flop circuit of the register circuit in an (i+1)-th stage are input to the OR circuit of the register circuit in the i-th stage, and
wherein a clock signal and an output signal of the OR circuit of the register circuit in the i-th stage are input to the NAND circuit of the register circuit in the i-th stage.

7. The shift register according to claim 6, wherein the output signal of the flip-flop circuit of the register circuit in the (i−1)-th stage and an output terminal of the NAND circuit in the register circuit in the i-th stage are input to the flip-flop circuit of the register circuit in the i-th stage.

8. The shift register according to claim 6, wherein data stored in the flip-flop circuits in the register circuits in the stages before the (i−1)-th stage and in the register circuits in the stages after the (i+1)-th stage are not rewritten.

9. A semiconductor device comprising:
the shift register according to claim 6; and
a display element, an imaging element, or a memory element.

10. An electronic device comprising:
the semiconductor device according to claim 9; and
a microphone, a speaker, or a sensor.

11. A shift register comprising a plurality of register circuits connected to each other in series, each register circuit comprising:
an OR circuit, input terminals of the OR circuit in the register circuit of an i-th stage electrically connected to an output terminal of the register circuit in an (i−1)-th stage, an output terminal of the register circuit in the i-th stage, and an output terminal of the register circuit in an (i+1)-th stage; and
a NAND circuit, input terminals of the NAND circuit in the register circuit of the i-th stage electrically connected to a clock signal supply unit and an output terminal of the OR circuit of the register circuit in the i-th stage.

12. The shift register according to claim 11,
wherein each register circuit further comprises a flip-flop circuit, and
wherein input terminals of the flip-flop circuit in the register circuit of the i-th stage electrically connected to the output terminal of the register circuit in the (i−1)-th stage and an output terminal of the NAND circuit in the register circuit in the i-th stage.

13. The shift register according to claim 12, wherein data stored in the flip-flop circuits in the register circuits in the stages before the (i−1)-th stage and in the register circuits in the stages after the (i+1)-th stage are not rewritten.

14. A semiconductor device comprising:
the shift register according to claim 11; and
a display element, an imaging element, or a memory element.

15. An electronic device comprising:
the semiconductor device according to claim 14; and
a microphone, a speaker, or a sensor.

* * * * *